US010580841B2

(12) United States Patent
Madigan

(10) Patent No.: US 10,580,841 B2
(45) Date of Patent: Mar. 3, 2020

(54) HIGH RESOLUTION ORGANIC LIGHT-EMITTING DIODE DEVICES, DISPLAYS, AND RELATED METHOD

(71) Applicant: Kateeva, Inc., Newark, CA (US)

(72) Inventor: Conor F. Madigan, San Francisco, CA (US)

(73) Assignee: KATEEVA, INC., Newark, CA (US)

(*) Notice: Subject to any disclaimer, the term of this patent is extended or adjusted under 35 U.S.C. 154(b) by 0 days.

(21) Appl. No.: 16/008,334

(22) Filed: Jun. 14, 2018

(65) Prior Publication Data
US 2018/0294324 A1 Oct. 11, 2018

Related U.S. Application Data

(60) Continuation of application No. 15/462,651, filed on Mar. 17, 2017, which is a continuation of application (Continued)

(51) Int. Cl.
H01L 51/00 (2006.01)
H01L 27/32 (2006.01)
H01L 51/52 (2006.01)

(52) U.S. Cl.
CPC ...... H01L 27/3246 (2013.01); H01L 27/3216 (2013.01); H01L 27/3218 (2013.01); (Continued)

(58) Field of Classification Search
CPC ............ H01L 27/3246; H01L 27/3216; H01L 27/3218; H01L 27/3276; H01L 51/0005; H01L 51/5218; H01L 51/5234
(Continued)

(56) References Cited

U.S. PATENT DOCUMENTS 5,541,479 A 7/1996 Nagakubo
6,294,398 B1 9/2001 Kim et al.
(Continued)

FOREIGN PATENT DOCUMENTS

CN 1770938 A 5/2006
CN 1841763 A 10/2006
(Continued)

OTHER PUBLICATIONS

Examination Report dated Jul. 1, 2019 for EP Application 14740323.2.
(Continued)

Primary Examiner — Didarul A Mazumder
(74) Attorney, Agent, or Firm — Hauptman Ham, LLP

(57) ABSTRACT

In accordance with an exemplary embodiment of the present disclosure, a method of manufacturing an organic light-emissive display can be provided. A plurality of electrodes can be provided on a substrate. A first hole conducting layer can be deposited via inkjet printing over the plurality of electrodes on the substrate. A liquid affinity property of selected surface portions of the first hole conducting layer can be altered to define emissive layer confinement regions. Each emissive layer confinement region can have a portion that respectively corresponds to each of the plurality of electrodes provided on the substrate. An organic light-emissive layer can be deposited via inkjet printing within each emissive layer confinement region.

20 Claims, 31 Drawing Sheets

Related U.S. Application Data

No. 15/254,562, filed on Sep. 1, 2016, now Pat. No. 9,666,652, which is a division of application No. 14/156,188, filed on Jan. 15, 2014, now Pat. No. 9,444,050, which is a continuation-in-part of application No. 14/030,776, filed on Sep. 18, 2013, now Pat. No. 9,614,191.

(60) Provisional application No. 61/753,692, filed on Jan. 17, 2013, provisional application No. 61/753,713, filed on Jan. 17, 2013.

(52) U.S. Cl.
CPC ...... *H01L 27/3276* (2013.01); *H01L 51/0005* (2013.01); *H01L 51/5218* (2013.01); *H01L 51/5234* (2013.01)

(58) Field of Classification Search
USPC .................................. 257/40; 438/82, 99
See application file for complete search history.

(56) References Cited

U.S. PATENT DOCUMENTS

| | | | |
|---|---|---|---|
| 6,830,855 B2 | 12/2004 | Kiguchi et al. | |
| 6,992,326 B1 | 1/2006 | Macpherson et al. | |
| 7,132,788 B2 | 11/2006 | Gupta et al. | |
| 7,378,790 B2 | 5/2008 | Aruga et al. | |
| 7,443,093 B2 | 10/2008 | Jianpu et al. | |
| 8,110,825 B2 | 2/2012 | Obata et al. | |
| 8,115,216 B2 | 2/2012 | Smith et al. | |
| 8,124,172 B2 | 2/2012 | Lang et al. | |
| 8,309,376 B2 | 11/2012 | Lang et al. | |
| 8,330,352 B2 | 12/2012 | Sung et al. | |
| 8,405,100 B2 | 3/2013 | Matsumoto et al. | |
| 8,530,922 B2 | 9/2013 | Nakatani et al. | |
| 8,790,745 B2 | 7/2014 | Kiguchi et al. | |
| 9,444,050 B2 | 9/2016 | Madigan | |
| 9,614,191 B2 | 4/2017 | Madigan | |
| 2003/0129299 A1 | 7/2003 | Swanson | |
| 2004/0144975 A1 | 7/2004 | Seki et al. | |
| 2005/0100657 A1 | 5/2005 | MacPherson et al. | |
| 2005/0112341 A1 | 5/2005 | Ito et al. | |
| 2005/0196969 A1* | 9/2005 | Gunner ................. G03F 7/0387 438/725 |
| 2005/0218807 A1 | 10/2005 | Min | |
| 2006/0087228 A1 | 4/2006 | Kobayashi | |
| 2006/0164010 A1 | 7/2006 | Hwang et al. | |
| 2006/0170354 A1 | 8/2006 | Hwang | |
| 2007/0181648 A1* | 8/2007 | Parker ..................... H01L 27/29 228/101 |
| 2008/0024402 A1 | 1/2008 | Nishikawa et al. | |
| 2008/0111474 A1 | 5/2008 | Sung et al. | |
| 2009/0195144 A1 | 8/2009 | Kitabayashi | |
| 2009/0243483 A1 | 10/2009 | Yang | |
| 2010/0019235 A1 | 1/2010 | Iizumi et al. | |
| 2010/0194269 A1 | 8/2010 | Sonoda et al. | |
| 2011/0127502 A1* | 6/2011 | Kim ..................... H01L 27/3283 257/40 |
| 2011/0127507 A1 | 6/2011 | Choi et al. | |
| 2011/0183268 A1 | 7/2011 | Lang et al. | |
| 2011/0207249 A1* | 8/2011 | Chae ................... H01L 27/3253 438/23 |
| 2011/0229994 A1 | 9/2011 | Jung | |
| 2011/0248247 A1 | 10/2011 | Matsumoto et al. | |
| 2011/0309389 A1 | 12/2011 | Yu et al. | |
| 2012/0049178 A1 | 3/2012 | Sugimoto et al. | |
| 2012/0091482 A1 | 4/2012 | Uchida et al. | |
| 2012/0119201 A1 | 5/2012 | Ueno et al. | |
| 2012/0187389 A1 | 7/2012 | Shoda et al. | |
| 2012/0228602 A1 | 9/2012 | Nakatani et al. | |
| 2012/0319089 A1 | 12/2012 | Shin et al. | |
| 2012/0326136 A1 | 12/2012 | Chen | |
| 2012/0326600 A1 | 12/2012 | Heeks et al. | |
| 2013/0075360 A1* | 3/2013 | Nakamura ............ G03F 7/0002 216/41 |
| 2013/0109117 A1 | 5/2013 | Lee et al. | |
| 2013/0248867 A1 | 9/2013 | Kim et al. | |
| 2014/0070175 A1 | 3/2014 | Kang | |
| 2014/0078126 A1 | 3/2014 | Hack et al. | |
| 2014/0197385 A1 | 7/2014 | Madigan | |
| 2014/0197396 A1 | 7/2014 | Madigan | |
| 2017/0062536 A1 | 3/2017 | Madigan | |
| 2017/0236883 A1 | 8/2017 | Madigan | |
| 2017/0309691 A1 | 10/2017 | Madigan | |
| 2018/0315963 A1 | 11/2018 | Madigan | |

FOREIGN PATENT DOCUMENTS

| | | |
|---|---|---|
| CN | 102222682 A | 10/2011 |
| EP | 1708294 A2 | 10/2006 |
| EP | 1601032 B1 | 6/2012 |
| GB | 2437110 A | 10/2007 |
| JP | 2001143868 A | 5/2001 |
| JP | 2005203351 A | 7/2005 |
| JP | 2006127783 A | 5/2006 |
| JP | 2006310257 A | 11/2006 |
| JP | 2007018775 A | 1/2007 |
| JP | 2009187730 A | 8/2009 |
| JP | 2010021138 A | 1/2010 |
| JP | 201034143 A | 2/2010 |
| JP | 2010141059 A | 6/2010 |
| JP | 2010186582 A | 8/2010 |
| JP | 2011113982 | 6/2011 |
| JP | 2012028180 A | 2/2012 |
| JP | 4990415 B2 | 8/2012 |
| JP | 2013004517 A | 1/2013 |
| KR | 1020120052206 A | 5/2012 |
| TW | 201244222 A | 11/2012 |
| WO | 2009097377 A1 | 8/2009 |
| WO | 2010092795 A1 | 8/2010 |
| WO | 2012087977 A1 | 6/2012 |

OTHER PUBLICATIONS

First Examination Report dated Jun. 27, 2019 for EP Application 13872170.9.
First Office Action dated Jul. 3, 2019 for CN Application 201810361038.X.
First Office Action dated Jul. 3, 2019 to CN Application No. 201810360875.0.
First Office Action dated Jun. 4, 2019 to CN Application No. 201810360132.3.
Provisional Rejection dated Jun. 3, 2019 for KR Application 10-2019-7013404.
Notice of Allowance dated Aug. 16, 2019 to U.S. Appl. No. 15/462,651.
Notice of Allowance dated Nov. 2, 2018, to U.S. Appl. No. 15/462,651.
Notice of Allowance dated Oct. 31, 2018, to U.S. Appl. No. 15/406,455.
Notice of Allowance dated Jan. 24, 2019, to U.S. Appl. No. 15/406,455.
Notice of Allowance dated Mar. 15, 2019 to U.S. Appl. No. 15/462,651.
Office action dated Feb. 12, 2019, to JP Patent Application No. 2018-20895.
Provisional Rejection dated Feb. 13, 2019, to KR Patent Application No. 10-2018-7033172.
Applicant Initiated Interview Summary dated Apr. 29, 2016, to U.S. Appl. No. 14/156,188.
Applicant Interview Summary dated Sep. 24, 2016, to U.S. Appl. No. 14/030,776.
Corrected Notice of Allowability dated Jan. 10, 2017, to U.S. Appl. No. 14/030,776.
Corrected Notice of Allowability dated Jan. 20, 2017, to U.S. Appl. No. 14/030,776.
Decision on Rejection dated Sep. 28, 2018, to TW Patent Application No. 106117187.

(56) References Cited

OTHER PUBLICATIONS

Examination Report dated Dec. 19, 2016 to TW Patent Application No. 102140259.
Examination Report dated Nov. 11, 2016, to TW Patent Application No. 103101751.
Examination report dated Jun. 4, 2018, to TW Patent Application No. 106117187.
Extended European Search Report dated Nov. 2, 2016 for EP 14740323.2.
Extended European Search Report dated Oct. 19, 2016 for EP Application No. 13872170.9.
Final office action and Denial of Entry of Amendment dated Sep. 28, 2018, to JP Patent Application No. 2015-553715.
Final Office Action dated Dec. 31, 2015, to U.S. Appl. No. 14/030,776.
First Office Action dated Sep. 1, 2016 for CN 201480016484.7.
Fourth Office action dated Sep. 4, 2018, to CN Patent Application 201480016484.7.
International Search Report and Written Opinion dated Feb. 24, 2014, to PCT Application PCT/US13/60687.
International Search Report and Written Opinion dated May 13, 2014 to PCT Application No. PCT/US2014/11723.
JP Office action dated Jan. 26, 2017, to JP Patent Application No. 2015-553715.
Non-Final Office Action dated Jun. 16, 2016 for U.S. Appl. No. 14/030,776.
Non-Final Office Action dated Jan. 4, 2016, to U.S. Appl. No. 14/156,188.
Non-Final Office Action dated May 22, 2015 to U.S. Appl. No. 14/030,776.
Non-Final Office action dated Sep. 21, 2017, to U.S. Appl. No. 15/462,651.
Non-Final Office action dated Sep. 6, 2017, to U.S. Appl. No. 15/406,455.
Notice of Allowability dated Apr. 20, 2017, to U.S. Appl. No. 15/254,562.
Notice of Allowance dated Jan. 25, 2017 for U.S. Appl. No. 15/254,562.
Notice of Allowance dated Jul. 14, 2016 for U.S. Appl. No. 14/156,188.
Notice of Allowance dated Mar. 10, 2017 for U.S. Appl. No. 15/254,562.
Notice of Allowance dated Oct. 27, 2016 for U.S. Appl. No. 14/030,776.
Notice of Allowance dated Apr. 18, 2018, to U.S. Appl. No. 15/462,651.
Notice of Allowance dated Aug. 13, 2018, to U.S. Appl. No. 15/406,455.
Notice of Allowance dated Feb. 28, 2018, to U.S. Appl. No. 15/406,155.
Notice of Allowance dated Jan. 25, 2017, to U.S. Appl. No. 15,254,562.
Notice of Allowance dated Sep. 13, 2018, to U.S. Appl. No. 15/462,651.
Notice of Allowance dated Sep. 18, 2018, to U.S. Appl. No. 15/406,455.
Notice of Final Rejection dated Apr. 27, 2018, to KR Patent Application No. 10-2015-7018822.
Office action dated Aug. 1, 2018, to JP Patent Application No. 2015-553806.
Office Action dated Aug. 8, 2017, to JP Patent Application No. 2015-553806.
Office Action dated Feb. 4, 2017, to CN Patent Application No. 201380070779.8.
Penultimate Office Action dated Oct. 26, 2017, to JP Patent Application No. 2015-553715.
Provisional Rejection dated Aug. 22, 2017, to KR Patent Application 10-2015-7018822.
Provisional Rejection dated Aug. 25, 2017, to KR Patent Application No. 10-2015-7021869.
Reid Chesterfield et al. "Solution-Coating Technology for AMOLED Displays", Frontline Technology, Information Display Jan. 2011, pp. 24-29.
Second Office action dated Aug. 22, 2017, to CN Patent Application No. 201380070779.8.
Second Office Action dated Jul. 3, 2017, to CN Patent Application No. 201480016484.7.
Third Office action dated Oct. 23, 2017, to CN Patent Application 201480016484.7.

* cited by examiner

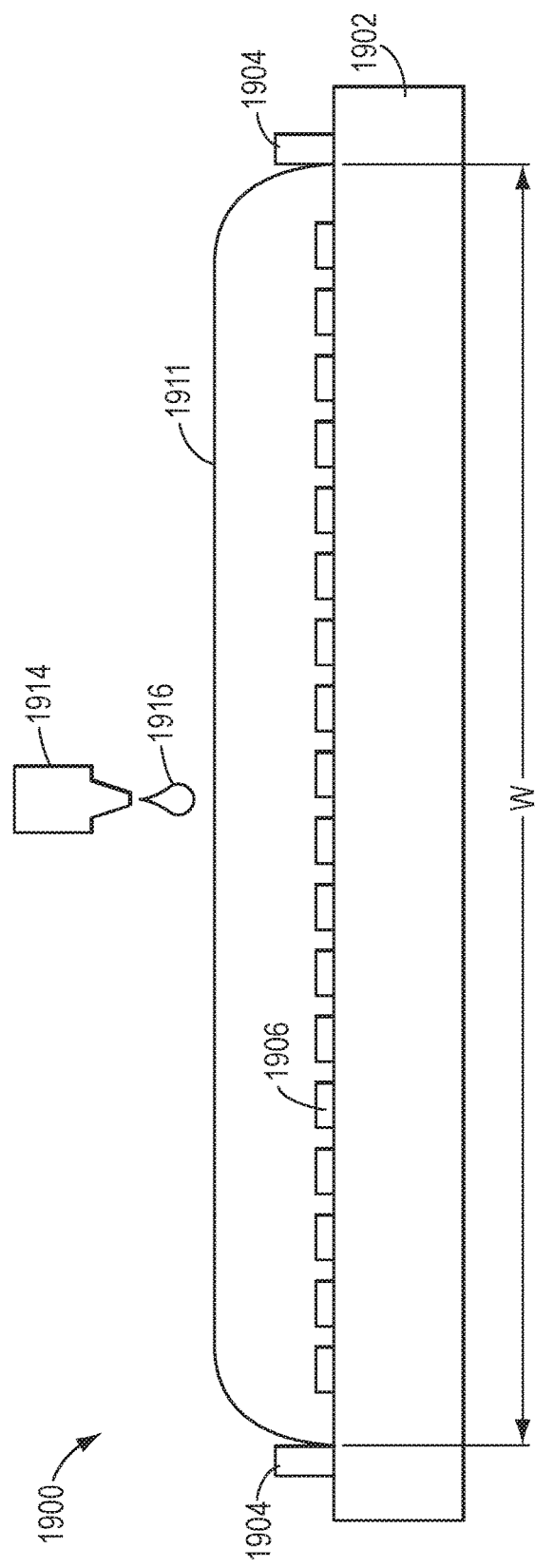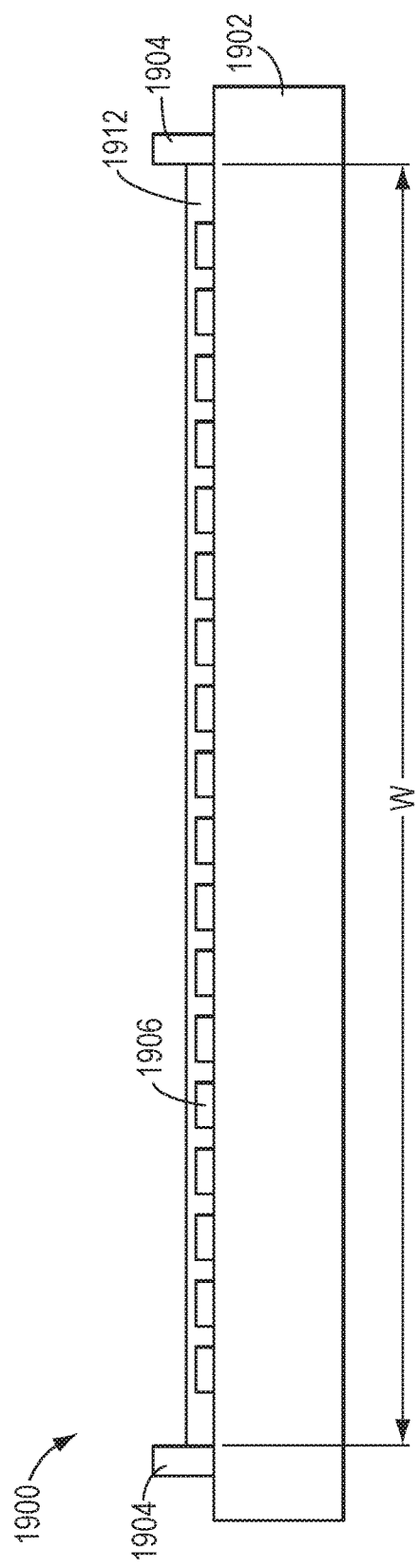

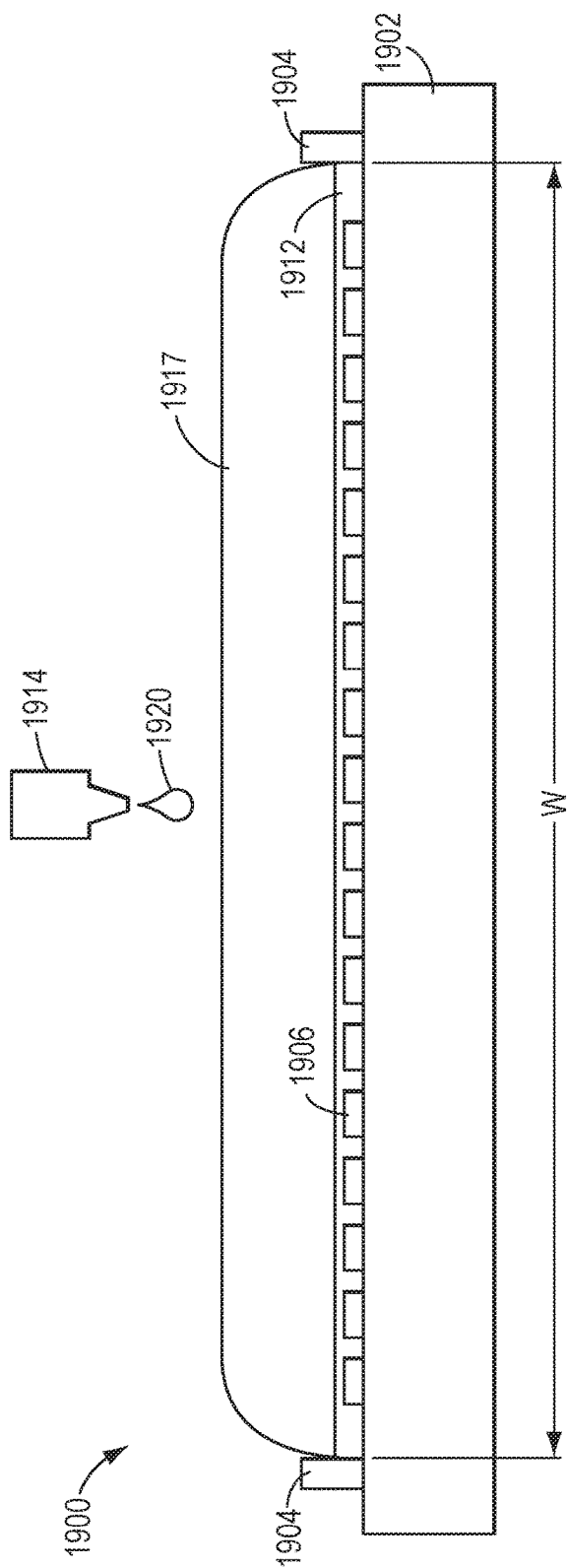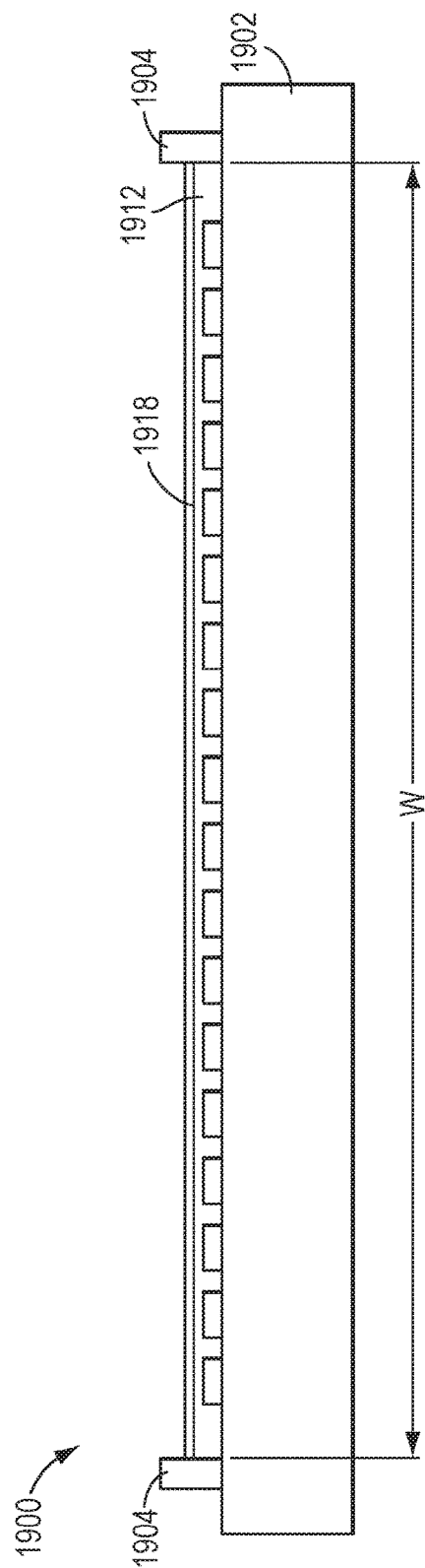

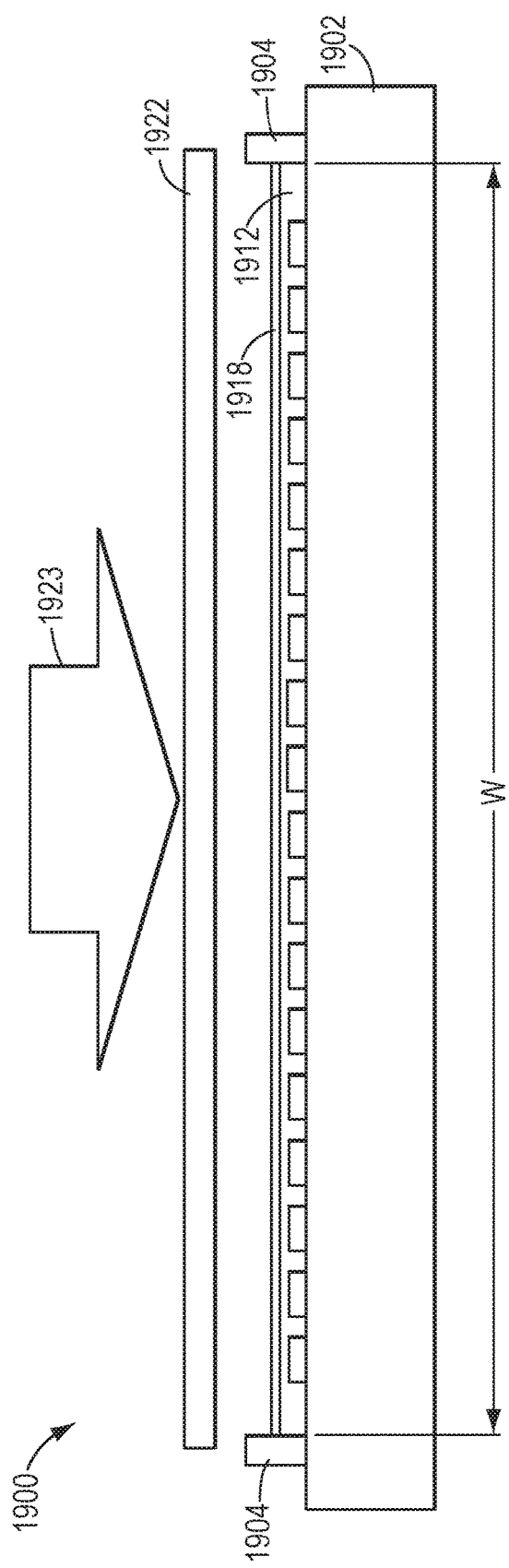
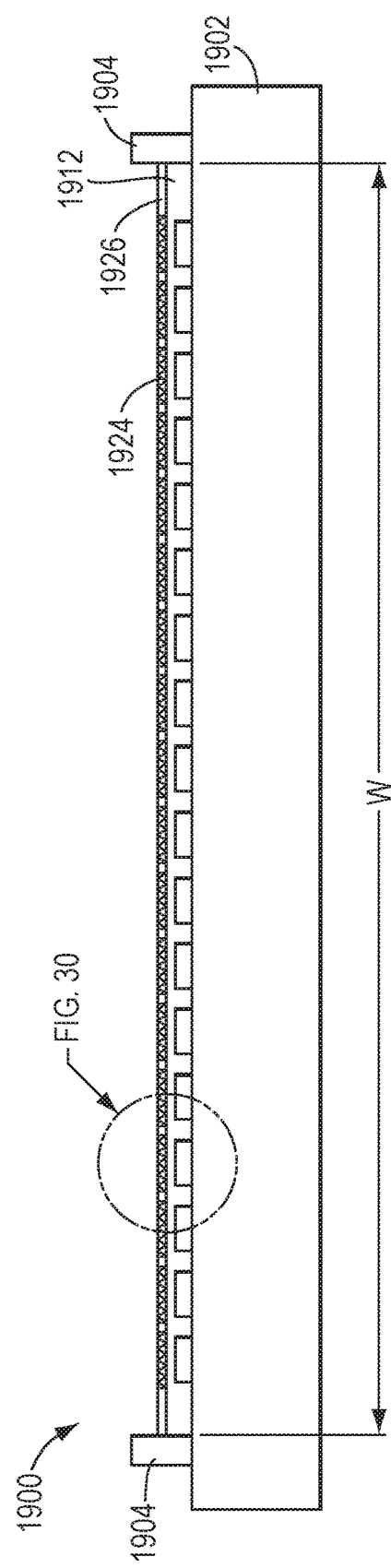
FIG. 28
FIG. 29

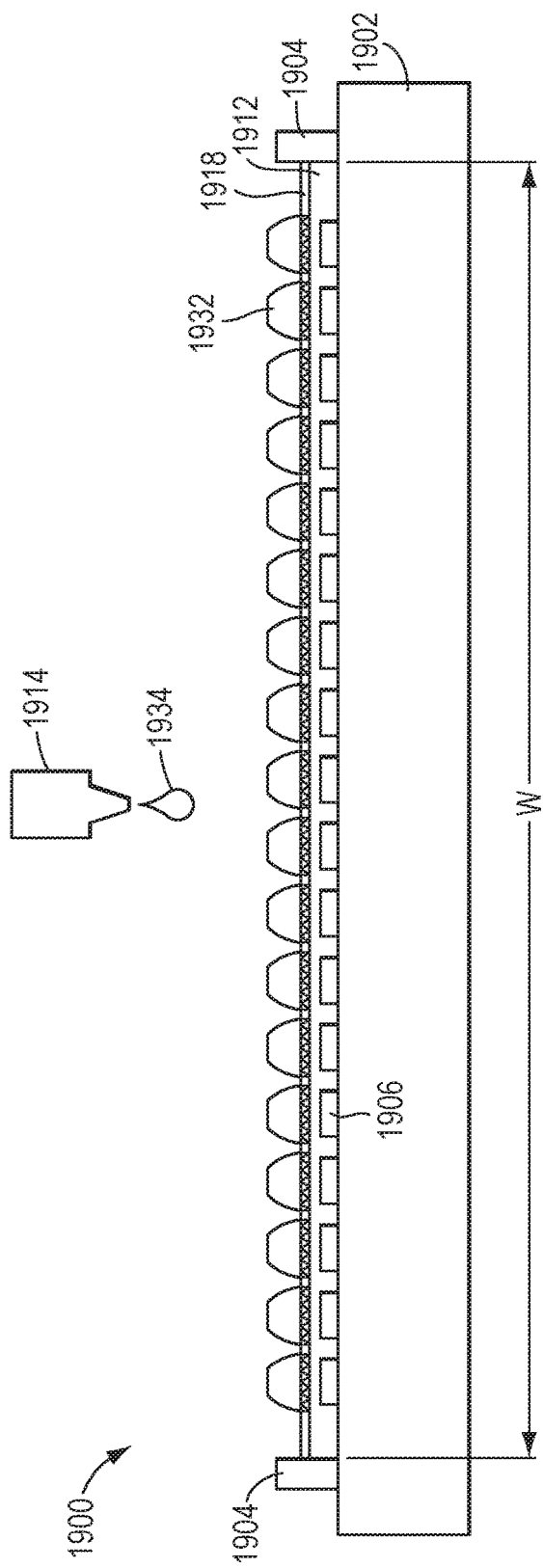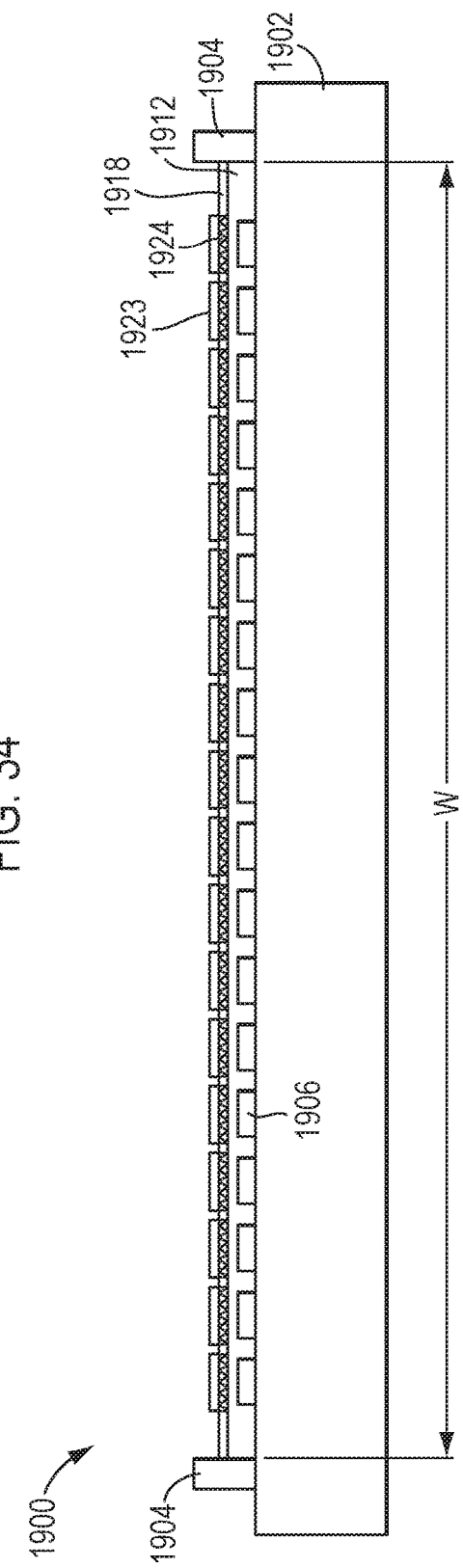

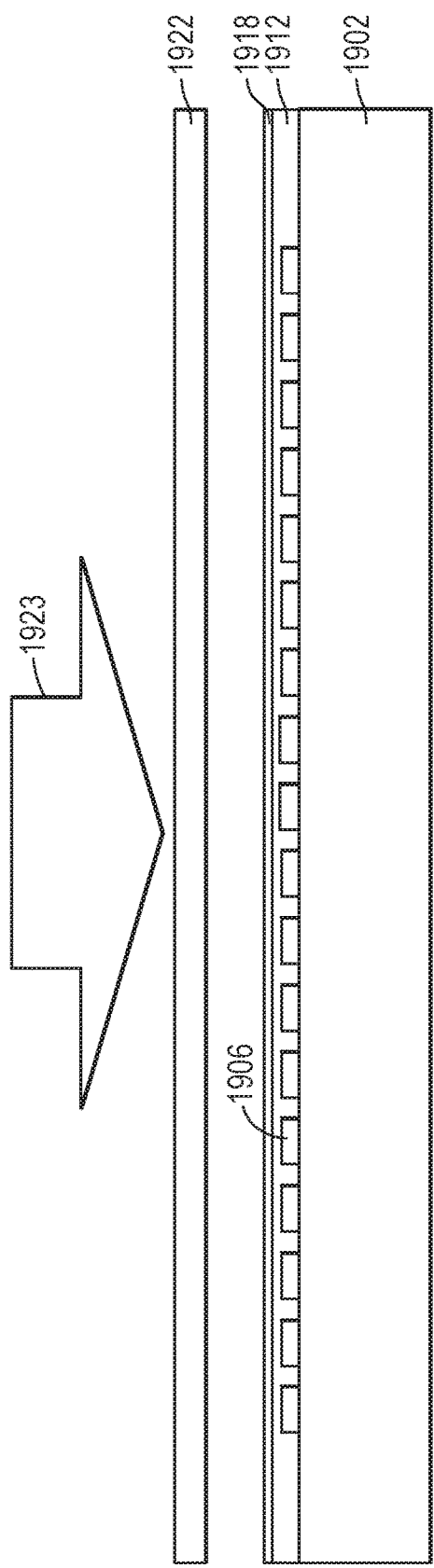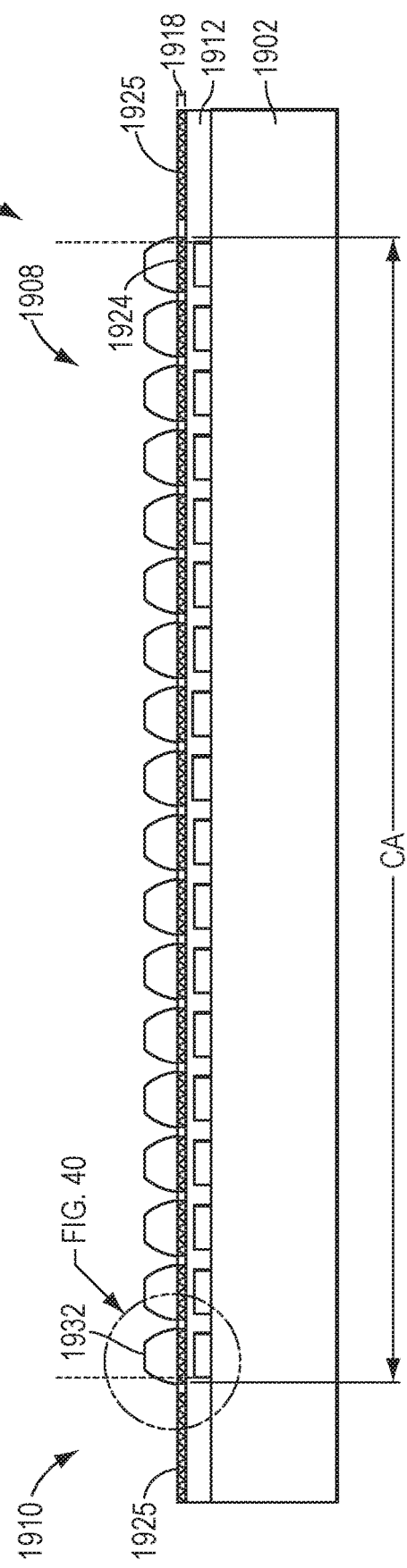

HIGH RESOLUTION ORGANIC LIGHT-EMITTING DIODE DEVICES, DISPLAYS, AND RELATED METHOD

CROSS-REFERENCE TO RELATED APPLICATIONS

This application is a continuation of U.S. patent application Ser. No. 15/462,651, filed Mar. 17, 2017. U.S. Ser. No. 15/462,651 is a continuation of U.S. patent application Ser. No. 15/254,562, filed Sep. 1, 2016, which issued May 30, 2017, as U.S. Pat. No. 9,666,652. U.S. Pat. No. 9,666,652 is a divisional of U.S. patent application Ser. No. 14/156,188, filed Jan. 15, 2014, which issued Sep. 13, 2016 as U.S. Pat. No. 9,444,050. U.S. Pat. No. 9,444,050. U.S claims the benefit of U.S. Provisional Patent Application No. 61/753,713, filed Jan. 17, 2013. U.S. Pat. No. 9,444,050 is a continuation-in-part of U.S. patent application Ser. No. 14/030,776, filed Sep. 18, 2013, which claims the benefit of U.S. Provisional Patent Application No. 61/753,692, filed Jan. 17, 2013. U.S. Each of the aforementioned applications is incorporated by reference herein in its entirety.

TECHNICAL FIELD

Aspects of the present disclosure generally relate to electronic displays and methods for making electronic displays. More particularly, aspects of the present disclosure relate to depositing and confining active organic light emitting diode (OLED) display materials on a substrate so as to fabricate an OLED display.

INTRODUCTION

The section headings used herein are for organizational purposes only and are not to be construed as limiting the subject matter described in any way.

Electronic displays are present in many differing kinds of electronic equipment such as, for example, television screens, computer monitors, cell phones, smart phones, tablets, handheld game consoles, etc. One type of electronic display relies on organic light emitting diode (OLED) technology. OLED technology utilizes an organic light-emissive layer sandwiched between two electrodes disposed on a substrate. A voltage can be applied across the electrodes causing charge carriers to be excited and injected into the organic light-emissive layer. Light emission can occur through photoemission as the charge carriers relax back to normal energy states. OLED technology can provide displays with a relatively high contrast ratio because each pixel can be individually addressed to produce light emission only within the addressed pixel. OLED displays also can offer a wide viewing angle due to the emissive nature of the pixels. Power efficiency of an OLED display can be improved over other display technologies because an OLED pixel only consumes power when directly driven. Additionally, the panels that are produced can be much thinner than in other display technologies due to the light-generating nature of the technology eliminating the need for light sources within the display itself and the thin device structure. OLED displays also can be fabricated to be flexible and bendable due to the compliant nature of the active OLED layers.

Inkjet printing is a technique that can be utilized in OLED manufacturing, and may reduce manufacturing cost. Inkjet printing uses droplets of ink containing OLED layer material and one or more carrier liquids ejected from a nozzle at a high speed to produce one or more active OLED layers including, for example a hole injection layer, a hole transport layer, an electron blocking layer, an organic light emissive layer, an electron transport layer, an electron injecting layer, and/or a hole blocking layer.

Confinement structures such as banks are typically provided on the substrate to define confinement wells where each confinement well can be associated with one or more sub-pixels, for example sub-pixels of differing colors or wavelength emissions. The confinement wells can prevent the deposited active OLED material(s) from spreading between adjacent sub-pixels. Inkjet printing methods can require substantial precision. In particular, as pixel density increases and/or as display sizes decrease, the confinement areas of the confinement wells are reduced and small errors in droplet placement can cause the droplet to be deposited outside the intended well. Moreover, droplet volumes can be too large with respect to the confinement well and droplets can undesirably spill over into adjacent sub-pixels.

In addition, non-uniformities in the active OLED layers can form at the edges in contact with confinement structures due to film drying imperfections. Film drying imperfections can be caused by the manufacturing process and/or the materials used for the confinement structures. As the confinement well area is reduced, the non-uniformities of the layers can encroach on the active emission area of the pixel creating undesirable visual artifacts in the light emission from the pixel caused by the non-uniformities. The resulting relative reduction in layer uniformity associated with the active emission area of the pixel also can negatively impact efficiency of the display because electrodes must be driven harder to achieve a relative brightness output. When the materials used for the confinement structures influence the film drying imperfections, the active OLED material may need to be reformulated.

Moreover, a reduction in the ratio of the active area to the total area, where the total area includes both the active and non-active areas of each pixel due to the confinement structures and the non-uniform active emission area, can reduce the lifetime of the display. This is because each electrode has to be driven using more current to achieve equivalent display brightness levels and using more current to drive each electrode is known to reduce the pixel lifetime. The ratio of the active area to the total area is referred to as "fill factor."

Although traditional inkjet methods address some of the challenges associated with OLED display manufacturing, there exists a continued need for improvement. For example, there exists a continued need to improve droplet deposition precision in the manufacturing of OLEDs, in particular for OLED displays having a high resolution (i.e., high pixel density). Moreover, there exists a need to reduce undesirable visual artifacts created by the deposition of the organic light-emissive layer in high resolution displays. There also exists a need to improve the device lifetime by increasing the fill factor of each pixel. Further, there exists a need for improvement in using and manufacturing OLED displays in high resolution display applications, including but not limited to, for example, high resolution mobile phones and tablet computers, which present challenges in achieving acceptable resolution, power efficiency, display lifetime, and manufacturing cost.

SUMMARY

The present disclosure may solve one or more of the above-mentioned problems and/or achieve one or more of the above-mentioned desirable features. Other features and/or advantages may become apparent from the description which follows.

In accordance with an exemplary embodiment of the present disclosure, a method of manufacturing an organic light-emissive display can be provided. A plurality of electrodes can be provided on a substrate. A first hole conducting layer can be deposited via inkjet printing over the plurality of electrodes on the substrate. A liquid affinity property of selected surface portions of the first hole conducting layer can be altered to define emissive layer confinement regions. Each emissive layer confinement region can have a portion that respectively corresponds to each of the plurality of electrodes provided on the substrate. An organic light-emissive layer can be deposited via inkjet printing within each emissive layer confinement region.

In accordance with another exemplary embodiment of the present disclosure, an organic light-emissive display can be provided. A plurality of electrodes can be disposed on a substrate. The plurality of electrodes can be arranged in an array configuration. A confinement structure can be disposed on the substrate. The confinement structure can surround the plurality of electrodes. A first hole conducting layer can be disposed over the plurality of electrodes within the confinement structure. A liquid affinity property of surface portions of the first hole conducting layer can be altered to define emissive layer confinement regions within the first hole conducting layer. An organic light-emissive layer can be disposed within each emissive layer confinement region.

In another exemplary embodiment of the present disclosure, an organic light-emissive display can be made by a process as provided. A substrate comprising a plurality of electrodes disposed on the substrate can be provided. At least one hole conducting layer can be deposited, via inkjet printing, over the plurality of electrodes on the substrate. A liquid affinity property of select portions of at least one hole conducting layer can be altered to define emissive layer confinement regions on a surface of the at least one hole conducting layer. An organic light-emissive layer can be deposited via inkjet printing within each emissive layer confinement region defined within the at least one hole conducting layer.

Additional objects and advantages will be set forth in part in the description which follows, and in part will be obvious from the description, or may be learned by practice of the present teachings. At least some of the objects and advantages of the present disclosure may be realized and attained by means of the elements and combinations particularly pointed out in the appended claims.

It is to be understood that both the foregoing general description and the following detailed description are exemplary and explanatory only and are not restrictive of the claims. It should be understood that various embodiments of the invention, in its broadest sense, could be practiced without having one or more features of these exemplary aspects and embodiments.

BRIEF DESCRIPTION OF THE DRAWINGS

The accompanying drawings, which are incorporated in and constitute a part of this specification, illustrate some exemplary embodiments of the present disclosure together with the description, serve to explain certain principles. In the drawings.

FIGS. 24-29 are cross-sectional views of another exemplary embodiment of an OLED display, depicting exemplary steps for creating an OLED display in accordance with the present disclosure;

FIGS. 34-36 are cross-sectional views of another exemplary embodiment of an OLED display, depicting exemplary steps for creating an OLED display in accordance with the present disclosure;

FIGS. 38 and 39 are cross-sectional views of another exemplary embodiment of an OLED display, depicting exemplary steps for creating an OLED display in accordance with the present disclosure;

DESCRIPTION OF EXEMPLARY EMBODIMENTS

Figure 1:
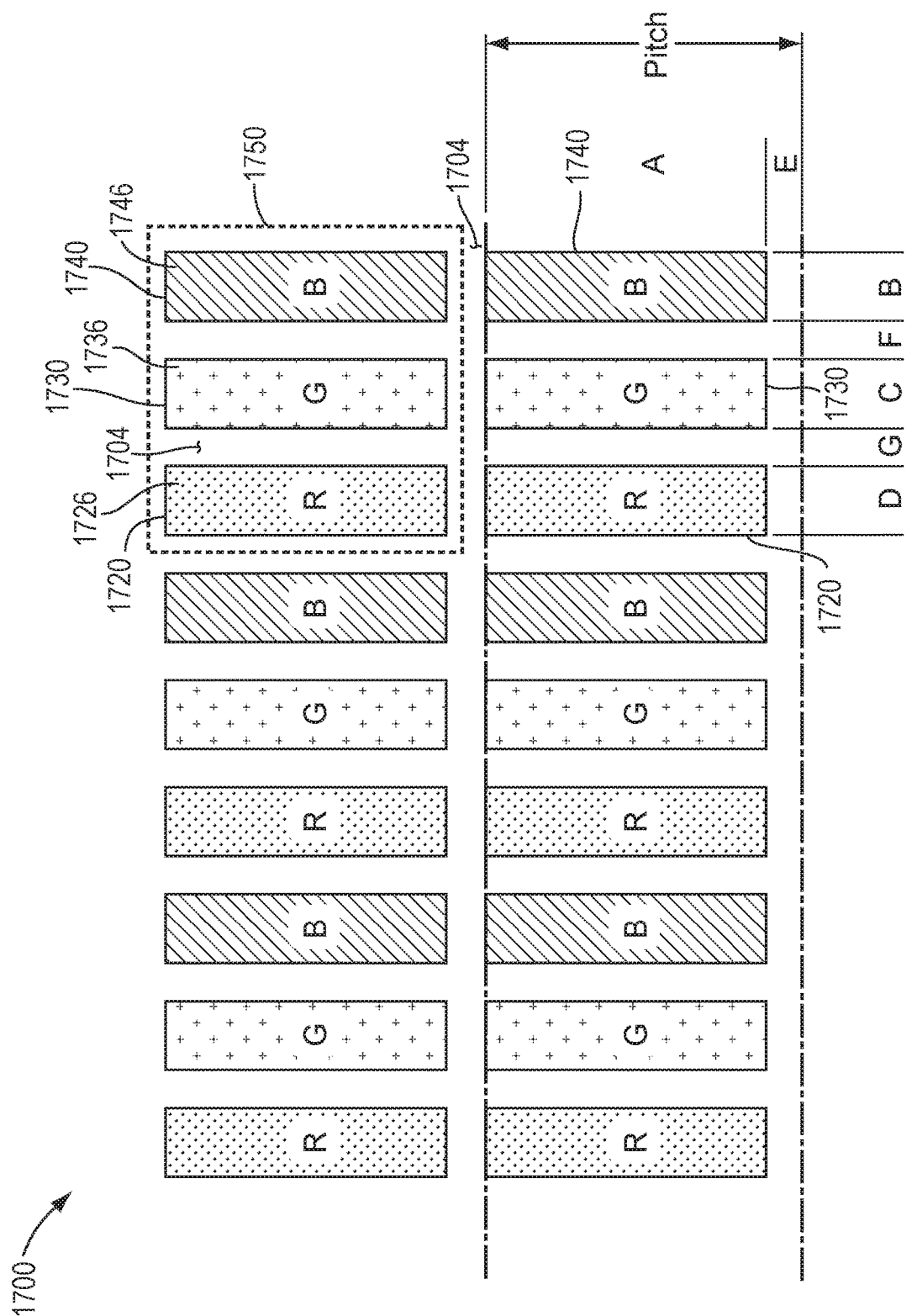
FIG. 1 is a partial plan view of a conventional pixel arrangement.

Reference will now be made in detail to various exemplary embodiments of the present disclosure, examples of which are illustrated in the accompanying drawings. Wherever possible, the same reference numbers will be used throughout the drawings to refer to the same or like parts.

For the purposes of this specification and appended claims, unless otherwise indicated, all numbers expressing quantities, percentages, or proportions, and other numerical values used in the specification and claims, are to be understood as being modified in all instances by the term "about," to the extent they are not already so modified. Accordingly, unless indicated to the contrary, the numerical parameters set forth in the following specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

Further, this description's terminology is not intended to limit the invention. For example, spatially relative terms—such as "beneath", "below", "lower", "top", "bottom", "above", "upper", "horizontal", "vertical", and the like—may be used to describe one element's or feature's relationship to another element or feature as illustrated in the figures. These spatially relative terms are intended to encompass differing positions (i.e., locations) and orientations (i.e., rotational placements) of a device in use or operation in addition to the position and orientation shown in the figures. For example, if a device in the figures is turned over, elements described as "below" or "beneath" other elements or features would then be "above" or "over" the other elements or features. Thus, the exemplary term "below" can encompass both positions and orientations of above and below depending on the overall orientation of the device. A device may be otherwise oriented (rotated 90 degrees or at other orientations) and the spatially relative descriptors used herein interpreted accordingly.

As used herein, "pixel" is intended to mean the smallest functionally complete and repeating unit of a light emitting pixel array. The term "sub-pixel" is intended to mean a portion of a pixel that makes up a discrete light emitting part of the pixel, but not necessarily all of the light emitting parts. For example, in a full color display, a pixel can include three primary color sub-pixels such as red, green, and blue. In a monochrome display, the terms sub-pixel and pixel are equivalent, and may be used interchangeably.

The term "coupled" when used to refer to electronic components is intended to mean a connection, linking, or association of two or more electronic components, circuits, systems, or any combination of: (1) at least one electronic component, (2) at least one circuit, or (3) at least one system in such a way that a signal (e.g. current, voltage, or optical signal) can be transferred from one to another. The connection, linking, or association of two or more electronic components, circuits, or systems can be direct; alternatively intermediary connections, linkings, or associations may be present, and thus coupling does not necessarily require a physical connection.

One of ordinary skill in the art would generally accept the term "high resolution" to mean a resolution greater than 100 pixels per inch (ppi) where 300 ppi can sometimes be referred to as very high resolution. One of ordinary skill in the art would also recognize that pixel density does not directly correlate to the size of the display. Various exemplary embodiments disclosed herein can be used to achieve high resolution in small and large display sizes. For example, displays having a size of about 3 inches to about 11 inches can be implemented as high resolution displays. Moreover, displays having larger sizes, such as television displays up to 55"and beyond, can also be used with various exemplary embodiments described herein to achieve high resolution displays.

As used herein, a layer or structure being "on" a surface includes both the case where the layer is directly adjacent to and in direct contact with the surface over which it is formed and the case where there are intervening layers or structures between the layer or structure being formed over the surface.

The term "reactive surface-active material" is intended to mean a material that can be used to modify at least one property of a layer of the OLED display when applied to a surface of the layer during manufacturing of the display. For example, when the reactive surface-active material is processed such as exposing the material to radiation, at least one of a physical, chemical, and/or electrical property of the layer associated with the reactive surface-active material can be altered. In an exemplary embodiment, the terms "liquid-affinity region" and "liquid-repelling region" can be used to refer to the resulting relative surface energies produced on the surface of the layer associated with the reactive surface-active material before and/or after the reactive surface-active material is processed. For example, "liquid-affinity region" can be used to refer to a portion of the surface of the layer that has surface energy that tends to attract liquid such that a liquid-affinity region portion can be , for example, relatively hydrophilic when the liquid is a water based fluid. The term "liquid-repelling region" can be used to refer to a portion of the surface of the layer that has a surface energy tending to repel liquid such that a liquid-repelling portion can be, for example, relatively hydrophobic when the liquid is a water based fluid. However, a liquid-repelling portion does not have to be completely phobic to a fluid. In other words, a liquid-repelling portion does not have a surface energy that completely repels a fluid but instead, when a liquid-repelling portion is adjacent to a liquid-affinity region liquid will tend to migrate away from the liquid-repelling region and be attracted to the liquid-affinity region.

Various factors can influence deposition precision of organic light-emissive layers in OLED display manufacturing techniques. Such factors include for example, display resolution, droplet size, target droplet area, droplet placement error, fluid properties (e.g., surface tension, viscosity, boiling point) associated with the OLED layer material (e.g., active OLED materials) inks, which are comprised of a combination of OLED layer material and one or more carrier fluids, and the velocity at which the droplets are deposited. As display resolutions increase, for example greater than 100 ppi, or for example greater than 300 ppi, various issues arise in using inkjet printing techniques for OLED display manufacturing. High precision inkjet heads used in the conventional printing techniques can produce droplet sizes ranging from about 1 picoliter (pL) to about 50 picoliters (pL), with about 10 pL being a relatively common size for high precision inkjet printing applications. Droplet placement accuracy of a conventional inkjet printing system is approximately ±10 µm. In various exemplary embodiments, confinement wells can be provided on the substrate to compensate for droplet placement errors. A confinement well can be a structure that prevents OLED material from migrating beyond a desired sub-pixel area. To ensure that a droplet accurately lands at a desired location on a substrate, such as entirely within a confinement well, various exemplary embodiments configure the confinement well to be as wide as the droplet diameter plus twice the droplet placement error of the system. For example, the diameter of a 10 pL droplet is about 25 µm and thus the preceding parameters would indicate the use of a confinement well of at least 45 µm (25 µ+(2*10 µm)) in its smallest dimension. Even for a 1 pL droplet, the droplet diameter is 12 µm, which indicates a confinement well of at least 32 µm in its smallest dimension.

Various pixel layouts that rely on a confinement well of at least 45 µm in its smallest dimension can be used in OLED displays having a resolution up to 100 ppi. However, in high resolution displays of greater than 100 ppi, for example, 10 pL droplets are too large and droplet placement accuracies too poor to reliably provide for consistent loading of droplets into confinement wells around each sub-pixel. In addition, as noted above, for high resolution displays, covering an increased amount of display area with structures used to define confinement wells can negatively impact the fill factor of each pixel, where fill factor is defined as the ratio of the light emitting area of the pixel relative to the total pixel area. As fill factor decreases, each pixel must be driven harder to achieve the same overall display brightness thereby decreasing longevity and performance of each pixel of the display.

To further illustrate some of the above mentioned challenges of working with very high resolution displays, FIG. 1 illustrates one conventional pixel layout 1700. Pixel 1750 can comprise sub-pixels 1720, 1730, 1740 arranged in a side-by-side configuration, sub-pixel 1720 being associated with light emission in the red spectrum range, sub-pixel 1730 being associated with light emission in the green spectrum range, and sub-pixel 1740 being associated with light emission in the blue spectrum range. Each sub-pixel can be surrounded by confinement structures 1704 forming confinement wells directly corresponding to the sub-pixels 1720, 1730, 1740. One sub-pixel electrode can be associated with each confinement well such that electrode 1726 corresponds to sub-pixel 1720, electrode 1736 corresponds to sub-pixel 1730, and electrode 1746 corresponds to sub-pixel 1740. Sub-pixel 1720 can have a width D, sub-pixel 1730 can have a width C, and sub-pixel 1740 can have a width B, which may be the same or differ from each other. As shown, all sub-pixels can have a length A. In addition, dimensions E, F, and G can indicate the spacing between confinement well openings. Values assigned to dimensions E, F, G can be very large in some instances, e.g., greater than 100 µm, particularly in lower resolution displays. However, for higher resolution displays, it is desirable to minimize these dimensions in order to maximize the active pixel area and thus maximize the fill factor. As illustrated in FIG. 1, the active pixel area, indicated by the shaded regions, is the entire area within each of the sub-pixel confinement wells.

Various factors can influence dimensions E, F, G, such as, for example, the minimum value for these dimensions can be restricted by the processing method. For example, in various illustrative embodiments described herein E=F=G=12 µm as a minimum dimension. For example, in a display having a 326 ppi resolution, the pixel pitch can be equal to 78 µm and E=F=G=12 µm. The confinement wells associated with each of the sub-pixels 1720, 1730, 1740 can have a target droplet area of 14 µm×66 µm (i.e. dimensions B×A, C×A, and D×A) where 14 µm is significantly less than the 45 µm smallest dimension discussed above regarding using inkjet droplets having a volume of 10 pL. It is also less than the 32 µm dimension discussed above for 1 pL droplets. In addition, the fill factor of the pixel, defined as the ratio of the active pixel area (i.e. the area associated with light emission), and the total pixel area is 46%. In other words, 54% of the pixel area corresponds to confinement structures 1704. Along the same lines, in a display having a 440 ppi resolution, the pixel pitch, P, can be equal to 58 µm and E=F=G=12 µm. Confinement wells associated with each of the emitting sub-pixels 1720, 1730, 1740 can have a target droplet area of, for example, 7 µm×46 µm where a dimension of 7 µm is significantly less than the minimum dimensions discussed above for accurate droplet placement of both 10 pL and 1 pL inkjet droplets. In this instance, the fill factor for a display having 440 ppi is around 30%.

Deposition techniques in accordance with various exemplary embodiments described herein can provide improved reliability in loading of confinement wells and deposition of active OLED layers for electronic displays, such as, for example, high resolution displays. Active OLED layers can include, for example, one or more of the following layers: a hole injection layer, a hole transport layer, an electron blocking layer, an organic light emissive layer, an electron transport layer, an electron injecting layer, and a hole blocking layer. Implementation of some of the above-identified active OLED layers is preferred and implementation of some active OLED layers is optional for electronic displays. For example, at least one hole conducting layer such as a hole injection layer or a hole transport layer must be present as well as an organic light emissive layer. All other above-identified layers may be included as desired to alter (e.g., improve) light emission and power efficiency of an electronic display such as an OLED display.

Various exemplary embodiments of confinement well configurations described herein can increase the size of the confinement well while maintaining high pixel resolution. For instance, various exemplary embodiments use relatively large confinement wells that span a plurality of sub-pixels, thereby enabling the use of relatively attainable droplet sizes and conventional printing system accuracies in the deposition of the active OLED layers, while also achieving relatively high pixel densities. Accordingly, inkjet nozzles that deposit droplet volumes in the range from 1 pL to 50 pL can be used, rather than requiring specially configured or reconfigured printheads with smaller droplet volumes and new printing systems, which may or may not be available. Moreover, by using such larger confinement wells, small manufacturing errors will not have a significant negative effect on deposition precision and the deposited active OLED layers can remain contained within the confinement well.

In accordance with various exemplary embodiments, inkjet printing techniques can provide sufficiently uniform deposition of active OLED layers. For example, various components typically used in OLED displays result in topographies of varying heights on the top surface layer of a confinement well, for example, heights differing by about 100 nanometers (nm) or more. For instance, components such as electrodes may be deposited on a substrate such that a gap is formed between neighboring electrodes in order to form separately addressable electrodes each associated with a differing sub-pixel. Regardless of which active OLED layers are deposited over the electrodes disposed on the substrate of the display, height differentials between the plane of the top surfaces of the electrodes and the top surface of the substrate of the display in regions between neighboring electrodes can contribute to the topography of the subsequently deposited OLED layers. Exemplary inkjet printing techniques and resulting displays in accordance with the present disclosure allow the active OLED layers to be deposited such that the thickness of the active OLED layers are sufficiently uniform, for example over the active electrode region, where active electrode regions can be regions of the electrode associated with the active sub-pixel area from which light is emitted. In an exemplary embodiment, a thickness of the OLED layer, at least over the active electrode region, can be less than the thickness of the sub-pixel electrodes. Sufficiently uniform thicknesses of the OLED layers over the active electrode area can reduce undesirable visual artifacts. For example, OLED ink formulations and printing processes can be implemented to minimize non-uniformity in the deposited film thickness within a given deposition area, even when that area includes both electrode and non-electrode regions. In other words, portions within the deposition area not covered by an electrode structure can contribute to the OLED layer topography such that the OLED layer can sufficiently conform to the underlying structures over which it is deposited within the deposition area. Minimizing non-uniformities in the deposited film thickness can provide for substantially uniform light emission when a particular sub-pixel electrode is addressed and activated.

In accordance with yet other exemplary embodiments, pixel layout configurations contemplated by the present disclosure can increase active region areas. For example, confinement structures can define confinement wells having a contiguous area that spans a plurality of sub-pixels such that non-active portions (e.g., substrate areas associated with confinement structures) of the display are reduced. For instance, rather than a confinement structure surrounding each sub-pixel electrode as in various conventional OLED displays, a plurality of individually addressed sub-pixel electrodes can be surrounded by a confinement structure where each sub-pixel electrode can be associated with a differing pixel. By reducing the area taken up by the confinement structures, the fill factor can be maximized because the ratio of the non-active region to the active region of each pixel is increased. Achieving such increases in fill factor can enable high resolution in smaller size displays, as well as improve the lifetime of the display.

In accordance with yet other exemplary embodiments, the present disclosure contemplates an organic light-emissive display that includes a confinement structure disposed on a substrate, wherein the confinement structure defines a plurality of wells in an array configuration. The display further includes a plurality of electrodes disposed within each well and spaced apart from one another. The display further can include first, second, and third organic light emissive layers in at least one of the plurality of wells, each layer having first, second, and third light emissive wavelength ranges, respectively. A number of electrodes disposed within the well associated with the first and second organic light-emissive layer differs from a number of electrodes disposed within the well associated with the third organic light emissive layer.

In accordance with yet other exemplary embodiments, the present disclosure contemplates an organic light-emissive display that includes a confinement structure disposed on a substrate, wherein the confinement structure defines a plurality of wells in an array configuration, including a first well, a second well, and a third well. The display further can include a first plurality of electrodes disposed within the first well and associated with a differing pixel, a second plurality of electrodes disposed within the second well and associated with a differing pixel, and at least one third electrode disposed within the third well, wherein a number of electrodes disposed within each of the first and second wells differs from a number of electrodes disposed within the third well. The display can further include a first organic light emissive layer having a first light-emissive wavelength range disposed in the first well, a second organic light emissive layer having a second light-emissive wavelength range disposed in the second well, and third organic light emissive layer having a third light-emissive wavelength range disposed in the third well.

In accordance with various other exemplary embodiments, pixel layout configurations can be arranged to extend the lifetime of the device. For example, sub-pixel electrode size can be based on the corresponding organic light-emission layer wavelength range. For instance, a sub-pixel electrode associated with light emission in the blue wavelength range can be larger than a sub-pixel electrode associated with light emission in the red or green wavelength ranges, respectively. Organic layers associated with blue light emission in OLED devices typically have shortened lifetimes relative to organic layers associated with red or green light emission. In addition, operating OLED devices to achieve a reduced brightness level increases the lifetime of the devices. By increasing the emission area of the blue sub-pixel relative to the red and green sub-pixels, respectively, in addition to driving the blue sub-pixel to achieve a relative brightness less than a brightness of the red and green sub-pixels (e.g., by adjusting the current supplied when addressing the sub-pixel as those of ordinary skill in the art are familiar with), the blue sub-pixel can serve to better balance the lifetimes of the differing colored sub-pixels while still providing for the proper overall color balance of the display. This improved balancing of lifetimes can increase the overall lifetime of the display by extending the lifetime of the blue sub-pixels.

Figure 2:
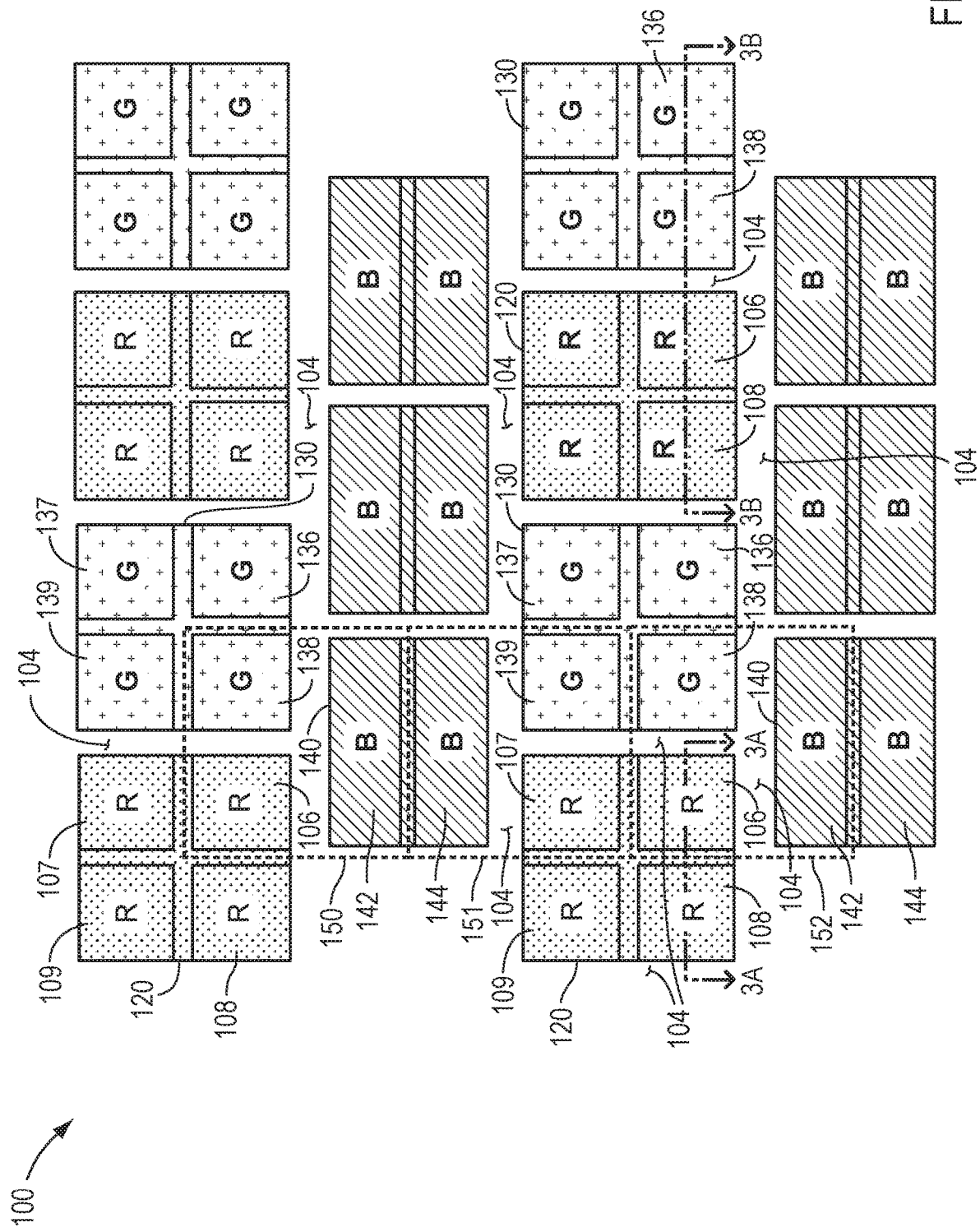
FIG. 2 is a partial plan view of an exemplary pixel arrangement in accordance with the present disclosure.
Figure 3A:
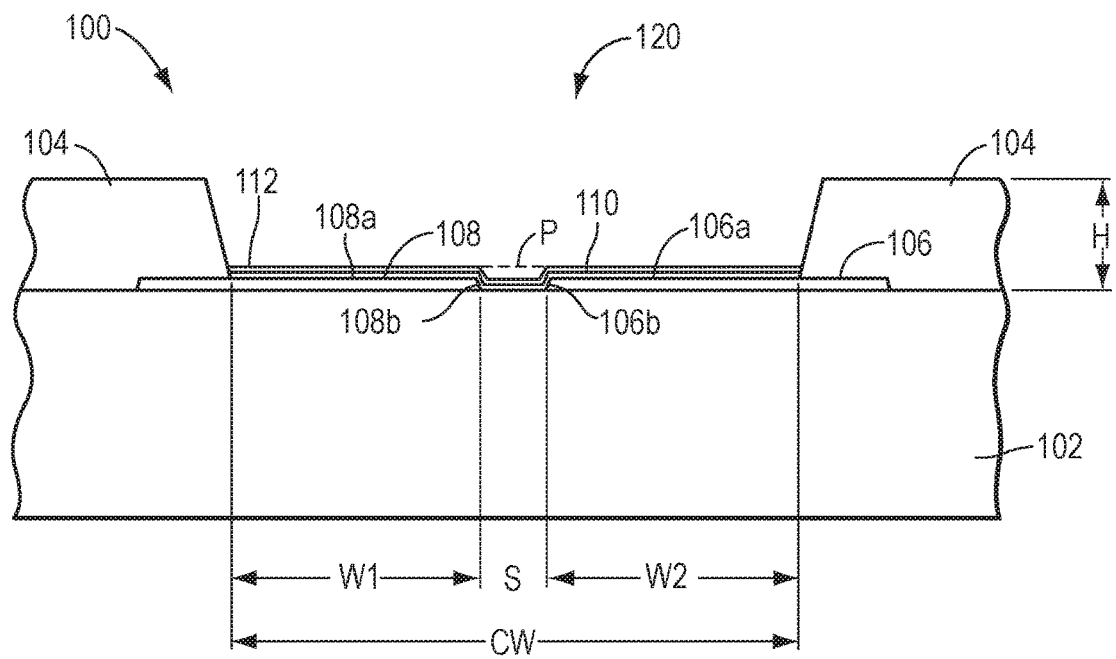
FIG. 3A is a cross-sectional view of a confinement well along line 3A-3A in FIG. 1 of an exemplary embodiment in accordance with the present disclosure.
Figure 3B:
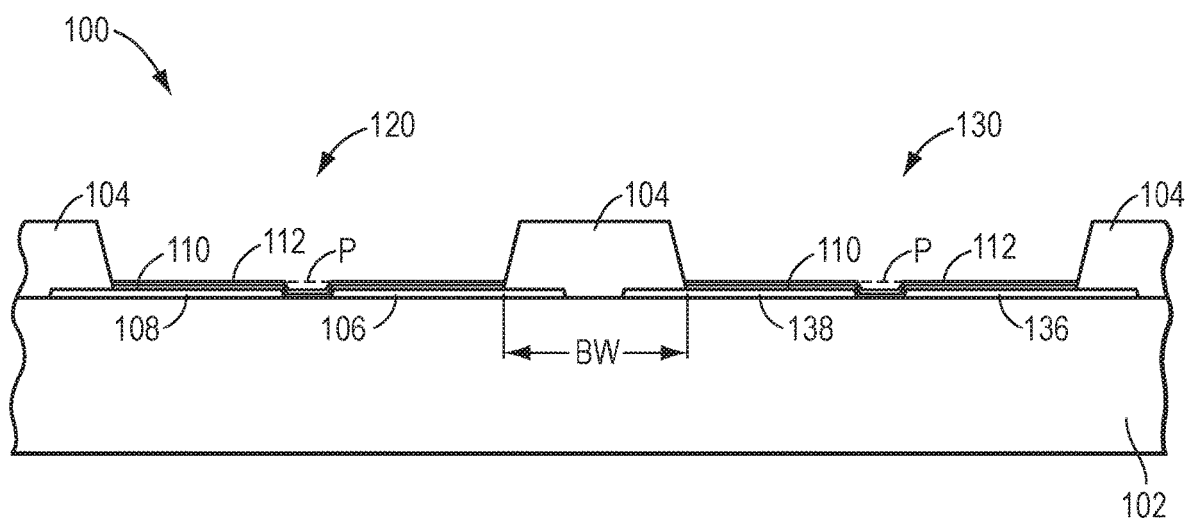
FIG. 3B is a cross-sectional view of a plurality of confinement wells along line 3B-3B in FIG. 1 of an exemplary embodiment in accordance with the present disclosure.

FIG. 2 illustrates a partial, plan view of one exemplary pixel arrangement of an organic light-emitting diode (OLED) display 100 according to an exemplary embodiment of the present disclosure. FIG. 3A illustrates a cross-sectional view along section 3A-3A identified in FIG. 2 of one exemplary embodiment of a substrate, depicting various structures for forming an OLED display. FIG. 3B illustrates a cross-sectional view along section 3B-3B identified in FIG. 2 of one exemplary embodiment of a substrate, depicting various structures for forming an OLED display.

The OLED display 100 generally includes a plurality of pixels, e.g., such as defined by dotted line boundaries 150, 151, 152, that when selectively driven emit light that can create an image to be displayed to a user. In a full color display, a pixel 150, 151, 152 can include a plurality of sub-pixels of differing colors. For example, as illustrated in FIG. 2, pixel 150 can include a red sub-pixel R, a green sub-pixel G, and a blue sub-pixel B. As can be seen in the exemplary embodiment of FIG. 2, sub-pixels need not be the same size, although in an exemplary embodiment they could be. Pixels 150, 151, 152 can be defined by driving circuitry that cause light emission such that no additional structure is necessary to define a pixel. Alternatively, exemplary embodiments of the present disclosure contemplate various new arrangements of pixel definition structures that can be included within display 100 to delineate the plurality of pixels 150, 151, 152. Those having ordinary skill in the art are familiar with materials and arrangements of conventional pixel definition structures used to provide crisper delineation between pixels and sub-pixels.

With reference to FIGS. 3A and 3B in addition to FIG. 2, OLED display 100 can include a substrate 102. Substrate 102 can be any rigid or flexible structure that can include one or more layers of one or more materials. Substrate 102 can include, for example, glass, polymer, metal, ceramic, or combinations thereof. While not illustrated for simplicity, substrate 102 can include additional electronic components, circuits, or conductive members, with which those having ordinary skill in the art have familiarity. For instance, thin-film transistors (TFTs) (not shown) can be formed on the substrate before depositing any of the other structures that are discussed in further detail below. TFTs can include, for example, at least one of a thin film of an active semiconductor layer, a dielectric layer, and a metallic contact where those of ordinary skill in the art would be familiar with materials used in the manufacture of such TFTs. Any of the active OLED layers can be deposited to conform to any topography created by TFTs or other structures formed on substrate 102, as discussed below.

Confinement structures 104 can be disposed on the substrate 102 such that the confinement structures 104 define a plurality of confinement wells. For instance, the confinement structures 104 can be a bank structure. A plurality of sub-pixels can be associated with each confinement well and the organic light-emissive material deposited within each confinement well allows all sub-pixels associated with the confinement well to have the same light emission color. For example, in the arrangement of FIG. 2, confinement well 120 can receive droplets of OLED ink associated with sub-pixels that emit red light denoted by R, confinement well 130 can receive droplets of OLED ink associated with sub-pixels that emit green light denoted by G, and confinement well 140 can receive droplets of OLED ink associated with sub-pixels that emit blue light denoted by B. Those having ordinary skill in the art would appreciate, as will be further explained below, that the confinement wells can also receive various other active OLED layers, including but not limited to, for example, additional organic light-emissive material and a hole conducting layer.

The confinement structures 104 can define confinement wells 120, 130, 140 to confine material associated with a plurality of sub-pixels. In addition, confinement structures 104 can prevent spreading of OLED ink into adjacent wells, and/or can assist (through appropriate geometry and surface chemistry) in the loading and drying process such that the deposited film is continuous within the region bounded by confinement structures 104. For example, edges of the deposited films can contact the confinement structures 104 that surround the confinement wells 120, 130, 140. The confinement structures 104 can be a single structure or can be composed of a plurality of separate structures that form the confinement structures 104.

The confinement structures 104 can be formed of various materials such as, for example, photoresist materials such as photoimageable polymers or photosensitive silicone dielectrics. The confinement structures 104 can comprise one or more organic components that are, after processing, substantially inert to the corrosive action of OLED inks, have low outgassing, have a shallow (e.g. <25 degrees) sidewall slope at the confinement well edge, and/or have high phobicity towards one or more of the OLED inks to be deposited into the confinement well, and may be chosen based on the desired application. Examples of suitable materials include, but are not limited to PMMA (poly-methylmethacrylate), PMGI (poly-methylglutarimide), DNQ-Novolacs (combinations of the chemical diazonaphithoquinone with different phenol formaldehyde resins), SU-8 resists (a line of widely used, proprietary epoxy based resists manufactured by MicroChem Corp.), fluorinated variations of conventional photoresists and/or any of the aforementioned materials listed herein, and organo-silicone resists, each of which can be further combined with each other or with one or more additives to further tune the desired characteristics of the confinement structures 104.

Confinement structures 104 can define confinement wells that have any shape, configuration, or arrangement. For example, the confinement wells 120, 130, 140 can have any shape such as rectangular, square, circular, hexagonal, etc. Confinement wells in a single display substrate can have the same shape and/or size or differing shapes and/or sizes. Confinement wells associated with differing light emission colors can have differing or the same shapes and/or sizes. Moreover, adjacent confinement wells can be associated with alternating light emission colors or adjacent confinement wells can be associated with the same light emission colors. In addition, confinement wells can be arranged in columns and/or rows where the columns and/or rows can have uniform or non-uniform alignment.

The confinement wells can be formed using any of a variety of manufacturing methods, such as, for example, inkjet printing, nozzle printing, slit coating, spin coating, spray coating, screen printing, vacuum thermal evaporation, sputtering (or other physical vapor deposition method), chemical vapor deposition, etc. and any additional patterning not otherwise achieved during the deposition technique can be achieved by using shadow masking, one or more photolithography steps (e.g. photoresist coating, exposure, development, and stripping), wet etching, dry etching, lift-off, etc.

As illustrated in FIG. 2, confinement wells 120, 130, 140 according to various exemplary embodiments, can be defined by the confinement structures 104 such that they span a plurality of pixels 150, 151, 152. For example, pixel 150 includes a red sub-pixel R, a green sub-pixel G, and a blue sub-pixel B that are each part of a differing confinement well 120, 130, 140. Each confinement well 120, 130, 140 can include a plurality of electrodes, such as 106, 107, 108, 109, 136, 137, 138, 139, 142, 144, wherein the electrodes within the confinement wells 120, 130, 140 can be spaced apart from each other such that a gap S is formed between adjacent electrodes within a confinement well. In exemplary embodiments, the gap S can be of sufficient size to electrically isolate an electrode from any adjacent electrode, and in particular, the active electrode regions of adjacent electrodes can be isolated from one another. The gap or space S can reduce current leakage and improve sub-pixel definition and overall pixel definition.

While omitted for clarity and ease of illustration, drive circuitry can be disposed on the substrate 102, and such circuitry can be disposed either beneath the active pixel areas (i.e., the light emitting regions) or within the non-active pixel areas (i.e., the non-light emitting regions). In addition, while not illustrated, circuitry can also be disposed under confinement structures 104. The drive circuitry can be coupled to each electrode such that each electrode can be selectively addressed independently of the other electrodes within the confinement well. The region of non-uniform topography that results due to the gap S between electrodes is described in further detail below.

Each electrode 106, 107, 108, 109, 136, 137, 138, 139, 142, 144 within a confinement well 120, 130, 140 can be associated with a differing sub-pixel. For example, as illustrated in FIG. 2, confinement well 120 can be associated with red light emission. Electrodes 106, 107, 108, 109 can be positioned within the confinement well 120 where each electrode is operable to address a sub-pixel of a differing pixel (e.g., pixels 151 and 152 being illustrated). At least two electrodes can be positioned within each confinement well 120, 130, 140. The number of electrodes positioned within each confinement well 120, 130, 140 can be the same or differing from other confinement wells. For example, as illustrated in FIG. 2, confinement well 140 can include two sub-pixel electrodes 142, 144 associated with blue light emission and confinement well 130 can include four sub-pixel electrodes 136, 137, 138, 139 associated with green light emission.

In an exemplary embodiment, the confinement structures 104 can be disposed on a portion of the electrodes 106, 107, 108, 109, 136, 137, 138, 139, 142, 144. As illustrated in FIGS. 3A and 3B, the confinement well 120 can be defined by the confinement structures 104 where the confinement structures 104 are disposed partially over a portion of electrodes 106, 108 and partially directly over substrate 102 without being over an electrode. Alternatively, the confinement structures 104 can be disposed over the substrate 102 between electrodes of adjacent confinement wells. For example, the confinement structures 104 can be disposed on substrate 102 in a space formed between electrodes associated with a differing sub-pixel emission color such that the confinement structures 104 are directly disposed on substrate 102 and are not disposed over any portion of an electrode. In such a configuration (not illustrated), the electrodes corresponding to sub-pixels can be disposed either directly adjacent to (in abutment with) the confinement structures 104 or the electrodes can be spaced apart from the confinement structures 104 such that sub-pixel definition can be achieved.

When a voltage is selectively applied to an electrode 106, 107, 108, 109, 136, 137, 138, 139, 142, 144, light emission can be generated within a sub-pixel of a pixel, such as, pixels 150, 151, 152. Electrodes 106, 107, 108, 109, 136, 137, 138, 139, 142, 144, can be transparent or reflective and can be formed of a conductive material such as a metal, a mixed metal, an alloy, a metal oxide, a mixed oxide, or a combination thereof. For example, in various exemplary embodiments, the electrodes may be made of indium-tin-oxide, magnesium silver, or aluminum. Electrodes 106, 107, 108, 109, 136, 137, 138, 139, 142, 144, can have any shape, arrangement, or configuration. For example, referring to FIG. 3A, electrodes 106, 107, 108, 109, 136, 137, 138, 139, 142, 144, can have a profile such that the top surface 106a, 108a can be substantially planar and parallel to the surface of the substrate 102 while the side edges 106b, 108b of the electrodes can be substantially perpendicular to or can be angled and/or rounded with respect to the surface of the substrate.

It is further noted that the active portion of the electrode, i.e. the portion associated with light emission, are those portions of the electrode which are disposed directly underneath the deposited OLED layers without any intervening insulating substrate structures between the electrode surface and the OLED layers. By way of example, again with reference to FIG. 3A, the portions of electrodes 106 and 108 that are disposed beneath confinement structures 104 are excluded from the active portion of the electrode area, whereas the remainder of the regions of electrodes 106 and 108 are included in the active portion of the electrode area.

The electrodes may be deposited in various ways, such as, by a thermal evaporation, chemical vapor deposition, or sputtering method. The patterning of the electrodes may be achieved, for example, using shadow masking or photolithography. As mentioned above, electrodes 106, 107, 108, 109, 136, 137, 138, 139, 142, 144 can have a thickness and be spaced apart such that a topography is formed on the substrate 102, shown best in the various cross-sectional views, such as in FIG. 3A. In an exemplary embodiment, electrodes 106, 107, 108, 109, 136, 137, 138, 139, 142, 144 can have a thickness ranging from 60 nm to 120 nm, though this range is nonlimiting and larger or smaller thicknesses are possible as well.

One or more active OLED layers can be provided within each confinement well 120, 130, 140 such as hole conducting layer 110 and organic light emissive layer 112 shown in FIGS. 3A and 3B. The active OLED layers can be deposited such that they can sufficiently conform to the topographies that result from thickness of and spacing between the electrodes 106, 107, 108, 109, 136, 137, 138, 139, 142, 144 within a confinement well 120, 130, 140, as well as the thickness of the respective active OLED layers. For example, the active OLED layers can be continuous within a well and have a thickness so as to sufficiently conform and follow the resultant topography of the underlying electrode structures disposed within each confinement well.

The deposited OLED layers may therefore result in a surface topography that does not lie in a single plane parallel to the substrate and across the entire confinement well. For example, one or both of OLED layers 110, 112 can be non-planar and discontinuous in a single plane of the display (wherein the plane of the display is intended as a plane parallel to substrate 102) due to the relative depression or protrusion associated with any surface feature including electrodes disposed on substrate 102. As shown, the OLED layers 110, 112 can sufficiently conform to underlying surface feature topographies such that a top surface of the OLED layer can have a resulting topography that follows the topography of the underlying surface features. In other words, each deposited OLED layer sufficiently conforms to all underlying layers and/or surface features disposed on the substrate 102 such that those underlying layers contribute to the resulting non-planar top surface topography of the OLED layers after they are deposited. In this way, in a plane across the confinement well that is parallel to a plane of the display, a discontinuity in layer 110 or 112, or both, can arise as the layer(s) rise and/or fall, relative to the plane, with the existing surface features provided from electrodes, circuitry, pixel definition layers, etc., in the confinement well. While the active OLED layers 110 and/or 112 need not perfectly conform to the underlying surface topography (for example, as explained below there may be local non-uniformities in thickness around edge regions and the like), a sufficiently conformal coating in which there are no significant build-ups or depletions of material can promote a more even, uniform, and repeatable coating.

As shown in FIG. 3A, each layer 110, 112 can be substantially continuous within the entire confinement well 120 such that each layer is disposed over substantially all surface features within the confinement well 120 (e.g. sub-pixel electrodes, circuitry, pixel definition layers, etc.) where the edges of each layer contact the confinement structures 104 surrounding the confinement well 120. In various exemplary embodiments, active OLED layer material can be deposited to form a discrete continuous layer entirely within a confinement well to substantially prevent any discontinuities in the layer within the well (in other words a region within the well where the active OLED layer material is missing). Such discontinuities can cause undesirable visual artifacts within the emission region of a sub-pixel. It is worth noting that though each layer 110, 112 is substantially continuous within the confinement well, it can nonetheless be discontinuous in a single plane, as noted above, due to the rising/falling of the layer as it sufficiently conforms to existing topographies of features disposed in the confinement well over which the layers are deposited. For example, in exemplary embodiments, if such a rise and/or fall is by an amount, e.g., 100 nm, greater than the thickness of the thinnest part of the deposited layer within the well, e.g., 50 nm, the OLED material layer will not be continuous in a plane parallel to the display within the well.

The layers 110, 112 can have a substantially uniform thickness within each confinement well which may provide for more uniform light emission. For the purpose of this application, substantially uniform thickness can refer to an average thickness of the OLED layer over planar surface regions, such as over active electrode regions, but also can encompass minute variations or local non-uniformities in thickness as described below. Over the planar surface regions, e.g. 106a, 108a, and bottom surface of gaps in FIG. 3A, it is anticipated that for a substantially uniform OLED coating the variation in thickness from an average thickness of the OLED layer can be less than ±20%, such as less than ±10% or less than ±5%.

As noted above, however it is contemplated that local non-uniformities in thickness may arise in portions of the layers 110, 112 surrounding changes in surface topography and/or surface chemistry, and in such regions, the film thickness can locally deviate substantially from the ±20%, ±10%, or ±5% parameters specified above. For example, local non-uniformities in the thickness of a continuous layer can occur due to the topography associated with surface features disposed on substrate 102 and/or a change in surface chemistry between the surface features disposed on the substrate 102 such as at the edge of the confinement well structures 104, at the edge of a pixel definition layer (discussed below), on the electrode edge sidewalls (e.g. along 106b, 108b), or where the electrode meets the substrate surface. Local non-uniformities can lead to deviations in film thickness. For example, the local non-uniformities can deviate from the thickness of the layers 110, 112 provided over the active electrode regions (e.g. along 106a, 108a) of electrodes 106, 108. The non-uniformities can create generally localized "edge effect" deviations within a range of approximately 5 μm-10 μm around such surface features disposed on substrate 102 in the confinement well, such as at edges of electrodes, circuitry, pixel definition layers, etc. For the purposes of this application, such "edge effect" deviations are intended to be encompassed when describing the OLED film coating as having a "substantially uniform thickness" within the well.

In an exemplary embodiment, the thickness of each layer 110, 112 can be equal to or less than the thickness of the electrodes such that the upper surface of each layer does not lie in a single plane parallel to the plane of the display (i.e., a plane parallel to the substrate) due to the dip in the film formed as the layer traverses the gap between the active regions of the electrodes. This is illustrated, for example, in FIG. 3A, wherein a dashed line is provided to illustrate a plane P that is parallel to the plane of the substrate 102. As shown, layers 110, 112 can each have an average thickness that is substantially uniform within the region of layers 110, 112 over with the active electrode regions of electrodes 106, 108. However, layers 110, 112 can also include small and localized non-uniform thickness in areas associated with topography changes caused by the surface features such as around edges of those surface features (e.g. edges of electrodes 106, 108 adjacent to the gap).

The layers 110, 112 can be deposited using any manufacturing method. In an exemplary embodiment, the hole conducting layer 110 and the organic light-emission layer 112 can be deposited using inkjet printing techniques. For example, the material of hole conducting layer 110 can be mixed with a carrier fluid to form an inkjet ink that is formulated to provide reliable and uniform loading into the confinement wells. The ink for depositing hole conducting layer 110 can be delivered to the substrate at high speeds from an inkjet head nozzle into each confinement well. In various exemplary embodiments, the same hole conducting material can be delivered to all of the confinement wells 120, 130, 140 so as to provide for depositing of the same hole conducting layer 110 within all of the confinement wells 120, 130, 140. After material is loaded into the confinement wells to form hole conducting layer 110, the display 100 can be dried to allow any carrier fluid to evaporate, a process which can include exposing the display to heat, to vacuum, or ambient condition for a set period of time. Following drying, the display may be baked at an elevated temperature so as to treat the deposited film material, for example, to induce a chemical reaction or change in film morphology that is beneficial for the quality of the deposited film or for the overall process. The material associated with each organic light-emissive layer 112 can be similarly mixed with a carrier fluid such as an organic solvent or a mixture of solvents to form inkjet inks that are formulated to provide reliable and uniform loading into the confinement wells. These inks can then be inkjet deposited using an inkjet process within the appropriate confinement wells 120, 130, 140 associated with each emission color. For example, the ink associated with the red organic light-emissive layer, the ink associated with the green organic light-emissive layer, and the ink associated with the blue organic light-emissive layer are separately deposited into the corresponding confinement wells 120, 130, 140. The differing organic light-emissive layers 112 can be deposited simultaneously or sequentially. After loading with one or more of the inks associated with the organic light emissive layers, the display can be similarly dried and baked as described above for the hole conducting layer.

While not illustrated, additional active OLED layers of material can be disposed within the confinement well. For example, OLED display 100 can further include a hole injection layer, a hole transport layer, an electron blocking layer, a hole blocking layer, an electron transport layer, an electron injection layer, a moisture protection layer, an encapsulation layer, etc., all of which those having ordinary skill in the art are familiar with but are not discussed in detail here.

The hole conducting layer 110 can include one or more layers of material that facilitates injection of holes into the organic light-emissive layer 112. For example, hole conducting layer 110 can include a single layer of hole conducting material such as, for example, a hole injection layer. Alternatively, hole conducting layer 110 can include a plurality of layers such as at least one of a hole injection layer, such as Poly(3,4-ethylenedioxythiophene:poly(styrenesulfonate) (PEDOT:PSS), and a hole transport layer, such as N,N'-Di-((1-napthyl)-N,N'-diphenyl)-1,1'-biphenyl)-4,4'-diamine (NPB).

The organic light-emissive layer 112 can be deposited over the hole conducting layer 110 such that organic light-emissive layer 112 sufficiently conforms to the topography created by the electrodes, the space between the electrodes, and the topography of the hole conducting layer. The organic light-emissive layer 112 can include material to facilitate light emission such as an organic electroluminescence material.

In an exemplary embodiment, the thickness of the OLED stack (e.g. all active OLED layers deposited over the electrodes within a confinement well) can range from 10 nm to 250 nm. For example, a hole transport layer can having a thickness ranging from 10 nm to 40 nm; a hole injection layer can have a thickness ranging from 60 nm to 150 nm; an organic light-emissive layer can have a thickness ranging from 30 nm-150 nm, and optionally a hole blocking layer, electron transport layer, and electron injection layer having combined thickness ranging from 10 nm to 60 nm.

In an exemplary embodiment, it is contemplated that droplets having a volume of about 10 pL or less may be used to produce each of layers 110, 112. In various exemplary embodiments, droplet volumes of 5 pL or less, 3 pL or less, or 2 pL or less may be used. The OLED layers 110, 112 can be formed using from 1 to 20 droplets having the above described volumes.

In one exemplary and nonlimiting embodiment, the present disclosure contemplates confinement wells arranged such that the areas of the wells associated with red, green, or blue light emissions 120, 130, 140 can be 66 μm×66 μm for displays having a resolution of 326 ppi (e.g., Pitch=78 um) where the width between neighboring wells in this embodiment can be 12 μm. The area associated with red or green sub-pixel light emission of such an arrangement can be 31.5 μm×31.5 μm, and the area associated with blue sub-pixel light emission can be 66 μm×30 μm, leading to an overall pixel fill factor of 65%, as compared to the fill factor of 46% for the conventional RGB side-by-side layout described with reference to FIG. 1. For another exemplary and nonlimiting embodiment, a display having a resolution of 440 ppi (e.g., Pitch=58 μm), it is contemplated to arrange confinement wells such that areas of the wells associated with red, green, or blue light emissions 120, 130, 140 can be 46 μm×46 μm, where again the width between neighboring wells in this embodiment is 12 μm. An area associated with red or green sub-pixel light emission of such a display structure can be 20.3 μm×20.3 μm, while an area associated with blue sub-pixel light emission can be 76 μm×49.1 μm, thereby producing a fill factor of approximately 46%, as compared to the fill factor of 30% for the conventional RGB side-by-side layout described with reference to FIG. 1. In these embodiments the width between adjacent wells can be 12 μm, but as discussed above, this width can take on different values, and while a smaller value may be desirable (to provide for a greater proportion of the substrate area assigned to the active electrode areas), processing constraints on the formation of the well structure and circuit layout constraints may effectively set a lower bound on this dimension. The value of 12 μm is selected as representative for these examples, but one having ordinary skill in the art would appreciate that other dimensions could be used, for example, larger dimensions like 20 μm, or smaller dimensions, like 8 μm, 6 μm, or even 1 μm without departing from the scope of the present disclosure and claims. One having ordinary skill in the art can further appreciate that while in the above examples, the red, green, and blue confinement wells each have identical dimensions, other arrangements are possible. For example, two confinement wells associated with differing emission colors can have the same dimensions and one confinement well associated with yet another differing emission color can have a differing dimension or the confinement wells associated with each emission color can have differing dimensions.

These exemplary, non-limiting arrangements in accordance with the present disclosure provide for confinement wells having minimum well dimensions of greater than 45 μm even for the very high resolution case of 440 ppi, and therefore can permit droplet volumes, for example, of around 10 pL, to be used, thereby simplifying manufacturing by allowing for the use of droplet volumes that are available from existing inkjet printing. In addition, the above exemplary, non-limiting arrangements increase pixel fill factor as compared to a conventional RGB side-by-side layout by about 43% and 84% for the 326 ppi and 440 ppi cases respectively. More generally, the various exemplary embodiments in accordance with the present disclosure provide enhancements in the fill factor of high resolution displays manufactured using inkjet, such as very high resolution displays, for which enhancements of 40% or more are possible.

As those of ordinary skill in the art are familiar with, a common electrode (not shown) can be disposed over the organic light-emissive layer 112 following deposition. After the common electrode is deposited, the resulting topography of the common electrode can sufficiently conform to topography of organic light-emissive layer 112. The common electrode can be deposited using any manufacturing technique, for example, by vacuum thermal evaporation, sputtering, chemical vapor deposition, spray coating, inkjet printing, or other techniques. The common electrode can be transparent or reflective and can be formed of a conductive material such as a metal, a mixed metal, an alloy, a metal oxide, a mixed oxide, or a combination thereof. For example, indium tin oxide or a thin layer of magnesium silver. The thickness of the common electrode can range from approximately 30 nm to 500 nm.

In addition, the common electrode can have any shape, arrangement, or configuration. For example, the common electrode can be disposed as a discrete layer associated with single sub-pixel, or a single pixel. Alternatively, the common electrode can be disposed over multiple sub-pixels or pixels, for example, over the entire pixel arrangement of the display 100. For instance, the common electrode can be blanket deposited within the confinement wells 120, 130, 140 as well as over the confinement structures 104. Additional active OLED layers (not shown for simplicity) can be deposited onto the organic light emissive layer 112 before deposition of a common electrode, such as electron transport layers, electronic injection layers, and/or hole blocking layers. Such additional OLED layers can be deposited by inkjet printing, by vacuum thermal evaporation, or by another method.

In accordance with exemplary embodiments, the OLED device 100 can have a top emissive configuration or a bottom emissive configuration. For example, as illustrated in FIG. 3A, in a top emissive configuration, electrodes 106, 108 can be reflective electrodes and the common electrode that is disposed over the organic light-emissive layer can be a transparent electrode. Alternatively, in a bottom emissive configuration, electrodes 106, 108 can be transparent and the common electrode can be reflective.

In another exemplary embodiment, the OLED display 100 can be an active-matrix OLED (AMOLED). An AMOLED display, as compared to a passive-matrix OLED (PMOLED) display, can enhance display performance, but relies on active drive circuitry, including thin film transistors (TFTs), on the substrate and such circuitry is not transparent. While PMOLED displays have some elements, such as conductive bus lines that are not transparent, AMOLED displays have substantially more elements that are non-transparent. As a result, for a bottom emission AMOLED display, the fill factor may be reduced compared to a PMOLED because light can only be emitted through the bottom of the substrate between the non-transparent circuit elements. For this reason, it may be desirable to use a top emission configuration for AMOLED displays since using such a configuration may permit the OLED device to be constructed on top of such non-transparent active circuit elements. Thus, light can be emitted through the top of the OLED device without concern for the opacity of the underlying elements. In general, using a top emission structure can increase the fill factor of each pixel 150 of display 100 because light emission is not blocked by additional non-transparent elements (e.g. TFTs, driving circuitry components, etc.) deposited on the substrate 102.

In addition, non-active areas of each pixel can be limited to the confinement structures, surface features, and/or pixel definition layers (examples of which are described in further detail below) formed on the substrate 102. A conductive grid also can be disposed on substrate 102 to prevent an undesirable voltage drop across the display 100, which can arise because the transparent top electrodes used in top emission OLED structures typically have low conductivities. When the common electrode is blanket deposited within the confinement wells 120, 130, 140 and over the confinement structures 104, the conductive grid can be disposed on non-active portions of the substrate 102 and coupled to the common electrode through via holes formed in selected confinement structures 104. However, the present disclosure is not limited to a top emission active-matrix OLED configuration. The techniques and arrangements discussed herein can be used with any other type of displays such as bottom emission and/or passive displays as well as those one of ordinary skill in the art would understand how to make using appropriate modifications.

In an exemplary embodiment, as illustrated in FIG. 3A, each confinement well can include a plurality of active sub-pixel regions that span W1 and W2, respectively, and are separated by gap S, and are confined within a well having width CW. The dimensions, W1, W2, and CW are primarily related to pixel pitch, which correlates to the resolution (e.g. 326 ppi, 440 ppi) of the display. The dimension of the gap S is related to restrictions associated with fabrication techniques and processes, and layout. In general, it may be desirable to minimize the dimension associated with the gap S. For example, 3 µm may be a minimum dimension; however, one of ordinary skill in the art would appreciate that dimensions from as small as 1 µm to greater than 10 µm are possible. The height H of confinement structures 104 is also related to processing restrictions rather than a particular display layout or resolution. While an exemplary value of the height H of confinement structures 104 may be 1.5 µm, the height H, can range from 0.5 µm to 5 µm in various exemplary embodiments. Referring to FIG. 3B, BW is the width of the confinement structures 104 between adjacent wells (e.g., wells 120 and 130 in FIG. 3B). As described above, it may be desirable to minimize this dimension and an exemplary value is 12 µm. However, one of ordinary skill would understand that this value can be arbitrarily large (e.g. hundreds of microns) in some instances, and can also be as small as 1 µm, depending on fabrication techniques and processes that may permit such a small value for BW.

Figure 4:
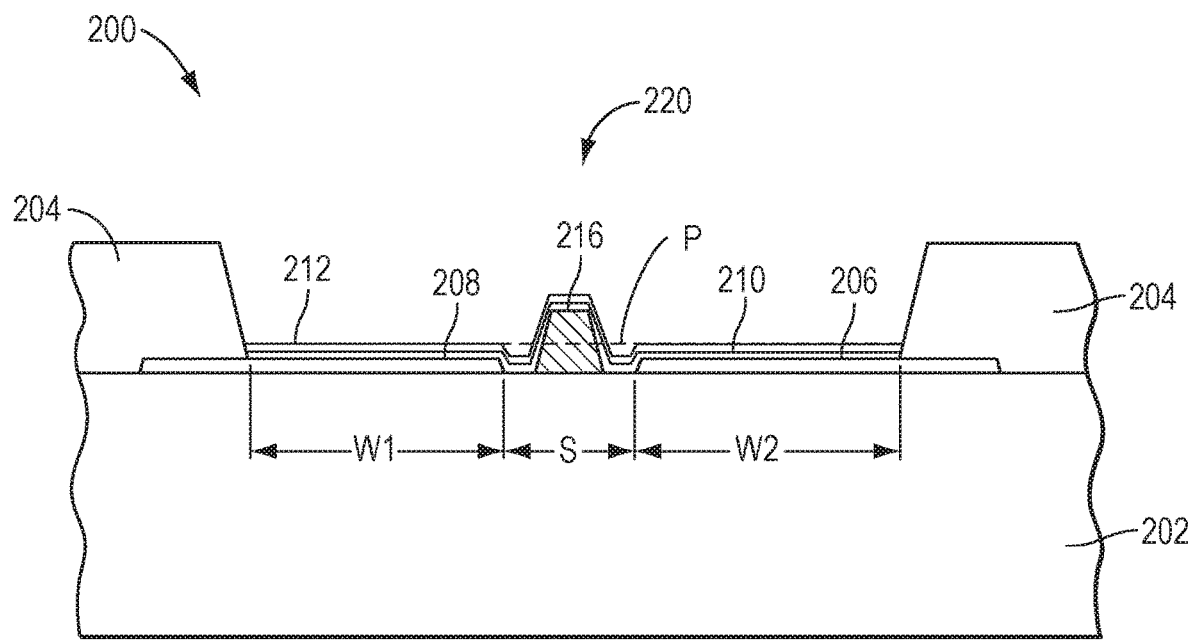
FIG. 4 is a cross-sectional view similar to the view of FIG. 3A of another exemplary embodiment of a confinement well in accordance with the present disclosure.

Referring now to FIG. 4, a cross-sectional view of an exemplary embodiment of a confinement well 220 of a display 200 is illustrated. The arrangement of FIG. 4 is similar to that described above with reference to FIG. 3A, with like numbers used to represent like elements except using the 200 series as opposed to the 100 series. As illustrated, however, the OLED display 200 also includes an additional surface feature 216 disposed in the gap S between electrodes 206, 208.

Surface feature 216 can be any structure that does not directly provide electrical current into the OLED films disposed over it, thereby comprising a non-active region of the pixel area between the active regions associated with the electrodes 206 and 208. For example, the surface feature 216 can further comprise an opaque material. As depicted in FIG. 4, a hole conducting layer 210 and organic light-emissive layer 212 can be deposited over a portion of such circuitry elements, as represented topographically by surface feature 216. In the case that surface feature 216 contains electrical elements, such elements may be further coated with an electrically insulating material so as to electrically isolate those elements from the OLED films deposited onto surface feature 216.

In an exemplary embodiment, surface feature 216 can include driving circuitry, including but not limited to, for example, an interconnect, bus lines, transistors, and other circuitry with which those having ordinary skill in the art are familiar. In some displays, driving circuitry is disposed proximal to the active region of the pixel driven by such circuitry to minimize complicated interconnections and to reduce the voltage drop. In some cases, the confinement well would surround an individual sub-pixel, and such circuitry can be outside the confinement well region such that the circuitry would not be coated with active OLED layers. However, in the exemplary embodiment of FIG. 4, as well as others described herein, because the confinement well 220 can contain a plurality of sub-pixels that are associated with differing pixels, such driving circuitry elements can be provided within the confinement wells, which may optimize the electrical performance of the drive electronics, optimize drive electronics layout, and/or optimize the fill factor.

The hole conducting layer 210 and organic light emissive layer 212 can be deposited (as previously discussed, for example, with reference to FIGS. 3A and 3B) into the region defined by confinement well structures 204 and over the surface feature 216 such that layers 210, 212 sufficiently conform to underlying surface feature topographies and have a substantially uniform thickness in the confinement well, leading to layers 210 and 212 having non-planar top surfaces. In the configuration wherein surface feature 216 extends above the plane of the top surface of the electrode a distance greater than the thickness of one or both of the layers 210 and 212, then one or both of those layers will also be discontinuous in a plane parallel to the plane of the display within the well 220. Thus, one or both layers 210, 212 will be non-planar and discontinuous in a plane parallel to the plane of the display due to the protrusion associated with the surface feature 216. As above, this is illustrated, for example, by the dashed line illustrating a plane P that is coplanar with the surface of 212 that is disposed over the electrodes 206, 208. As shown, the layer 212 is not planar across the entire confinement well and instead sufficiently conforms to the underlying topographies such that the layer 212 has an overall non-planar top surface due to the gap region S and protrusion 216. In other words, one or both of the layers 210, 212 will rise and fall across the confinement well to sufficiently conform to the existing topography of the well prior to the deposition of the layers 210, 212.

While the surface feature 216 is illustrated in FIG. 4 as having a thickness greater than the electrodes, the surface feature 216 can alternatively have a thickness less than or equal to the electrodes. Moreover, while surface feature 216 is illustrated in FIG. 4 as being disposed on substrate 202, surface feature 216 can be further disposed over one or both of electrodes 206, 208. Surface feature 216 can differ for each confinement well in the array and not all confinement wells have to include a surface feature. Surface feature 216 can further function as a pixel definition layer where the non-transparent properties of surface feature 216 can be used to define portions of sub-pixels or overall pixel arrangements.

Figure 5A:
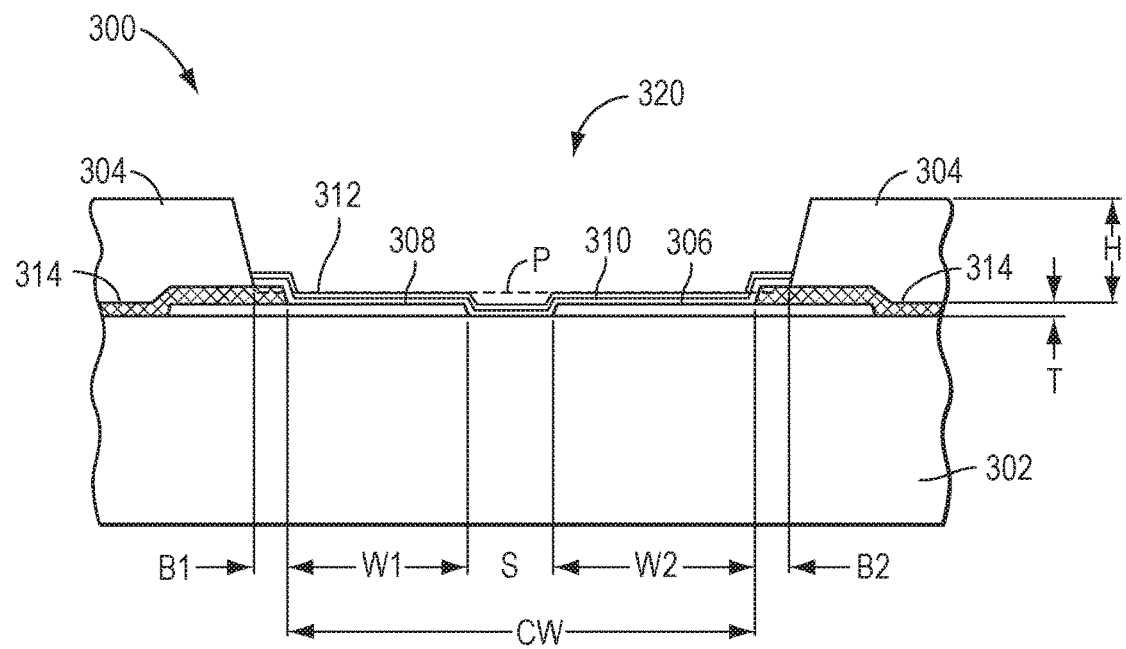
FIG. 5A is a cross-sectional view similar to the view of FIG. 3A of another exemplary embodiment of a confinement well in accordance with the present disclosure.
Figure 5B:
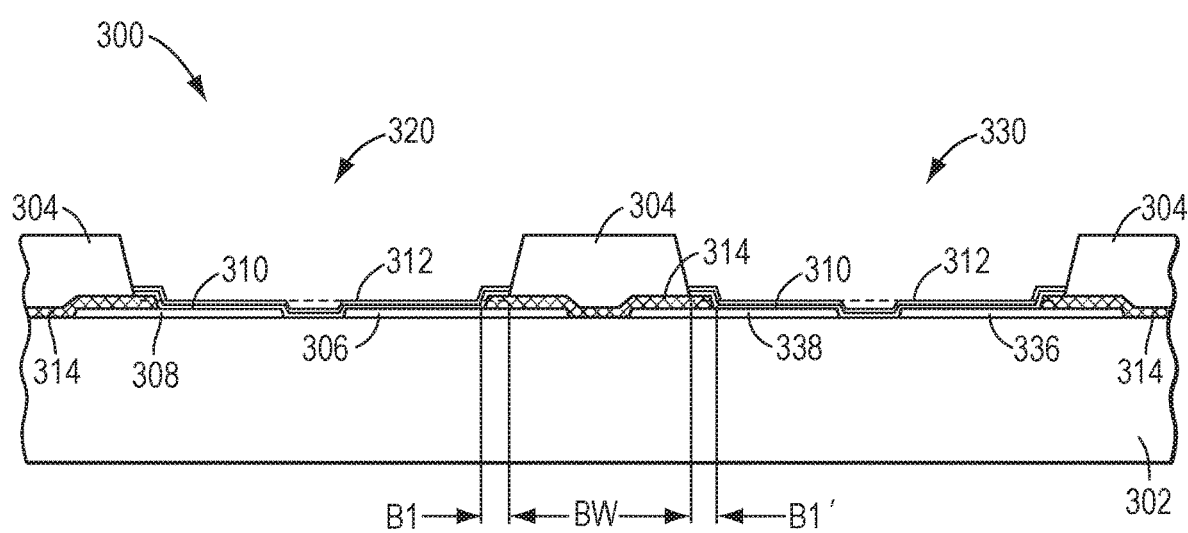
FIG. 5B is a cross-sectional view similar to the view of FIG. 3B of another embodiment of a confinement well in accordance with the present disclosure.

Referring now to FIGS. 5A and 5B, partial cross-sectional views of another exemplary embodiment of a display confinement well in accordance with the present disclosure is illustrated. The arrangement of FIGS. 5A and 5B is similar to that described above with reference to FIGS. 3A and 3B, with like numbers used to represent like elements except using the 300 series as opposed to the 100 series. As illustrated in FIGS. 5A and 5B, however, the OLED display 300 also includes a definition layer 314. Definition layer 314 can be deposited on substrate 302 where confinement structures 304 can be disposed over the definition layer 314. In addition, definition layer 314 can be disposed over a non-active portion of electrodes 306, 308. Definition layer 314 can be any physical structure having electrically insulating properties used to define portions of OLED display 300. In an embodiment, definition layer 314 can be a pixel definition layer that can be any physical structure used to delineate pixels within the pixel array. Definition layer 314 can also delineate sub-pixels.

As illustrated, in an exemplary embodiment, the definition layer 314 can extend beyond the confinement structures 304 to over a portion of electrodes 306, 308. Definition layer 314 can be made of an electrically resistant material such that the definition layer 314 prevents current flow and thus can reduce unwanted visual artifacts by substantially preventing light emission through the edges of the sub-pixel. Definition layer 314 can also be provided to have a structure and chemistry to mitigate or prevent the formation of non-uniformities where the OLED films coat over the edge of the definition layer. In this way, definition layer 314 can assist in masking film non-uniformities formed around surface features that would otherwise be included in the active regions of the pixel area and then contribute to pixel non-uniformity; such non-uniformities could occur, for example, at the exterior edges of each sub-pixel where the OLED films contact the confinement well, or at the interior edges of the each sub-pixel where the OLED films contact the substrate surface.

The hole conducting layer 310 and the organic light-emissive layer 312 can each be deposited within the region defined by the confinement structure 304 and over the pixel definition layers so as to form a continuous layer within the confinement well 320. As described above with respect to FIGS. 3A and 3B, the layers 310, 312 can sufficiently conform to the overall topography of the confinement well, and thus may have non-planar surfaces and/or be discontinuous in a plane of the display, as illustrated for example by plane P in FIG. 5A. As explained above with reference to exemplary embodiment of FIG. 3A, the thickness of the hole conducting layer 310 and the organic light-emissive layer 312 can be substantially uniform, as described above.

In an exemplary embodiment, as illustrated in FIG. 5A, each confinement well can include a plurality of active sub-pixel regions including W1 and W2 separated by gap S and contained within a confinement well having width CW, with W1, W2, and CW being primarily related to the pixel pitch, as discussed above with reference to FIG. 3A. Similarly, the dimension of the gap S is related to fabrication and processing techniques, and layout, wherein S may range in exemplary embodiments from 1 µm to greater than 10 µm, with, 3 µm being an exemplary dimension for S. The height H of confinement structures 304 may be as described above with reference to FIG. 3A. Referring to FIG. 5B, BW is, as described above, the width of the confinement structures 304 between adjacent wells and can be selected as described above with reference to FIG. 3B.

The dimension T associated with the thickness of the definition layer can be variable based on fabrication techniques and processing conditions, and the type of definition layer material that is used. In various exemplary embodiments, the dimension T associated with the thickness of the definition layer can range from 25 nm to 2.5 µm, but from 100 nm to 500 nm can be considered the most typical range. The dimensions labeled B1, B2 in FIG. 5A and B1, B1' in FIG. 5B, associated with the extension of the definition layer beyond the edge of the confinement structure 104 within the confinement wells, can be selected as desired. However, a larger dimension may contribute to a reduction in fill factor by reducing the amount of available active pixel electrode area. Therefore, it may be desirable to select the minimum dimension that will serve the desired function, which is generally to exclude edge non-uniformities from the active electrode area. In various exemplary embodiments, this dimension can range from 1 µm to 20 µm, and may, for example, range from 2 µm to 5 µm.

Figure 6:
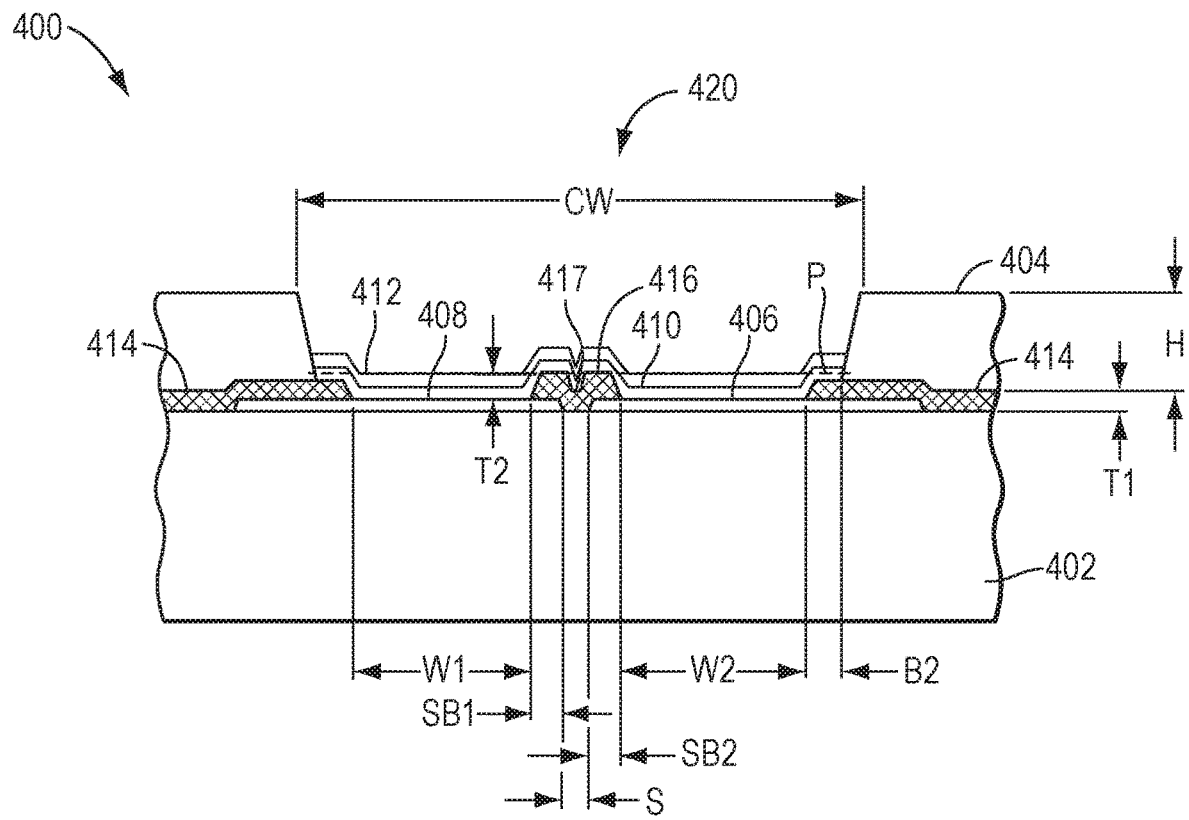
FIG. 6 is a cross-sectional view of yet another exemplary embodiment of a confinement well in accordance with the present disclosure.

With reference now to FIG. 6, a cross-sectional view of an exemplary embodiment of a confinement well 420 of a display 400 is illustrated. The arrangement of FIG. 6 is similar to that described above with reference to FIGS. 5A and 5B, with like numbers used to represent like elements except using the 400 series as opposed to the 300 series. As shown, however, the OLED display 400 also includes an additional definition layer 416 disposed in the gap S between electrodes 406, 408. As shown in FIG. 6, the definition layer 416 can be a surface feature that has a somewhat differing structure than the surface feature of FIG. 4 in that a portion of the additional definition layer 416 extends throughout the gap S on the substrate 402 and over portions of electrodes 406, 408 adjacent the gaps. The additional definition layer 416 can have any topography, with the one illustrated in FIG. 6 being exemplary only. As illustrated in FIG. 6, a notch 417 can be present in the surface of the additional definition layer 416 that faces away from the substrate 102. The notch 417 can be formed using various methods. For example, notch 417 may result from the manufacturing process such that during deposition of the additional definition layer 416, the layer 416 can generally conform to any topography present within the confinement well such as electrodes 406, 408 where notch 417 is formed by the differing thickness between a substantially uniform thickness over the electrodes 406, 408 and a substantially non-uniform thickness with surfaces not associated the top surface of electrodes 406, 407. Alternatively, notch 417 can be omitted and the top surface of additional definition layer 416 can have a substantially planar topography, for instance, in the case that the additional definition layer 416 is deposited using a non-conformal deposition method such that the underlying surface topography is smoothed out.

In either configuration, the hole conducting layer 410 and/or the organic light-emissive layer 412 can be deposited (as previously discussed, for example, with reference to FIGS. 3A and 3B) such that layers 410, 412 sufficiently conform to the topography of the additional definition layer 416 and have a substantially uniform thickness, as has been described above.

The distance between the top surface (i.e., the surface facing away from the substrate) of the additional definition layer 416 and the substrate 402 can be greater than or less than the distance between the top surface of the electrodes 406, 408 and the substrate 402. Alternatively, the distance between the top surface of the additional definition layer 416 and the substrate 402 can be substantially equal to the distance between the top surface of the electrodes 406, 408 and the substrate 402. In other words, the thickness of the additional definition layer 416 can be such that it ranges from being positioned between the top surface of the substrate and the top surfaces of the surrounding confinement structures 404, or such that it substantially lies in the same plane as the top surfaces of the confinement structures 404. Alternatively, the additional definition layer 416 can be substantially the same height as the electrodes 406, 408 such that the additional definition layer 416 does not overlap a portion of the electrodes 406, 408, but rather fills in the gap S between them.

Hole conducting layer 410 and organic light-emissive layer 412 can be disposed over the portions of definition layer 414 that extend beyond the confinement structure 404 and into the well 420, and the layers 410, 412 can extend over the additional definition layer 416 within the confinement well 420 defined by confinement structure 404. The additional definition layer 416 can be made of an electrically resistant material such that the additional definition layer 416 can prevent current flow and thus may reduce undesirable visual artifacts by preventing light emission through the edges of the sub-pixel. The definition layer 414 and the additional definition layer 416 can be made of the same or differing materials.

In an exemplary embodiment, as illustrated in FIG. 6, each confinement well can include a plurality of active sub-pixel regions including W1 and W2 separated by gap S and contained within a confinement well having width CW, with W1, W2, CW, and S being primarily related to the pixel pitch, as discussed above. As above, 3 µm may be a minimum dimension for S, but one of ordinary skill in the art would appreciate that dimensions from as small as 1 µm to even greater than 10 µm are possible. The height H of confinement structures 404 can be chosen and with the ranges as described above with reference to FIGS. 3A and 3B, for example.

The dimension T1 associated with the thickness of the definition layer and the dimension T2 associated with the thickness of the additional definition layer can be variable based on fabrication techniques, processing conditions and the type of definition layer material that is used. As a result, the dimension T1 associated with the thickness of the definition layer and the dimension T2 associated with the thickness of the additional definition layer can range from 50 nm to 2.5 µm, for example, from 100 nm to 500 nm. The dimensions SB1, SB2, and B2 associated with the extension of the definition layer inside the edge of the confinement well can be selected as desired. However, a larger dimension will contribute to a reduction in fill factor by reducing the amount of available active pixel electrode area. Therefore, it may be desirable to select the minimum dimension that will serve the desired function, which is generally to exclude edge non-uniformities from the active electrode area. In various exemplary embodiments, this dimension can range from 1 µm to 20 µm, and may for example range from 2 µm to 5 µm.

As those having ordinary skill in the art would appreciate based on the present disclosure, any of the disclosed definition layer configurations can be used in any combination of differing ways to achieve a desirable pixel definition configuration. For example, definition layer 414 and/or additional definition layer 416 can be configured to define any pixel and/or a sub-pixel region or any partial pixel and/or sub-pixel region where definition layer 414 can be associated a definition layer deposited under any confinement structures 404 and additional definition layer 416 can be associated with any definition layer deposited within a confinement well between electrodes such as in confinement well 420. An artisan of ordinary skill would recognize that the cross-sections shown within the present disclosure are merely illustrative cross-sections and therefore the present disclosure is not to be limited to the specific cross-sections illustrated. For instance, while FIGS. 3A and 3B are illustrated along line 3A-3A and 3B-3B respectively, a different cross-sectional view, taken along a different line, for example including in directions orthogonal to 3A-3A and 3B-3B, may reflect differing definition layer configurations. In an exemplary embodiment, definition layers can be used in combination to outline a pixel, such as pixels 150, 151, 152 illustrated in FIG. 2. Alternatively, definition layers can be configured to define a sub-pixel such that the definition layers completely or partially surround a sub-pixel electrode within a confinement well.

Figure 7:
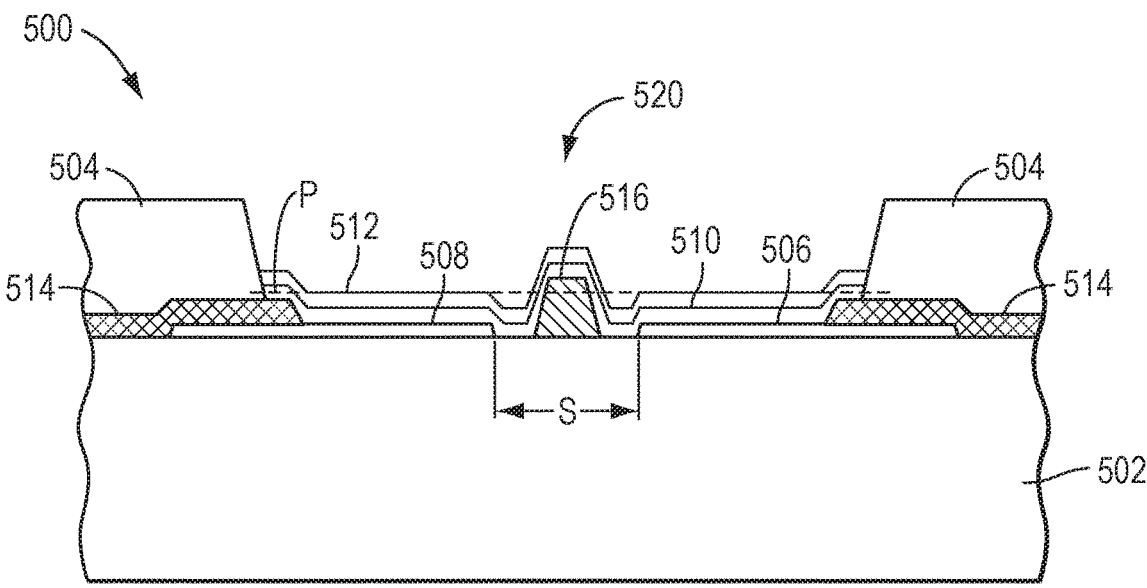
FIG. 7 is a cross-sectional view of yet another exemplary embodiment of a confinement well in accordance with the present disclosure.

Referring now to FIG. 7, a cross-sectional view of yet another exemplary embodiment is illustrated. OLED display 500 can include surface feature 516 and a definition layer 514. The arrangement of FIG. 7 is similar to that described above with reference to FIG. 4, with like numbers used to represent like elements except using the 500 series as opposed to the 200 series. As illustrated in FIG. 7, however, OLED display 500 further includes a definition layer 514 disposed under confinement structures 504. The definition layer 514 can be any physical structure used to define portions of OLED display 500. In an embodiment, definition layer 514 can be a definition layer that can be any physical structure used to delineate pixels within the pixel array and/or sub-pixels with a pixel. As illustrated, in an exemplary embodiment, the definition layer 514 can extend beyond the confinement structure 504 and over a portion of electrodes 506, 508. Definition layer 514 can be made of an electrically resistant material such that the definition layer 514 prevents current flow and thus can reduce unwanted visual artifacts by preventing light emission through the edges of the sub-pixel. In this way, definition layer 514 can assist in masking film layer non-uniformities formed at the edge of each sub-pixel that may occur due to edge drying effects. The hole conducting layer 510 and the organic light-emissive layer 512 can be deposited (as previously discussed, for example, with reference to FIGS. 3A and 3B) such that layers 510, 512 sufficiently conform to underlying surface feature topographies and have a substantially uniform thickness, as has been described above.

Those having ordinary skill in the art would appreciate that the various arrangements and structures, e.g. surface features, definition layers, etc., are exemplary only and that various other combinations and arrangements may be envisioned and fall within the scope of the present disclosure.

Figure 8:
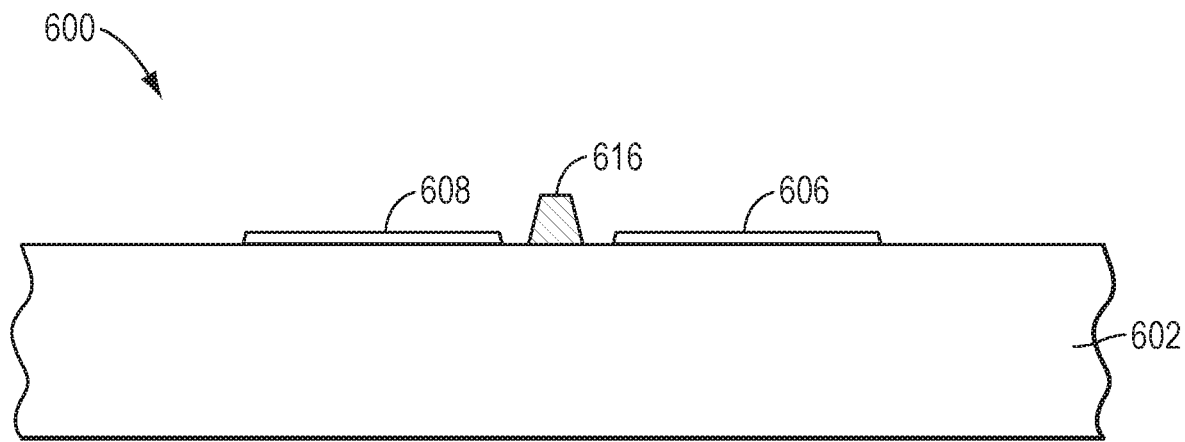
FIGS. 8-11 are cross-sectional views of another exemplary embodiment of a confinement well and exemplary steps for creating an OLED display in accordance with the present disclosure.

Referring now to FIGS. 8-11, partial cross-sectional views of the substrate exhibiting various exemplary steps during an exemplary method of manufacturing an OLED display 600 are illustrated. While the method of manufacturing will be discussed below with reference to display 600, any and/or all of the steps described can be used in manufacturing other OLED displays, for example OLED displays 100, 200, 300, 400, and 500 described above. As illustrated in FIG. 8, electrodes 606, 608 and surface features 616 can be provided over substrate 602. The electrodes 606, 608 and surface features 616 can be formed using any manufacturing method such as inkjet printing, nozzle printing, slit coating, spin coating, vacuum thermal evaporation, sputtering (or other physical vapor deposition method), chemical vapor deposition, etc., and any additional patterning not otherwise included in the deposition technique can be achieved by using shadow masking, photolithography (photoresist coating, exposure, development, and stripping), wet etching, dry etching, lift-off, etc. The electrodes 606, 608 can be formed simultaneously with surface features 616 or sequentially with either the electrodes or the surface features being formed first.

Figure 9:
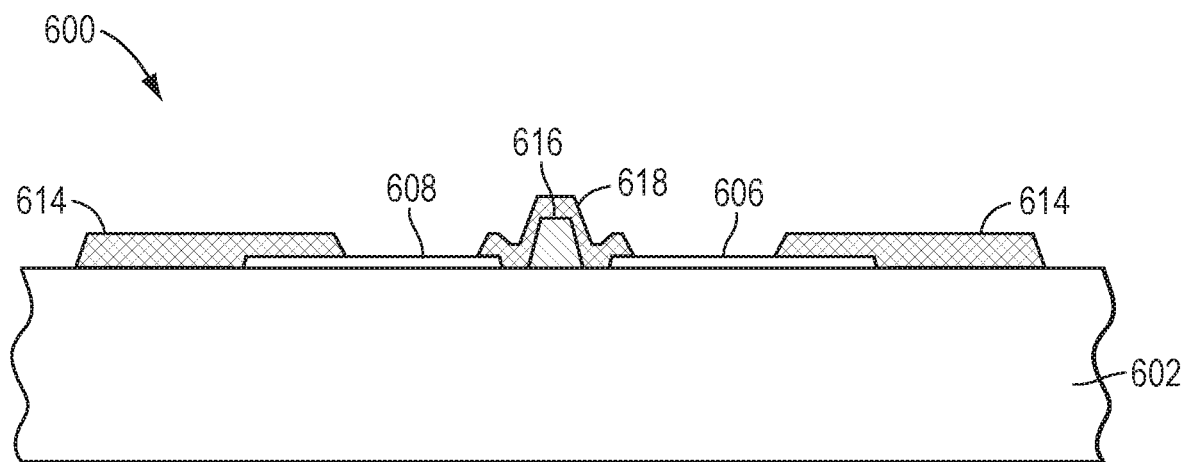

Definition layer 614 and additional definition layer 618 can then be deposited over the surface features 616 and electrodes 606, 608, as illustrated in FIG. 9. Layers 614 and 618 can be formed using any manufacturing method, such as inkjet printing, nozzle printing, slit coating, spin coating, vacuum thermal evaporation, sputtering (or other physical vapor deposition method), chemical vapor deposition, etc., and any needed additional patterning not otherwise included in the deposition technique can be achieved by using shadow masking, photolithography (photoresist coating, exposure, development, and stripping), wet etching, dry etching, lift-off, etc. Definition layer 614 can be formed simultaneously with additional definition layer 618 or the layers 614, 618 can be formed sequentially with either layer 614 or 618 being formed first.

Figure 10:
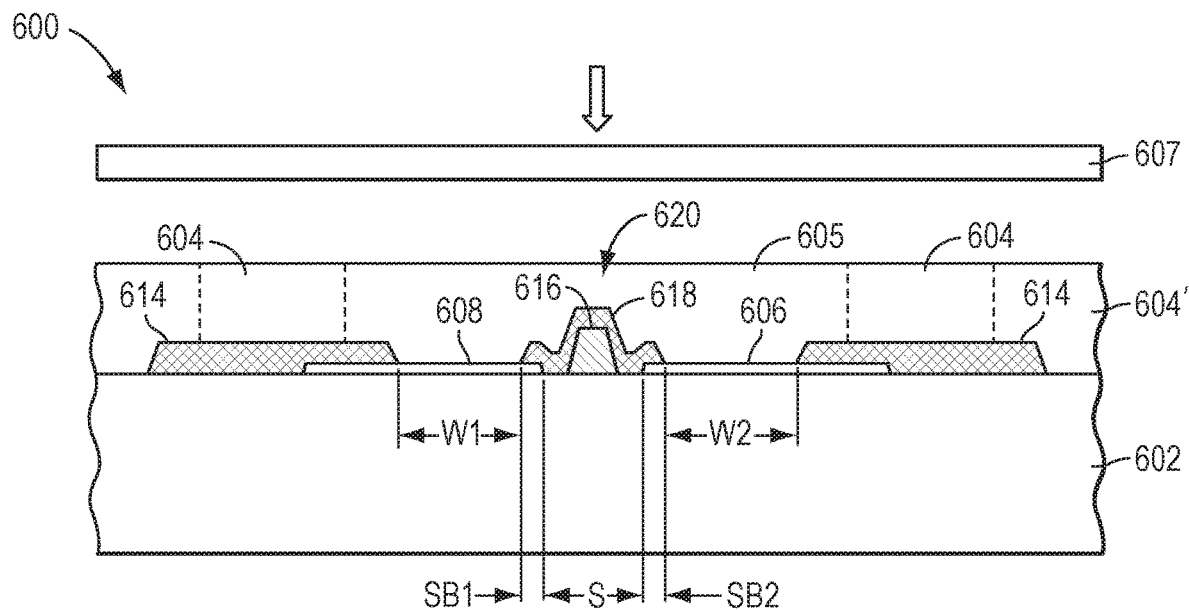

Confinement structures 604 are provided over definition layers 614. The confinement structures 604 can be formed to define confinement wells 620 that surround a plurality of sub-pixel electrodes 606, 608 while spanning a plurality of pixels. The confinement structures 604 can be formed using any manufacturing method, such as inkjet printing, nozzle printing, slit coating, spin coating, vacuum thermal evaporation, sputtering (or other physical vapor deposition method), chemical vapor deposition, etc., and any additional patterning not otherwise included in the deposition technique can be achieved by using shadow masking, photolithography (photoresist coating, exposure, development, and stripping), wet etching, dry etching, lift-off, etc. In one exemplary technique, as illustrated in FIG. 10, confinement structure material can be deposited over substrate 602 in a continuous layer 604' and the layer can then be patterned using a mask 607 such that a portion 605 of layer 604' can be removed to expose the sub-pixel electrodes 606, 608. The confinement structures 604 are formed by the material of layer 604' remaining after portions 605 are removed. Alternatively, confinement structures 604 can be formed by actively depositing material to form only the confinement structure such that the deposited confinement structure 604 can define boundaries and the confinement wells are formed within the boundaries of the deposited confinement structures 604.

In an exemplary embodiment, as illustrated in FIG. 10, each confinement well can include a plurality of active sub-pixel regions including W1 and W2 separated by gap S. As above, the dimensions, W1, W2, and CW are primarily related to the pixel pitch. And the dimension of the gap S is related to restrictions associated with fabrication techniques and processing, and layout, and may range from 1 μm to even greater than 10 μm, with 3 μm being an exemplary minimum dimension. The dimensions SB1 and SB2 associated with the extension of the definition layer inside the edge of the confinement well can be selected as desired. However, a larger dimension will contribute to a reduction in fill factor by reducing the amount of available active pixel electrode area. Therefore, it may be desirable to select the minimum dimension that will serve the desired function, which is generally to exclude edge non-uniformities from the active electrode area. In various exemplary embodiments, this dimension can range from 1 μm to 20 μm, and may for example range from 2 μm to 5 μm.

Figure 11:
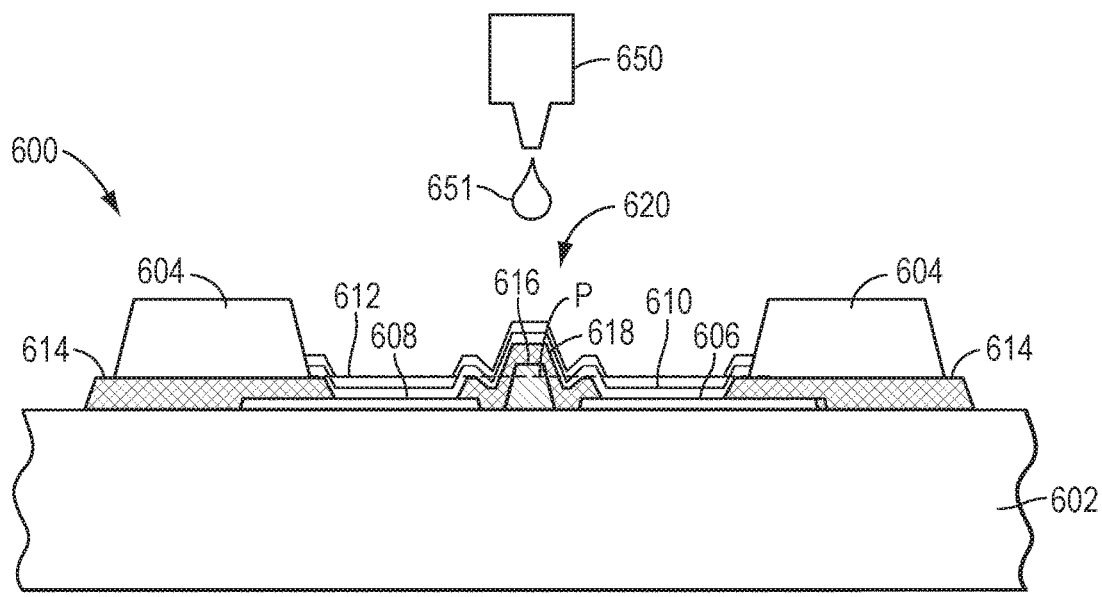

As illustrated in FIG. 11, a hole conducting layer 610 can then be deposited using inkjet printing within the confinement well 620. For example, inkjet nozzle 650 can direct droplet(s) 651 of hole conducting material within a target area defined within the confinement well 620. The hole conducting layer 610 may further comprise two discrete layers, for example, a hole injection layer and a hole transporting layer, and these layers can be sequentially deposited by an inkjet method as described herein. In addition, organic light-emissive layer 612 can be deposited using inkjet printing within the confinement well 620 over the hole conducting layer 610. Inkjet nozzle 650 can direct droplet(s) 651 of organic light-emissive material within a target area over the hole conducting layer 610. One of ordinary skill in the art would appreciate that while a single nozzle is discussed with reference to FIG. 11, multiple nozzles can be implemented to provide droplets containing hole conducting material or organic light-emissive material within a plurality of confinement wells. As those of ordinary skill in the art are familiar with, in some embodiments, the same or differing colors of organic light-emissive material can be deposited from multiple inkjet nozzle heads simultaneously. In addition, droplet ejection and placement on the target substrate surface can be performed using technology known to those of ordinary skill in the art.

In an exemplary embodiment, a single organic light-emissive layer 612 can be deposited within confinement well 620 such as a red, green, or blue layer. In an alternative exemplary embodiment, a plurality of organic light emissive layers can be deposited within confinement well 620, one over the other. Such an arrangement can work, for example, when the light emissive layers have differing light emissive wavelengths ranges such that when one light emissive layer is activated to emit light, the other light emissive layer does not emit light or interfere with the light emission of the first organic light-emissive layer. For example, a red organic light-emissive layer or a green organic light-emissive layer can be deposited within confinement well 620 and then a blue organic light-emissive layer can be deposited over the red or green organic light-emissive layer. In this way, while a confinement well can include two different light-emissive layers, only one light emissive-layer is configured to emit light within the confinement well.

Layers 610 and 612 can be deposited so as to sufficiently conform to the topography of definition layer 614, surface structure 616, additional definition layer 618, and electrodes 606, 608, as has been described above, and can have a substantially uniform thickness as described above.

The various aspects described above with reference to FIGS. 3A-11 can be used for a variety of pixel and sub-pixel layouts in accordance with the present disclosure, with FIG. 2 being one exemplary and nonlimiting such layout. Various additional exemplary layouts contemplated by the present disclosure are depicted in FIGS. 12-18. The various exemplary layouts illustrate that there are many ways to implement the exemplary embodiments described herein; in many cases, the selection of any particular layout is driven by various factors, such as, for example, the underlying layout of the electrical circuitry, a desired pixel shape (which are depicted as rectangular and hexagonal shape in the illustrated embodiments, but can be other shapes as well, such as chevrons, circles, hexagons, triangles, and the like), and factors related to visual appearance of the display (such as visual artifacts that can be observed for differing configurations and for differing types of display content, such as text, graphics, or moving video). Those having ordinary skill in the art would appreciate that a number of other layouts fall within the scope of the present disclosure and can be obtained through modification and based on the principles described herein. Further, those having ordinary skill in the art would understand that although for simplicity only the confinement structures that define the confinement wells are described below in the descriptions of FIGS. 12-18, any of the features, including surface features, circuitry, pixel definition layers, and other layers, described above with reference to FIGS. 3A-11 can be used in combination with any of the pixel layouts herein.

Figure 12:
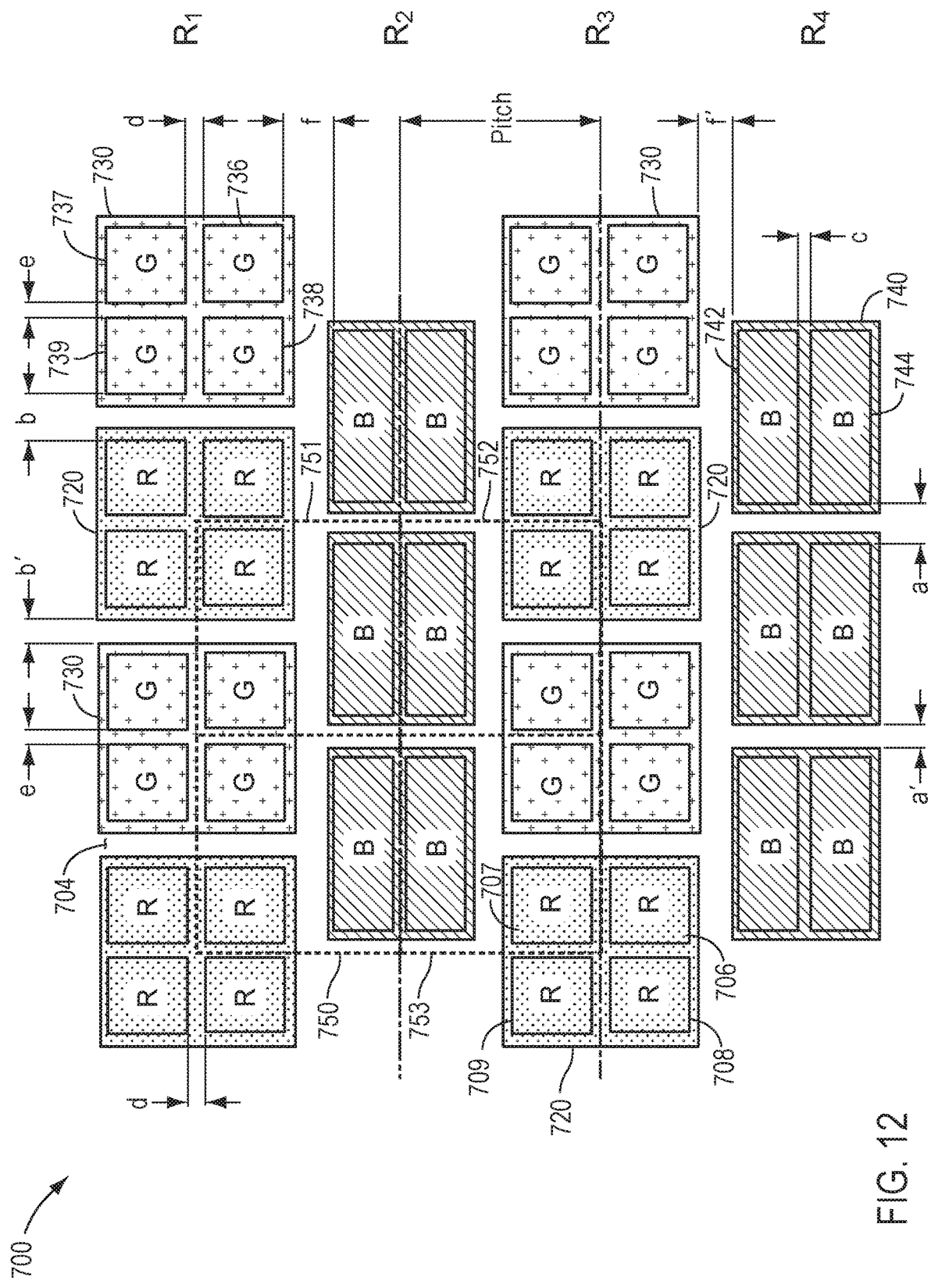
FIGS. 12-19 are partial plan views of various exemplary pixel arrangements in accordance with the present disclosure.

FIG. 12 depicts a partial plan view of an exemplary embodiment of pixel and sub-pixel layout for an OLED display 700, and is similar to the layout of FIG. 2 with further aspects of the layout being described below. A confinement structure 704, for example, a bank structure, as discussed above can be provided on a substrate to define a plurality of confinement wells 720, 730, 740 in an arrayed configuration. Each confinement well 720, 730, 740 can include a substantially continuous layer of OLED material (indicated by the shaded regions) such that the organic layer extends through the confinement well 720, 730, 740 to the confinement structure 704 surrounding the confinement well, for example, edges of the layer of OLED material in each well 720, 730, 740 may contact the confinement structure 704. OLED layers can include, for example, one or more of hole injecting materials, hole transporting materials, electron transporting materials, electron injecting materials, hole blocking materials, and organic light emissive materials providing for emission of differing light-emissive wavelength ranges. For example, confinement well 720 can include an organic light-emissive layer associated with light emission within the red wavelength range and is indicated by R, confinement well 730 can include an organic light-emissive layer associated with light emission within the green wavelength range indicated by G, and confinement well 740 can include an organic light-emissive layer associated with light emission within the blue wavelength range indicated by B. The wells 720, 730, 740 can have a variety of arrangements and configurations, including with respect to each other (e.g., layouts). For example, as illustrated in FIG. 12, confinement wells 720 and confinement wells 730 that respectively contain red organic light-emissive layer R and green organic light-emissive layer G are disposed in rows $R_1$, $R_3$ in an alternating arrangement. Alternating with the rows $R_1$ and $R_3$ are rows $R_2$, $R_4$ of the confinement wells 740 that contain blue organic-light emissive layer B. Confinement wells 720, 730 also can be alternatively arranged within the rows $R_1$, $R_3$.

A plurality of electrodes 706, 707, 708, 709; 736, 737, 738, 739; and 742, 744 can be disposed in each confinement well 720, 730, 740, respectively, wherein each electrode can be associated with a sub-pixel associated with a particular light emission color such as red, green, or blue light emission. A pixel 750, 751, 752, 753, identified in FIG. 12 by dashed lines, can be defined to include one sub-pixel having red light emission, one sub-pixel having green light emission, and one sub-pixel having blue light emission. For example, each confinement well 720, 730, 740 can respectively include a plurality of electrodes 706, 707, 708, 709; 736, 737, 738, 739; and 742, 744 configured such that their associated electrode active regions correspond to the electrode outlines shown in FIG. 12, are spaced apart from each other. Confinement wells 720, 730, 740 can have a differing number and/or arrangement of electrodes within the confinement well. Alternatively, additional arrangements are possible, such as arrangements with other sets of colors than red, green, and blue, including combinations of colors involving more than three sub-pixel colors. Other arrangements are also possible in which more than one sub-pixel of a single color is associated with a particular pixel, for example, each pixel can have associated with it one red, one green, and two blue sub-pixels, or other combinations of numbers of sub-pixels of a particular color and other combinations of colors. Moreover, if multiple layers of differing light-emissive material are positioned over each other, it is contemplated that differing color sub-pixels may overlap each other. As illustrated in FIG. 12, sub-pixel electrodes can be spaced apart from structures that define the confinement wells. In an alternative embodiment, the sub-pixel electrodes can be deposited such that they are directly adjacent to the confinement well structures such that no gap occurs between the electrode and the confinement structure. In addition, the confinement well structures can be disposed over a portion of the sub-pixel electrodes.

In addition, adjacent confinement wells can have differing sub-pixel arrangements. For example, as illustrated in FIG. 12, confinement wells 720 and 730 include a 2×2 active electrode region arrangement, and confinement well 740 includes a 1×2 active electrode region arrangement, with the active electrode regions in the 2×2 arrangements being squares of the same size and the active electrode regions in the 1×2 arrangement being rectangles of the same size. As noted above, electrodes within differing confinement wells can have differing surface areas of active regions.

In one exemplary arrangement, the active regions associated with the electrodes used to address sub-pixels of light-emission within the blue wavelength range B can have a greater surface area than the active regions associated with the electrodes used to address light-emission within the red and/or green wavelength range R, G. It may be desirable for the active regions of the electrodes associated with the sub-pixels having light-emission in the blue wavelength range B to have a greater surface area than the active regions associated with a sub-pixel electrode associated with a red or green light emission because sub-pixels associated with blue light emission often have substantially shorter lifetimes than sub-pixels associated with having red or green light emission when operating at the same area brightness levels. Increasing the relative active area of the sub-pixels associated with blue light emission enables operation at relatively lower area brightness levels while still maintaining the same overall display brightness, thereby increasing the lifetime of the sub-pixels associated with blue light emission and the overall lifetime of the display. It is noted that sub-pixels associated with red and green light emission may be correspondingly reduced in relation to the sub-pixel associated with blue light emission. This can lead to the sub-pixels associated with red and green light-emission to be driven at a higher brightness level in relation to a sub-pixel associated with blue light-emission which can reduce the red and green OLED device lifetime. However, the lifetimes of the sub-pixels associated with red and green light emission can be significantly longer than the lifetime associated with the sub-pixel associated with the blue sub-pixel that the sub-pixel associated with the blue light emission remains the limiting sub-pixel with respect to the overall display lifetime. While the active regions of the electrodes within confinement well 740 are illustrated as being arranged with their elongate direction extending horizontally in FIG. 12, the electrodes could alternatively be arranged such that their elongate direction extends vertically in FIG. 12.

Intervals between adjacent confinement wells can be equal throughout the pixel layout or can vary. For example, with reference to FIG. 12, an interval b' between confinement wells 720, 730 can be greater than or equal to the interval f' between confinement wells 720 or 730 and 740. In other words, the horizontal interval between adjacent confinement wells in a row may differ from the vertical interval between adjacent confinement wells in adjacent rows, in the orientation of FIG. 12. Moreover, the horizontal interval b' in rows $R_1$, $R_3$ may be equal to or differ from the horizontal interval a' in $R_2$, $R_4$.

Spacing (gaps) between the active regions of the electrodes within each of the differing confinement wells 720, 730, 740 also can be the same or differ and may vary depending on the direction of spacing (e.g., horizontal or vertical). In one exemplary embodiment, the gaps d and e between the active regions of the electrodes within the confinement wells 720, 730 can be the same and can differ from the gap between active regions of the electrodes within the confinement well 740. Further, in various exemplary embodiments, the gaps between adjacent active electrode regions within a confinement well are less than the gaps between adjacent active electrode regions in neighboring confinement wells, either in the same or differing rows. For example, c, d, and e may each be less than either a, b, or f in FIG. 12.

In FIG. 12 there is shown a gap between the interior edges of each confinement well, e.g. 720, and the exterior edges of each of the active electrode regions associated within that confinement well, e.g. 706, 707, 708, 709. However, as illustrated in FIG. 2, according to various exemplary embodiments, such a gap may not be present and the exterior edge of each of active electrode regions may be the same as the interior edge of the confinement well. This configuration can be achieved, for example, using a structure like the one illustrated in FIG. 3A, where the configuration show in FIG. 12, in which such a gap is present, can be achieved, for example, using a structure like the one illustrated in FIG. 5A. However, other structures may also be able to achieve the same configurations illustrated in FIGS. 2 and 12.

Pixels 750, 751, 752, 753 can be defined based on the confinement well arrangement and corresponding sub-pixel layout. The overall spacing, or pitch, of pixels 750, 751, 752, 753 can be based on the resolution of the display. For example, the higher the display resolution, the smaller the pitch. In addition, adjacent pixels can have differing sub-pixel arrangements. For example, as illustrated in FIG. 12, pixel 750 includes a red sub-pixel R in the top left portion, a green sub-pixel G in the top right portion, and a blue sub-pixel B in spanning the majority of the bottom portion of the pixel. The sub-pixel layout of pixel 751 is similar to that of pixel 750 except the relative positions of the green sub-pixel G and the red sub-pixel R being switched, with the green sub-pixel G in the top left portion, a red sub-pixel R in the top right portion. Pixels 752 and 753, which are adjacent and underneath pixels 751, 750 respectively, are mirror images of pixels 751 and 750, respectively. Thus, pixel 752 includes a blue sub-pixel B in the top portion, a green sub-pixel G in the bottom left portion, and a red sub-pixel R in the bottom right portion. And pixel 753 includes a blue sub-pixel in the top portion, a green sub-pixel in the bottom left portion, and a red sub-pixel in the bottom right portion.

In an exemplary embodiment for a high resolution display according to FIG. 12 and having 326 pixels per inch (ppi), a pixel including a red sub-pixel, a green sub-pixel, and a blue sub-pixel can have overall dimensions of approximately 78 μm×78 μm, corresponding to the overall pitch of the display needed to achieve 326 ppi. Assuming for this embodiment that a'=b'=f'=12 μm, reflecting, as previously discussed, the state of the art minimum spacing between confinement regions, further assuming that a=b=f=12 μm+6μm=18 μm, reflecting a case in which a definition layer is utilized that extends 3 μm inside the confinement well edge, and finally assuming c=d=e=3 μm as a typical gap between electrode active regions within a confinement well, the areas associated with each of the red and green sub-pixels can be 28.5 μm×28.5 μm and the area associated with the blue sub-pixels can be 60 μm×27 μm. The surface area of the blue sub-pixels can be greater than each of the red and green sub-pixels to increase overall display lifetime as described above. Such a layout can have confinement wells associated with groupings of 2×2 red and green sub-pixels having dimensions of 66 μm×66 μm, and confinement wells associated with groupings of 1×2 blue sub-pixels having dimensions of 66 μm×66 μm. Such dimensions provide for straightforward loading of active OLED material with conventional inkjet print heads and printing systems while also providing for a high resolution display with high fill factor of greater than 50%, such as 53%. Such dimensions also provide for such features in a structure having a definition layer that can provide for enhanced film uniformity within the active electrode region by blocking current flow through the film region immediately adjacent to the confinement well wall.

In a corresponding exemplary embodiment for a high resolution display having 440 pixels per inch (ppi) a pixel including a red sub-pixel, a green sub-pixel, and a blue sub-pixel can have an overall dimension of approximately 58 μm×58 μm where assuming the same value for the dimensions a, b, c, d, e, f, a', b', and f' as in the immediately previous example, the area associated with each of the red and green sub-pixels can be 18.5 μm×18.5 μm and the area associated with the blue sub-pixels can be 40 μm×17 μm. The surface area of the blue sub-pixels can be greater than each of the red and green sub-pixels to increase overall display lifetime as described above. Such a layout can have confinement wells associated with groupings of 2×2 red and green sub-pixels having dimensions of 46 μm×46 μm, and confinement wells associated with groupings of 1×2 blue sub-pixels having dimensions of 46 μm×46 μm. Such dimensions provide for relatively straightforward loading of active OLED material with conventional inkjet print heads and printing systems while also providing for a high resolution display with high fill factor of 40%.

In each of the above exemplary embodiments, various values for the dimensions a, b, c, d, e, f, a', b', f' can be implemented. However, one of ordinary skill in the art would recognize that these dimensions vary. For example, the spacing between confinement walls (a', b', f') can be varied, as previously discussed from as little as 1 µm to as large as hundreds of microns for large ppi. The gap between active electrode regions within a confinement well (c, d, e) can vary, as discussed above, from as little as 1 µm to as large as tens of microns. The gap between the active electrode regions and the edge of the confinement walls (effectively half the difference between a' and a, b' and b' and f' and f, respectively) can also vary, as discussed above, from as little as 1 µm to as large as 10 µm. Furthermore, as these dimensions are varied, they apply constraints, along with the ppi (that determines the overall pitch of the display), that limit the range of values allowed for the confinement well dimensions and the active electrode regions contained therein. In the above exemplary embodiments, for simplicity, square confinement wells of the same dimension are used for all three colors. However, the confinement wells need not be square, and need not all be the same size. In addition, the dimensions provided for in FIG. 12 indicate various common dimensions, for example, the gap between active electrode regions within the red confinement wells and the green confinement wells, but in some exemplary embodiments, those gaps are not common dimensions but differ from each other.

Figure 13:
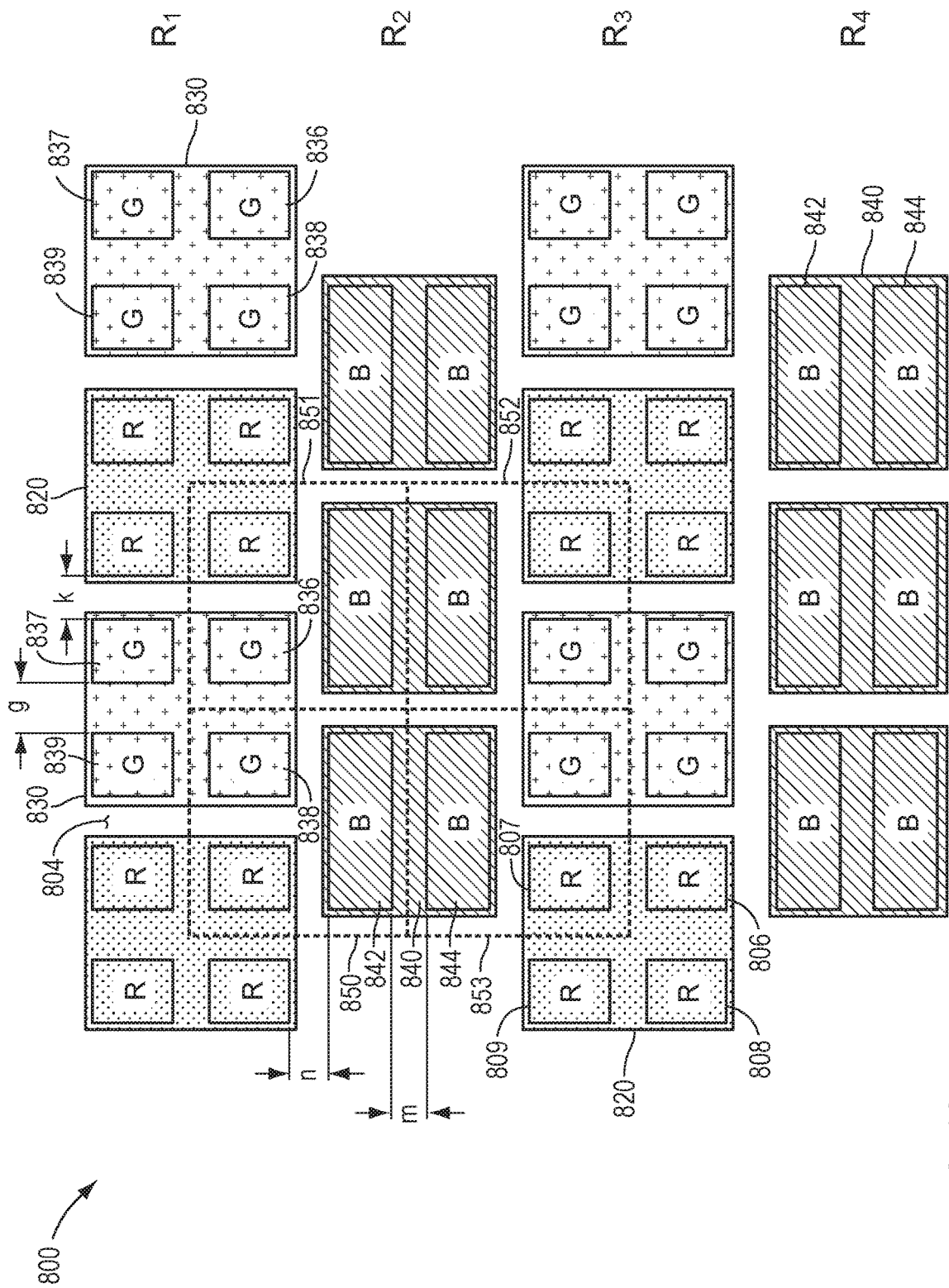

FIG. 13 depicts a partial plan view of another exemplary pixel/sub-pixel layout of an OLED display 800. Features common to previously discussed exemplary embodiments are not described. For simplicity, differences will be discussed.

Display 800 can have a greater separation between the active regions associated with sub-pixel electrodes within a confinement well than for example, sub-pixel electrodes of display 700 as illustrated in FIG. 12. Spacing between adjacent active regions associated with electrodes 806, 807, 808, 809; 836, 837, 838, 839; and 842, 844 within respective confinement wells 820, 830, 840 can be greater than an interval between adjacent active electrode regions in adjacent confinement wells. For example, the active regions associated with electrode 836 can be spaced apart from one another a predetermined distance g, and similarly for the active regions associated with electrode 838. The interval k between adjacent active electrode regions in neighboring confinement wells 820, 830 can be less than the interval g between the active regions associated with electrodes 836, 838, and the interval m between the active regions associated with electrode 842 (and similarly for electrode 844) can be greater than the interval n between the adjacent active electrode regions in neighboring confinement well 840 and confinement wells 820, 830. Such spacing can provide for greater spacing between sub-pixel electrodes disposed within a confinement well and associated with the same light emission color while providing for a closer arrangement of sub-pixel electrodes associated with a single defined pixel. This spacing can reduce undesirable visual artifacts such that the display appears to be an array of closely arranged RGB triplets and not an array of closely arranged RRRR quadruplets, GGGG quadruplets, and BB pairs.

Figure 14:
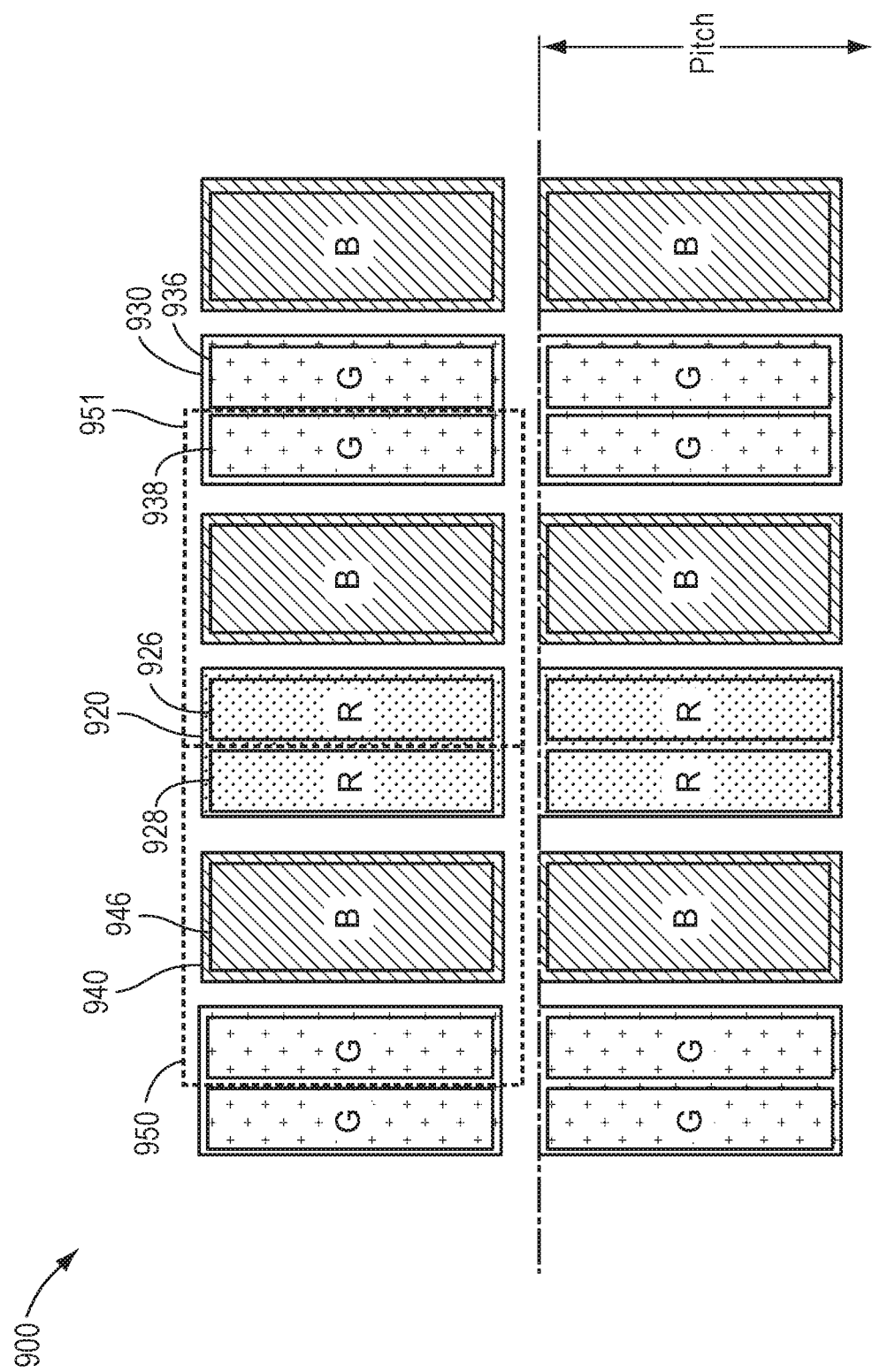

Another exemplary pixel/sub-pixel layout for a display in accordance with the present disclosure is depicted in FIG. 14. A confinement structure 904 can be provided on a substrate to define a plurality of confinement wells 920, 930, 940 in an arrayed configuration. Each confinement well 920, 930, 940 can include a substantially continuous layer of OLED material (indicated by the shaded regions) such that edges of the organic layer extends throughout the confinement well 920, 930, 940 to the confinement structure 904 surrounding the confinement well, for example, edges of the layer of OLED material in each well 920, 930, 940 may contact the confinement structure 904. Active OLED layers can include, for example, without limitation, one or more of hole injecting materials, hole transporting materials, electron transporting materials, electron injecting materials, hole blocking materials, and organic light emissive materials providing for emission of differing light-emissive wavelength ranges. For example, confinement well 920 can include an organic light-emissive layer associated with light-emission within the red wavelength ranges range R, confinement well 930 can include an organic light-emissive layer associated with light-emission within the green wavelength range G, and confinement well 940 can include an organic light-emissive layer associated with light-emission within the blue wavelength range B. The organic light-emissive layers can be disposed within the wells in any arrangement and/or configuration. For example, the organic light-emissive layers disposed in confinement wells 920, 930, 940 are arranged having an alternating arrangement within each row. Adjacent rows can have the same arrangement or differing arrangement. In addition, while the adjacent rows of confinement wells 920, 930, 940 are illustrated as having a uniform alignment, adjacent rows of confinement wells 920, 930, 940 can alternatively have a non-uniform alignment such as an offset arrangement. Moreover, confinement wells 920 and 930 can be reversed in the alternative pattern.

The configuration of each well 920, 930, 940 can have a rectangular shape such that each well is elongated in a vertical direction. Wells 920, 930, 940 can have approximately the same dimensions in the elongated vertical direction. In addition, wells 920, 930, 940 can have approximately the same width. However, the entire well 940 associated with a blue organic light-emissive layer can correlate to a single sub-pixel and thus pixel, while wells 920, 930 associated with the red and green organic light-emissive layer can correlate to a plurality of sub-pixels and thus a plurality of pixels. For example, confinement wells 920, 930 can include a plurality of electrodes such that each electrode is associated with a differing sub-pixel of a differing pixel. As illustrated in FIG. 14, well 920 includes two electrodes 926, 928 and is associated with two differing pixels 950, 951.

A differing number of electrodes 926, 928, 936, 938, 946 can be disposed within differing confinement wells. For example, some confinement wells 920, 930 can include a plurality of electrodes 926, 928; and 936, 938 so as to selectively address electrodes disposed in the same confinement well but produce light emission for differing sub-pixels in differing pixels, while other confinement wells 940 only include one electrode 946 to address an electrode disposed in one confinement well associated with one pixel. Alternatively, the number of electrodes disposed in confinement well 940 can be half of the number of electrodes disposed in other confinement wells 920, 930. In addition, electrodes within differing confinement wells can have differing surface areas. For example, electrodes associated with light-emission within the blue wavelength range can have a greater surface area than electrodes associated with light-emission within the red and/or green wavelength range to improve the life of display 900 and reduce power consumption.

Pixels 950, 951 can be defined based on the confinement well arrangement and corresponding sub-pixel layout. The overall spacing, or pitch, of pixels 950, 951 can be based on the resolution of the display. For example, the higher the display resolution, the smaller the pitch. In addition, adjacent pixels can have differing pixel arrangements. For example, as illustrated in FIG. 14, pixel 950 can include a green sub-pixel G on the left, a blue sub-pixel B in the middle, and a red sub-pixel R on the right. Pixel 951 can include a red sub-pixel R on the left, a blue sub-pixel B in the middle and a green sub-pixel G on the right.

Figure 15:
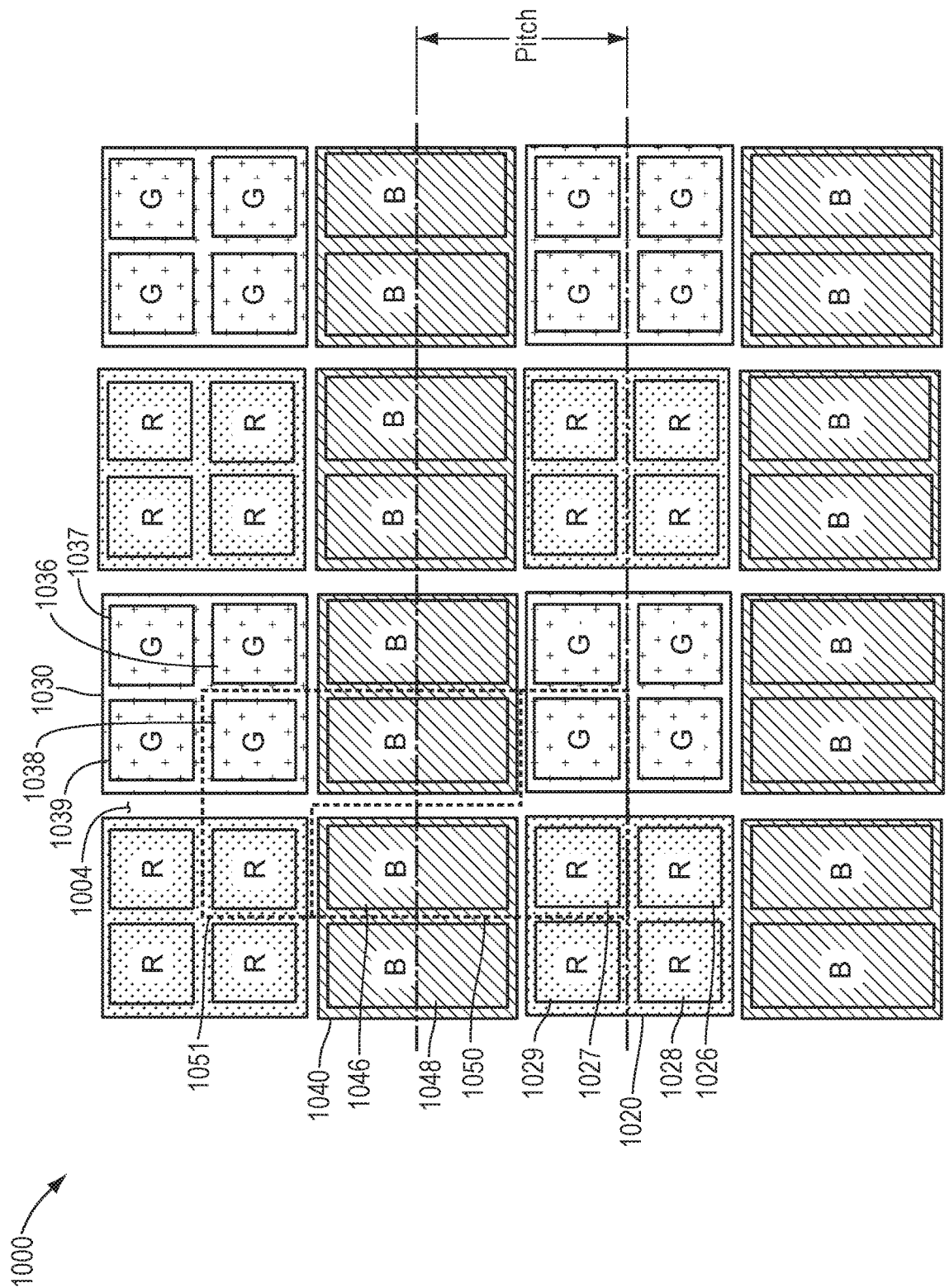

FIG. 15 depicts a partial plan view of an exemplary embodiment of a pixel and sub-pixel layout for an OLED display 1000. Features common to embodiments discussed above are not described (though similar labels can be found with a 1000 series in FIG. 15). For simplicity, differences will be discussed. Confinement structure 1004 can be configured to define a plurality of wells 1020, 1030, 1040. Wells 1020, 1030, 1040 can be arranged such that wells 1020, 1030, 1040 are aligned in uniform rows where wells associated with red light emission and green light emission (for example 1020, 1030) alternate within a single row and wells associated with blue light emission (for example 1040) are within a single row. In addition, wells 1020, 1030, 1040 can be configured such that the wells 1020, 1030, 1040 are aligned within a uniform column such that columns of wells 1020, 1040 alternate with columns of wells 1030, 1040. Confinement wells 1020 and 1030 can be alternatively arranged such that confinement wells 1030 begin the alternating pattern.

Each confinement well 1020, 1030, 1040 can be approximately the same size. However, the number of electrodes associated with each well 1020, 1030, 1040 can differ. For example, as illustrated in FIG. 15, the well associated with red light emission 1020 can include electrodes 1026, 1027, 1028, 1029, the well associated with green light emission 1030 can include electrodes 1036, 1037, 1038, 1039, and the well associated with blue light emission 1040 can include electrodes 1046, 1048. While electrodes within confinement well 1040 are illustrated as being arranged horizontally spaced, the electrodes could alternatively be arranged so as to be vertically spaced.

While electrodes 1026, 1027, 1028, 1029, 1036, 1037, 1038, 1039 are illustrated in FIG. 15 as having a square shape and electrodes 1046, 1048 are illustrated as having a rectangular shape, electrodes having any shape are contemplated as within the scope of the present disclosure such as, for example, circular, chevrons, hexagonal, asymmetrical, irregular curvature, etc. A plurality of differing shapes of electrodes could be implemented within a single confinement well. In addition, differing confinement wells can have differing shaped electrodes. The size and shape of the electrode can influence the distance between the electrodes and thus the overall layout of the display. For example, when the shapes are complementary, electrodes can be spaced closer together while still maintaining electrical isolation between adjacent electrodes. In addition, the shape and spacing of the electrodes can influence the degree of visual artifacts created. Electrode shapes can be selected to reduce undesired visual artifacts and enhance image blending to produce a continuous image.

Pixels 1050, 1051, shown in dashed lines, can be defined based on based on the confinement well arrangement and corresponding sub-pixel layout. The overall spacing, or pitch, of pixels 1050, 1051 can be based on the resolution of the display. For example, the higher the display resolution, the smaller the pitch. In addition, pixels can be defined as having an asymmetrical shape. For example, as illustrated in FIG. 15, pixel 1050, 1051 can have an "L" shape.

Figure 16:
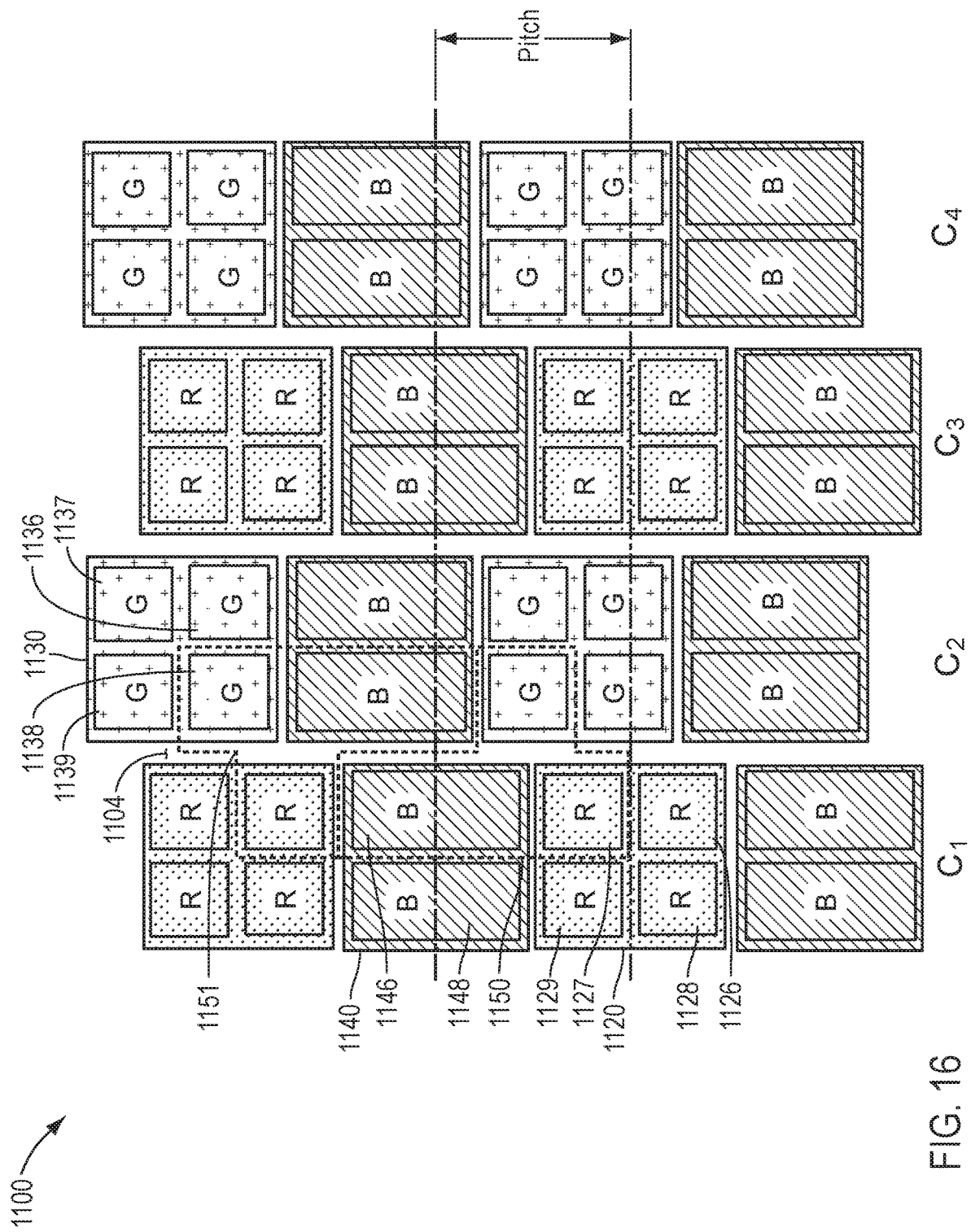

FIG. 16 depicts a partial plan view of an exemplary embodiment of a pixel and sub-pixel layout for an OLED display 1100. Features common to exemplary embodiments discussed above will not be described (though similar labels with an 1100 series can be found in FIG. 16). Confinement structure 1104 can be configured to define a plurality of confinement wells 1120, 1130, 1140 in a plurality of columns $C_1$, $C_2$, $C_3$, $C_4$. Columns $C_1$, $C_2$, $C_3$, $C_4$, can be arranged to produce a staggered arrangement. For example, the confinement wells in columns $C_1$, and $C_3$ can be offset from columns $C_2$ and $C_4$, producing a staggered row arrangement while maintaining a uniform column arrangement. Pixels 1150, 1151 can be defined based on the pitch of the confinement well arrangement. The pitch of the confinement well arrangement can be based on the resolution of the display. For example, the smaller the pitch the higher the display resolution. In addition, pixels can be defined as having an asymmetrical shape. For example, as illustrated in FIG. 16 by the dashed lines, pixel 1150, 1151 can have a non-uniform shape.

Figure 17:
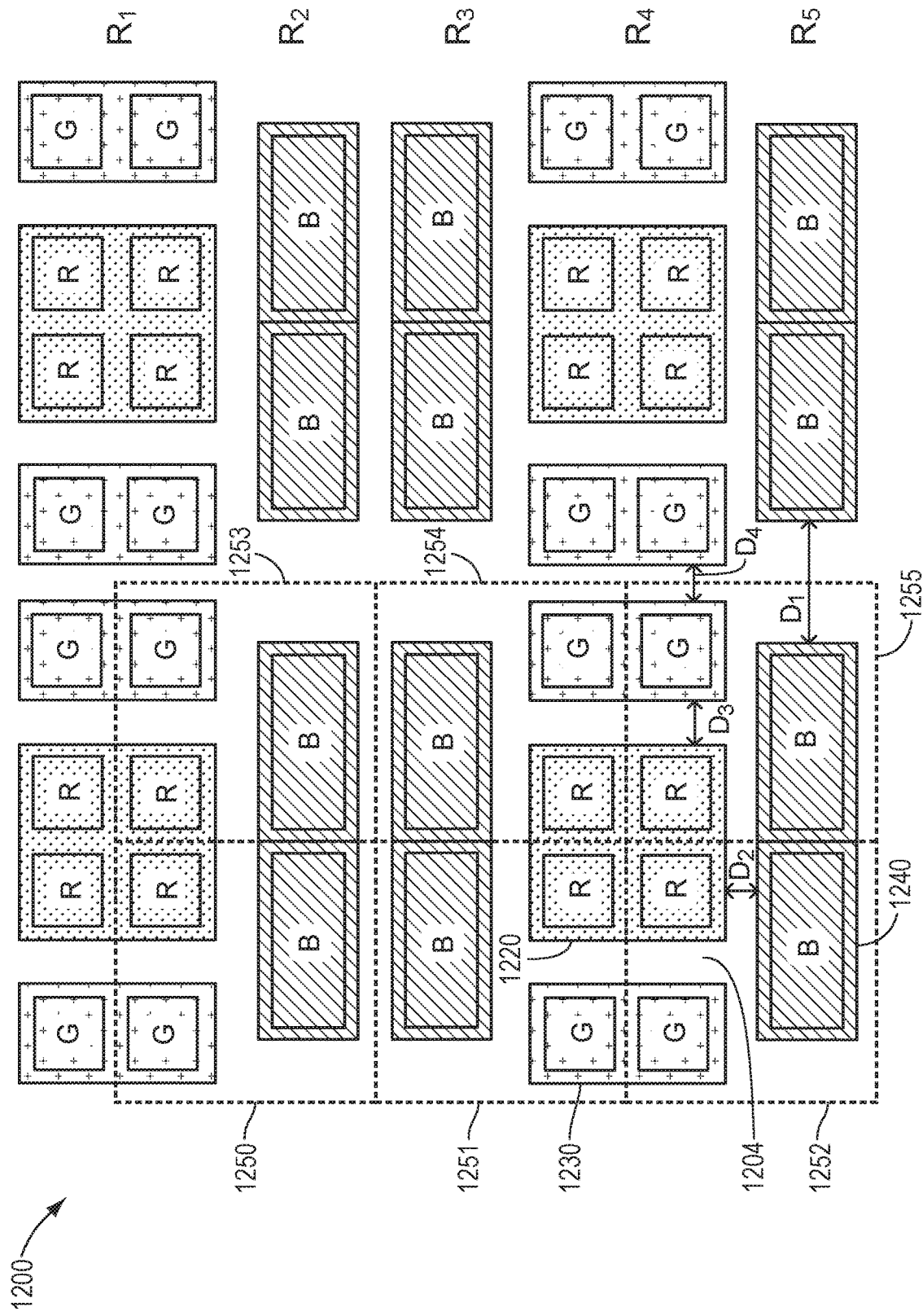

FIG. 17 depicts a partial plan view of an exemplary embodiment of a pixel and sub-pixel layout for an OLED display 1200. Features common to embodiments discussed above are not described (though similar labels with a 1200 series can be found in FIG. 17). As illustrated in FIG. 17, confinement structure 1204 can be configured to define a plurality of confinement wells 1220, 1230, 1240. Each confinement well 1220, 1230, 1240 can have a differing area. For example, the well 1220 associated with red light emission R can have an area greater than the well 1230 associated with the green light emission G. In addition, confinement wells 1220, 1230, 1240 can be associated with a differing number of pixels. For example, confinement well 1220 can be associated with pixels 1251, 1252, 1254, 1256 and confinement wells 1230, 1240 can be associated with pixels 1251, 1252. Wells 1220, 1230, 1240 can be configured in uniform rows $R_1$, $R_2$, $R_3$, $R_4$, $R_5$. Rows $R_2$, $R_3$, and $R_5$ can be associated with blue light emission wells 1240 and rows $R_1$ and $R_4$ can be associated with alternating red light emission wells 1220 and green light emission wells 1230. The confinement structure 1204 can have a variety of dimensions $D_1$, $D_2$, $D_3$, $D_4$. For example, $D_1$ can be greater than $D_2$, $D_3$, or $D_4$, $D_2$ can be less than $D_1$, $D_3$, or $D_4$, and $D_3$ can be approximately equal to $D_4$.

Figure 18:
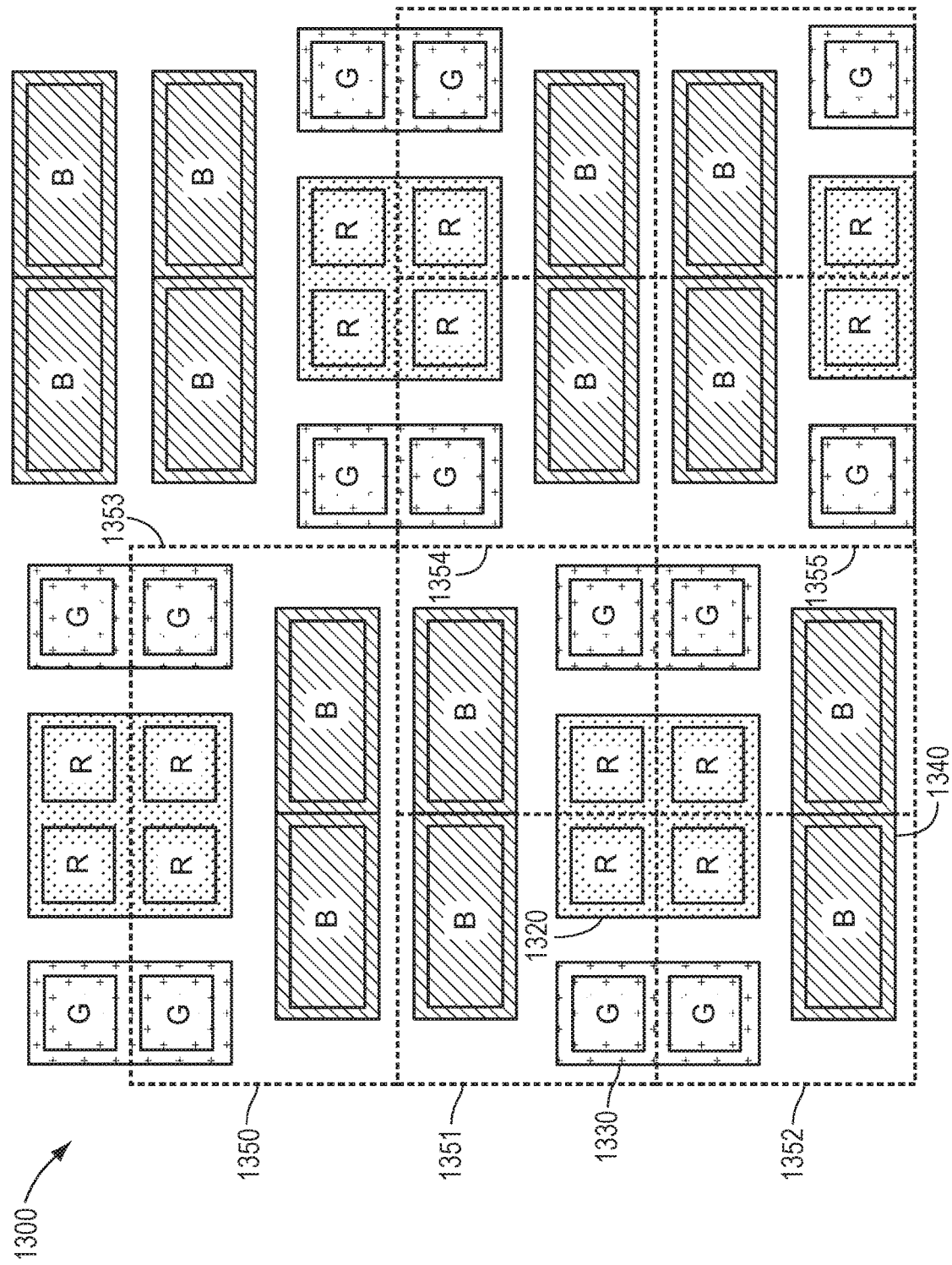

FIG. 18 depicts a partial plan view of an exemplary embodiment of a pixel and sub-pixel layout for an OLED display 1300. Features common to embodiments discussed above, for example FIG. 17, are not described (though similar labels with a 1300 series can be found in FIG. 18). Confinement structure 1304 can be configured to define a plurality of confinement wells 1320, 1330, 1340. Wells 1320, 1330, 1340 can be arranged such that wells associated with red light emission 1320 and green light emission 1330 can be alternated within a row with wells associated with blue light emission 1340.

While various pixel and sub-pixel layouts are described above, the exemplary embodiments in no way limit the shape, arrangement, and/or configuration of confinement wells that span a plurality of pixels as described. Instead, confinement wells associated with the present disclosure in combination with inkjet printing manufacturing methods allow for flexible pixel layout arrangements to be selected.

Figure 19:
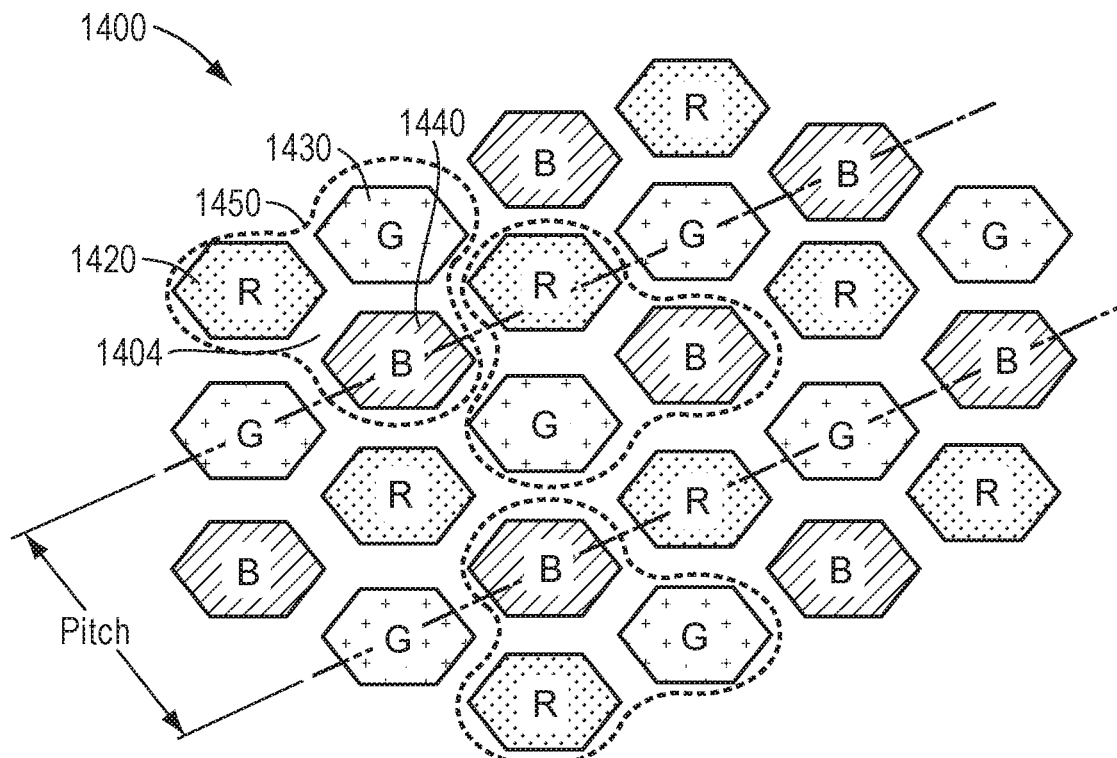

Various pixel layouts are contemplated that can enable a high resolution OLED display using inkjet printing. For example, as illustrated in FIG. 19, confinement structures

1404 can create a hexagonal pattern such that a pixel 1450 can comprise a confinement well 1420 associated with red emission R, a confinement well 1430 associated with green emission G, and a confinement well 1440 associated with blue emission B. Due to the pitch, the shape of the confinement wells, and the ability to pack the confinement wells closer together, an OLED display having high resolution can be created using inkjet printing.

Using various aspects in accordance with exemplary embodiments of the present disclosure, some exemplary dimensions and parameters could be useful in attaining high resolution OLED displays with an increased fill factor. Tables 1-3 include conventional dimensions and parameters as well as prophetic, non-limiting examples in accordance with exemplary embodiments of the present disclosure associated with an OLED display having a resolution of 326 ppi where Table 1 describes a sub-pixel associated with red light-emission, Table 2 describes a sub-pixel associated with green light-emission, and Table 3 describes a sub-pixel associated with blue light-emission. Tables 4-6 include conventional dimensions and parameters as well as prophetic, non-limiting examples in accordance with exemplary embodiments of the present disclosure associated with a display having a resolution of 440 ppi where Table 4 describes a sub-pixel associated with red light-emission, Table 5 describes a sub-pixel associated with green light-emission, and Table 6 describes a sub-pixel associated with blue light emission.

TABLE 1

| For a sub-pixel associated with red emission in display having resolution of 326 ppi | Length of Sub-pixel (μm) | Width of Sub-pixel (μm) | Area of Confinement Well (μm$^2$) |
|---|---|---|---|
| Conventional sub-pixel | 65.9 | 10.5 | 690.7 |
| Sub-pixel associated with Confinement Structure as illustrated in FIGS. 3A, 3B | 31.5 | 31.5 | 989.5 |
| Conventional sub-pixel with Pixel Definition Layer | 59.9 | 9.0 | 537.9 |
| Sub-pixel associated with Confinement Structure with definition layer as illustrated in FIGS. 5A, 5B | 28.5 | 28.5 | 809.8 |

TABLE 2

| For a sub-pixel associated with green emission in display having resolution of 326 ppi | Length of Sub-pixel (μm) | Width of Sub-pixel (μm) | Area of Confinement Well (μm$^2$) |
|---|---|---|---|
| Conventional sub-pixel | 65.9 | 10.5 | 690.7 |
| Sub-pixel associated with Confinement Structure as illustrated in FIGS. 3A, 3B | 31.5 | 31.5 | 989.5 |
| Conventional sub-pixel with Pixel Definition Layer | 59.9 | 9.0 | 537.9 |
| Sub-pixel associated with Confinement Structure with definition layer as illustrated in FIGS. 5A, 5B | 28.5 | 28.5 | 809.8 |

TABLE 3

| For a sub-pixel associated with blue emission of a display having resolution of 326 ppi | Length of Sub-pixel (μm) | Width of Sub-pixel (μm) | Area of Confinement Well (μm$^2$) |
|---|---|---|---|
| Conventional sub-pixel | 65.9 | 21.0 | 1381.4 |
| Sub-pixel associated with Confinement Structure as illustrated in FIGS. 3A, 3B | 30.0 | 65.9 | 1979.1 |
| Conventional sub-pixel with Pixel Definition Layer | 59.9 | 18.0 | 1075.9 |
| Sub-pixel associated with Confinement Structure with definition layer as illustrated in FIGS. 5A, 5B | 27.0 | 59.9 | 1619.6 |

TABLE 4

| For a sub-pixel associated with red emission of a display having resolution of 440 ppi | Length of Sub-pixel (μm) | Width of Sub-pixel (μm) | Area of Confinement Well (μm$^2$) |
|---|---|---|---|
| Conventional sub-pixel | 45.7 | 5.4 | 248.4 |
| Sub-pixel associated with Confinement Structure as illustrated in FIGS. 3A, 3B | 21.4 | 21.4 | 456.4 |
| Conventional sub-pixel with Pixel Definition Layer | 39.7 | 3.9 | 159.2 |
| Sub-pixel associated with Confinement Structure with definition layer as illustrated in FIGS. 5A, 5B | 18.4 | 18.4 | 337.2 |

TABLE 5

| For a sub-pixel associated with green emission of a display having resolution of 440 ppi | Length of Sub-pixel (μm) | Width of Sub-pixel (μm) | Area of Confinement Well (μm$^2$) |
|---|---|---|---|
| Conventional sub-pixel | 45.7 | 5.4 | 248.4 |
| Sub-pixel associated with Confinement Structure as illustrated in FIGS. 3A, 3B | 21.4 | 21.4 | 456.4 |
| Conventional sub-pixel with Pixel Definition Layer | 39.7 | 3.9 | 156.2 |
| Sub-pixel associated with Confinement Structure with definition layer as illustrated in FIGS. 5A, 5B | 18.4 | 18.4 | 337.2 |

TABLE 6

| For a sub-pixel associated with blue emission of a display having resolution of 440 ppi | Length of Sub-pixel (μm) | Width of Sub-pixel (μm) | Area of Confinement Well (μm$^2$) |
|---|---|---|---|
| Conventional sub-pixel | 45.7 | 10.9 | 496.8 |
| Sub-pixel associated with Confinement Structure as illustrated in FIGS. 3A, 3B | 20.0 | 45.7 | 912.8 |
| Conventional sub-pixel with Pixel Definition Layer | 39.7 | 7.9 | 312.4 |
| Sub-pixel associated with Confinement Structure with definition layer as illustrated in FIGS. 5A, 5B | 17.0 | 39.7 | 674.4 |

Table 7 includes conventional dimensions and parameters as well as prophetic, non-limiting examples in accordance with exemplary embodiments of the present disclosure associated with a pixel within a display having a resolution of 326 ppi where the pixel includes a red sub-pixel, a green sub-pixel, and a green sub-pixel.

TABLE 7

| For a display having resolution of 326 ppi | Active Area of Pixel ($\mu m^2$) | Total Area of Pixel ($\mu m$) | Fill Factor* |
| --- | --- | --- | --- |
| Conventional Confinement Structure | 2762.7 | 6070.6 | 46% |
| Confinement Structure as illustrated in FIGS. 3A, 3B | 3958.2 | 6070.6 | 65% |
| Conventional Confinement Structure with Pixel Definition Layer | 2151.8 | 6070.6 | 35% |
| Confinement Structure with definition layer as illustrated in FIGS. 5A, 5B | 3239.2 | 6070.6 | 53% |

*(Active Area/Total Area) rounded up to the nearest percentage point

As illustrated in Table 7 above, it is contemplated that various exemplary embodiments in accordance with the present disclosure can achieve a fill factor improvement over conventional confinement structures. For example, a fill factor for a display that contemplates a confinement structure illustrated in FIGS. 3A and 3B can increase the fill factor by about 43% over a conventional structure, thereby achieving a total fill factor of 65%. In another embodiment, a fill factor for a display that contemplates a confinement structure as illustrated in FIGS. 5A and 5B can improve the fill factor by about 51% over a conventional structure thereby achieving a total fill factor of 53%.

Table 8 includes conventional dimensions and parameters as well as prophetic, non-limiting examples in accordance with exemplary embodiments of the present disclosure associated with a pixel within a display having a resolution of 440 ppi where the pixel includes a red sub-pixel, a green sub-pixel, and a green sub-pixel.

TABLE 8

| For a display having resolution of 440 ppi | Active Area of Pixel ($\mu m^2$) | Total Area of Pixel ($\mu m$) | Fill Factor* |
| --- | --- | --- | --- |
| Conventional Confinement Structure | 993.5 | 3332.4 | 30% |
| Confinement Structure as illustrated in FIGS. 3A, 3B | 1825.6 | 3332.4 | 55% |
| Conventional Confinement Structure with Pixel Definition Layer | 624.8 | 3332.4 | 19% |
| Confinement Structure with definition layer as illustrated in FIGS. 5A, 5B | 1348.9 | 3332.4 | 40% |

*(Active Area/Total Area) rounded up to the nearest percentage point

As illustrated in Table 8 above, it is contemplated that various exemplary embodiments in accordance with the present disclosure can achieve a fill factor improvement over conventional confinement structures. For example, a fill factor for a display that contemplates a confinement structure illustrated in FIGS. 3A and 3B can improve the fill factor by about 84% over conventional structure thereby achieving a total fill factor of 55%. In another embodiment, a fill factor for a display that contemplates a confinement structure as illustrated in FIGS. 5A and 5B can improve the fill factor by about 116% over a conventional structure thereby achieving a total fill factor of 40%.

As has been discussed above, various factors can influence deposition precision and uniformity of organic light-emissive layers in OLED display inkjet based manufacturing techniques. Such factors include, for example, display resolution, droplet size, target droplet area, droplet placement error, fluid properties (e.g., surface tension, viscosity, boiling point) associated with the OLED layer material (e.g., active OLED materials) inks, which are comprised of a combination of OLED layer material and one or more carrier fluids, and the velocity at which the droplets are deposited.

In various exemplary embodiments, instead of providing multiple confinement wells defined by confinement structures (e.g., banks) surrounding each pixel or sub-pixel, utilizing patterned regions of differing surface energies (e.g., liquid-affinity and liquid-repelling regions) to define confinement regions can provide for simplification of the manufacturing process. The use of bank structures can include additional processing steps to deposit the patterned bank layer. In addition, when using a bank structure, it is often necessary to use a patterned deposition method, e.g. inkjet, to deposit various device layers in each sub-pixel that are common to all of the sub-pixels. For example, in various embodiments, a RGB OLED structure can have a common HIL and a common HTL coating in each of the red, green, and blue sub-pixels, prior to providing the different red, green, and blue EML coatings into the corresponding color sub-pixels. When a bank structure is used, these HIT and HTL coatings are deposited using inkjet in a patternwise fashion into each well. However, in such instances, it could simplify the manufacturing process to use a uniform, blanket coating technique to deposit those HIL and HTL layers onto all of the pixels, and then use a patternwise deposition technique for the EML. The presence of the bank structures can increase the difficulty in the deposition of a uniform blanket coating. As discussed above, coating over various structures, even over a region comprising a relatively small cluster of pixel electrodes, presents various challenges. By eliminating the bank structures to define confinement wells and instead providing the HIL and HTL coatings using a blanket deposition technique, and then utilizing a chemical confinement mechanism defining liquid-affinity and liquid-repelling regions on the top surface of the HTL, so as to confine the EML inks used to define the sub-pixel color layers, the manufacturing process may be simplified.

Such liquid-affinity and liquid-repelling regions can also assist in compensating for OLED emissive ink droplet placement errors in a similar manner to the bank structures, permitting a greater margin of acceptable drop placement during deposition of the OLED light emissive material, as any ink droplets that may partially fall onto a boundary between liquid affinity and liquid repelling regions can be naturally repelled from the liquid-repelling region and attracted to the liquid-affinity region prior to drying which can make the manufacturing process more robust. Moreover, as explained in more detail below, liquid-affinity region margins can be employed to further accommodate potential drop placement inaccuracies. As discussed above, high precision inkjet heads used in the conventional printing techniques can produce droplet sizes ranging from about 1 picoliter (pL) to about 50 picoliters (pL), with about 10 pL being a relatively common size for high precision inkjet printing applications. Droplet placement accuracy of a conventional inkjet printing system is approximately ±10 μm.

In various exemplary embodiments, the hole conducting layer can be configured to create liquid-affinity regions and liquid-repelling regions such that the emissive layer confinement regions can correspond to the liquid affinity regions, with the liquid-repelling regions functioning as the boundaries to contain and prevent migration of deposited material. The emissive layer confinement regions can be defined to consider drying effects associated with depositing organic light-emissive material and other active OLED materials. For example, non-uniform edges within an active region of a sub-pixel can create undesired visual artifacts. The emissive layer confinement regions can take edge drying effects into consideration when they are defined such that any non-uniform edges are outside an active area of the sub-pixel. In addition, emissive layer confinement regions can be individually configured based on the organic light-emissive material and the drying effects associated with each material. Moreover, additional material and manufacturing steps (e.g., formation of confinement structures) may not be required to provide additional confinement structures to define confinement wells associated with each sub-pixel. Additional definition layers such as a pixel definition layer may in some cases be omitted because the emissive layer confinement regions and the subsequent deposition of the organic light-emissive layers provide adequate definition for sub-pixels and pixels. However, those having ordinary skill in the art would appreciate that pixel definition layers can be used in conjunction with the disclosed embodiments that use confinement regions defined by regions of differing surface energies.

In accordance with various exemplary embodiments described herein, manufacturing techniques can be implemented that introduce significant flexibility into the OLED manufacturing process. For example, pixel layouts and sub-pixel arrangements can include a variety of shapes, arrangements, and configurations, in light of the flexibility achieved in defining these layouts by virtue of defining liquid-affinity regions and liquid-repelling regions. Generally, the electrical circuitry in OLED displays is isolated from the active OLED layers wherein the circuitry is outside the confinement wells and individually addresses the sub-pixel electrodes. However, in accordance with exemplary embodiments described herein, active OLED layers can be deposited over electrical circuitry within the active region of the substrate to improve the electrical performance of the drive electronics, as well as increase the fill factor of each pixel.

Although confinement structures to define confinement wells at the pixel/sub-pixel level within the active area of the display can be eliminated, in exemplary embodiments that define confinement regions via surface regions of differing surface energies, a confinement structure can nevertheless be disposed on a non-active portion of a substrate to form a single active-area display well that surrounds the entire active region of the substrate. For example, the confinement structure can be disposed to surround all of the electrodes associated with the pixels within an image generating portion of the display. By positioning the confinement structure outside the active pixel regions, non-uniformities caused at the edges of the active OLED layers in contact with or approximate to the confinement structure can be confined outside the active display area thereby minimizing undesired visual artifacts and reducing materials used during manufacturing by preventing material from migrating into non-active regions of the display. Such a configuration also can reduce precision requirements during manufacturing. For example, the accuracy of the deposition of the active organic material onto a specific and precisely delineated area is no longer as critical in the deposition of active OLED layers. When droplets are deposited to form a hole conducting layer such as a hole injection layer and/or a hole transport layer, all droplets deposited within the single active-area display well can amalgamate to produce a continuous layer having a substantially uniform thickness.

Moreover, implementing a single confinement structure in the non-active portion of the OLED display substrate to define an active-area display well can improve the ease of manufacturing an OLED display. For example, inkjet nozzles can be used to deposit the active OLED layers in a high resolution display and any droplet volume variations will not have as great an impact on the overall display quality deposition due to averaging that occurs from the intermixing of the drops together to form a single, continuous hole conducting film within the confinement region. For instance, a hole conducting layer, such as at least one of a hole injection layer and a hole transport layer, can be deposited over all of the electrodes within the active-area display well in the active region of the substrate. Since all drops of liquid amalgamate, deposition may be facilitated and uniformity increased because any variation in drop volume is insignificant and does not affect the resulting layer. In addition, there are no additional manufacturing steps to remove active OLED layers from the non-active portion of the display, thereby reducing the overall manufacturing process.

In accordance with exemplary embodiments described above, embodiments that use confinement regions defined by regions of differing surface energies also can incorporate pixel arrangements that increase active region areas. For example, as above with confinement structures to define confinement wells at the pixel/sub-pixel level, light emissive layer confinement regions (defined by surface regions of differing surface energies) can be defined to include an area that spans a plurality of sub-pixels associated with differing pixels such that non-active portions of each pixel are reduced. For instance, light emissive layer confinement regions can be defined over a plurality of individually addressed sub-pixel electrodes wherein each sub-pixel electrode can be associated with a different pixel. By increasing the area of the defined light-emissive layer confinement regions, the fill factor can be maximized because the ratio of the active regions to the total pixel area is increased. Achieving such increases in fill factor can enable high resolution in smaller size displays as well as improve the lifetime of the display.

Further, as described above with respect to various pixel arrangements described with reference to FIGS. 2 and 12-19, embodiment using light emissive layer confinement regions in combination with such pixel layout arrangements can extend the lifetime of the device. For example, sub-pixel electrode size can be based on the corresponding organic light emissive layer wavelength emission. For instance, a sub-pixel electrode associated with blue light emission can be larger than a sub-pixel electrode associated with red or green light emission. Organic layers associated with blue light emission in OLED devices can have shortened lifetimes relative to organic layers associated with red or green light emission. In addition, operating OLED devices to achieve a lower brightness level increases the lifetime of the devices. By increasing the emission area of the blue sub-pixel relative to the red and green sub-pixels, as well as driving the blue sub-pixel to achieve a relative brightness while driving the red and green sub-pixels to achieve a brightness higher than the blue sub-pixel, can serve to better balance the lifetimes of the different colored sub-pixels while still providing for the proper overall color balance of the display. This improved balancing of lifetimes enables improvement in the overall lifetime of the display by extending the lifetime of the blue pixel.

One of ordinary skill in the art would also appreciate that alternative configurations are possible to extend the lifetime of differing sub-pixel colors aside from blue. For example, a red sub-pixel could have a larger area than the other sub-pixels so as to extend the lifetime of the red sub-pixels. Alternatively, the green sub-pixel can have a larger area than the other sub-pixels, so as to extend the lifetime of the green sub-pixels. Such configurations also can be applied to OLED displays that comprise confinement structures to define confinement wells as well as to OLED displays that use liquid-affinity and liquid repelling regions to define confinement regions.

Referring now to FIGS. 22-39, an OLED display and exemplary steps for manufacturing the OLED display 1900 are illustrated. While the method of manufacturing will be discussed with reference to display 1900, any and/or all of the steps described herein can be used in manufacturing other OLED displays, for example OLED display 1500, 1600 described with reference to FIGS. 20 and 21. The OLED display 1900 includes a substrate 1902, a confinement structure 1904, and a plurality of electrodes 1906, as illustrated in the plan view of FIG. 22 and the cross-sectional view along line 23-23 of FIG. 22 depicted in FIG. 23.

Substrate 1902 can include an active region 1908 that is defined by the area encompassing the electrodes 1906 (boundary shown by dashed line in FIGS. 22, 23) and a non-active region 1910. Substrate 1902 can be any rigid or flexible and generally planar structure, and can include one or more layers of one or more materials. Substrate 1902 can be made of, for example, glass, polymer, metal, ceramic, or combinations thereof.

A confinement structure 1904 (e.g., a bank) can be disposed on the substrate 1902 such that the confinement structure 1904 defines a single active-area display well W. The confinement structure 1904 can be formed of various materials such as, for example, photoresist materials such as photoimageable polymers or photosensitive silicon dielectrics. The confinement structure 1904 can comprise one or more organic components that are, after processing, substantially inert to the corrosive action of OLED inks, have low outgassing, have a shallow (e.g. <25 degrees) sidewall slope at the active-area display well edge, and/or have high phobicity towards one or more of the OLED inks to be deposited into the active-area display well, and may be chosen based on the desired application. Examples of suitable materials include, but are not limited to PMMA (poly-methylmethacrylate), PMGI (poly-methylglutarimide), DNQ-Novolacs (combinations of the chemical diazonaphthoquinone with different phenol formaldehyde resins), SU-8 resists (a line of widely used, proprietary epoxy based resists manufactured by MicroChem Corp.), fluorinated variations of conventional photoresists and/or any of the aforementioned materials listed herein, and organo-silicone resists, each of which can be further combined with each other or with one or more additives to further tune the desired characteristics of the confinement structure 1904.

In addition, confinement structure 1904 can assist in the loading and drying process, through appropriate geometry and surface chemistry, of the active OLED material to form continuous and uniform layers within the region of the well W bounded by the confinement structure 1904. The confinement structure 1904 can be a single structure or can be composed of a plurality of separate structures that form the confinement structure 1904. Confinement structure 1904 can have any cross-sectional shape. In addition, while confinement structure 1904 is illustrated in FIG. 22 as having side edges perpendicular to substrate 1902, confinement structure 1904 can alternatively have angled and/or rounded edges with respect to the surface of the substrate 1902.

The confinement structure 1904 can be formed using any manufacturing method, such as inkjet printing, nozzle printing, slit coating, spin coating, vacuum thermal evaporation, sputtering (or other physical vapor deposition method), chemical vapor deposition, etc. Any additional patterning not otherwise included in the deposition technique can be achieved by using shadow masking, photolithography (photoresist coating, exposure, development, and stripping), wet etching, dry etching, lift-off, etc.

Figure 22:
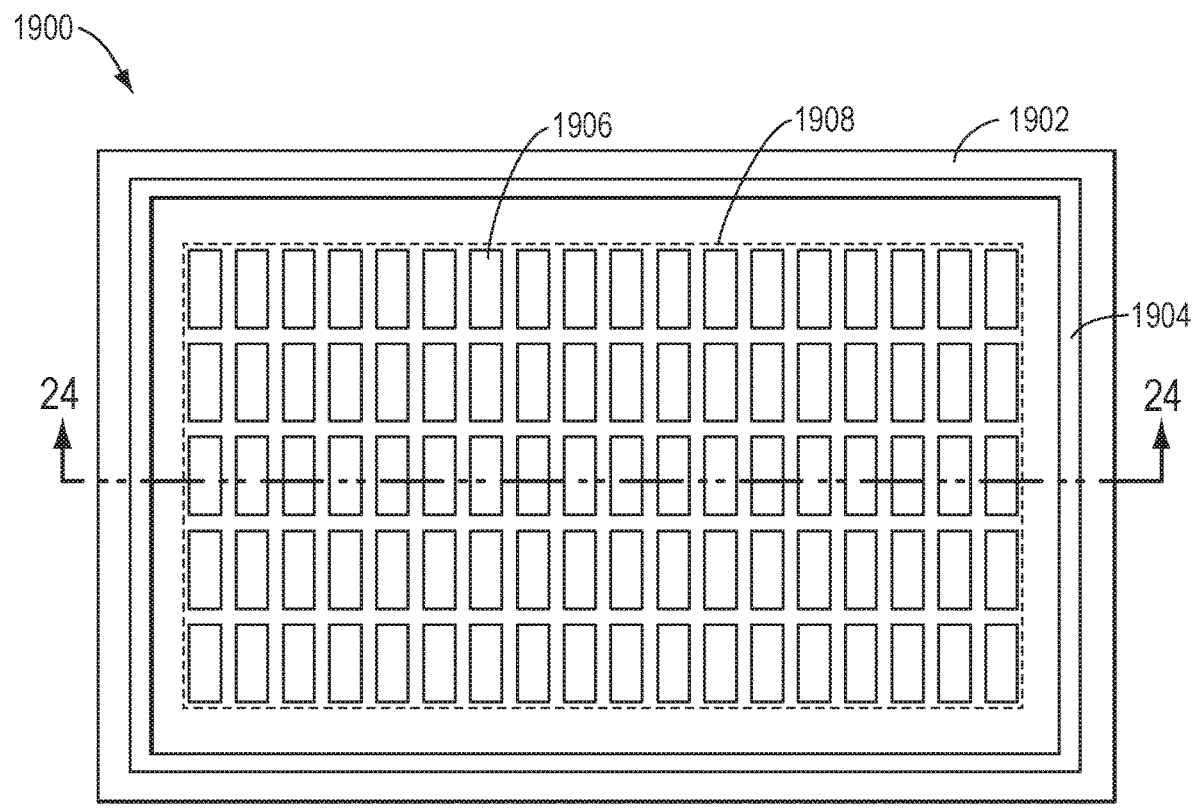
FIG. 22 is a plan view of an exemplary embodiment of an OLED display in accordance with the present disclosure.
Figure 23:
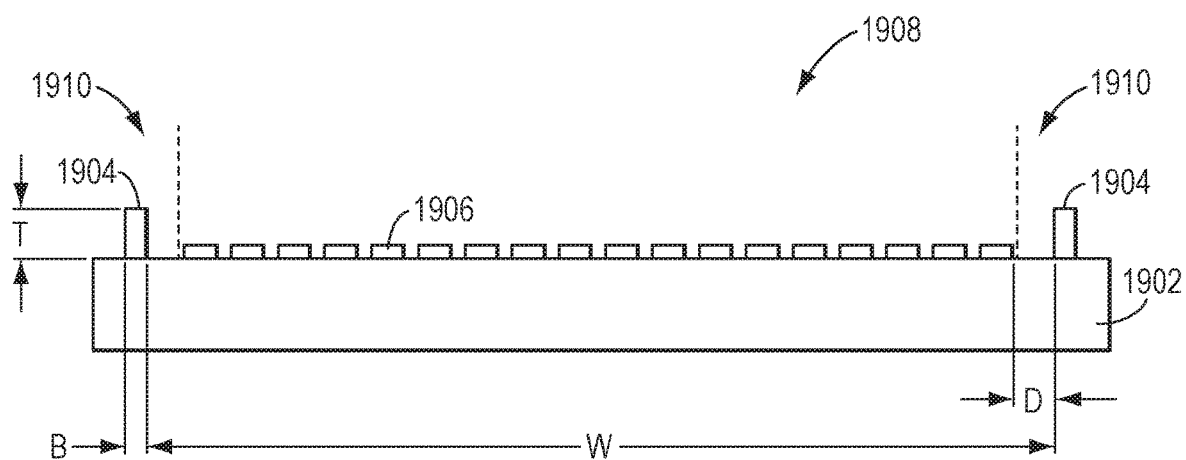
FIG. 23 is a cross-sectional view of the OLED along line 23-23 in FIG. 22 of an exemplary embodiment in accordance with the present disclosure.

The confinement structure 1904 defining active-area display well W can confine active OLED material deposited on the substrate 1902. For example, confinement structure 1904 can be disposed on the non-active portion 1910 of substrate 1902 and surround the active region 1908. In various exemplary embodiments, as shown in FIGS. 22-23, for example, confinement structure 1904 can be positioned outside the active area by a distance D. D can be determined based on edge drying effects and can be selected to minimize undesired visual artifacts within the active region 1908 of the substrate 1902. For example, the confinement structure 1904 can be positioned sufficiently away from any of the electrodes 1906 to prevent any edge drying non-uniformities from contributing to the observed light emission from the pixels and reducing the loading precision required to deposit active OLED material within the well during the manufacturing process. At the same time, it is also desirable to minimize the width of the inactive region outside of the display area and within the area provided for making external electrical connection to the display. Minimizing the width of the inactive regions provides for closer packing of multiple displays on a single substrate sheet, thereby increasing manufacturing efficiency. It also provides for reducing the width of the bezel outside of the display which is desirable for making a smaller finished display product with less wasted space.

In an exemplary embodiment, D can range from about 10 µm to about 500 µm, for example, D may be about 50 µm. Confinement structure 1904 can have a width B ranging from about 10 µm to about 5 mm where B could be about 20 µm. In addition, confinement structure 1904 can have a height T ranging from about 0.3 µm to about 10 µm where the height could be about 1.5 µm.

A plurality of electrodes 1906 can be provided on the substrate 1902 within the active region 1908 such that, when electrodes 1906 are selectively driven, light can be emitted to create an image to be displayed to a user. Electrodes 1906 can be disposed to define a pixel array such that each electrode 1906 is associated with a differing sub-pixel, such as, for example, a sub-pixel associated with red light emission, a sub-pixel associated with green light emission, a sub-pixel associated with blue light emission, and so on. Alternatively, each electrode 1906 can instead be associated with a pixel comprising a red sub-pixel, a green sub-pixel, and a blue sub-pixel. Electrodes 1906 can have any shape, arrangement, and/or configuration. For example, as illustrated in FIG. 22, electrodes 1906 can have a square shape. Alternatively, electrodes 1906 can have a rectangular, circular, chevron, hexagonal, asymmetrical, irregular curvature shape, or a combination thereof. Electrodes 1906 can have a profile such that the top surface is substantially planar and parallel to the main surface of the substrate while side edges of the electrodes can be substantially perpendicular to or can be angled and/or rounded with respect to the surface of the substrate 1902.

Electrodes 1906 can be transparent or reflective and can be formed of a conductive material such as metal, a mixed metal, an alloy, a metal oxide, a mixed oxide, or a combination thereof. For example, in various exemplary embodiments, the electrodes may be made of indium-tin-oxide, magnesium silver, or aluminum.

The electrodes 1906 can be formed using any manufacturing method such as inkjet printing, nozzle printing, slit coating, spin coating, vacuum thermal evaporation, sputtering (or other physical vapor deposition method), chemical vapor deposition, etc. Any needed additional patterning not otherwise provided by the deposition technique can be achieved by using shadow masking, photolithography (photoresist coating, exposure, development, and stripping), wet etching, dry etching, lift-off, etc.

Pixels can be defined based on the pitch of the electrodes 1906. The pitch of the electrodes can be based on the resolution of the display. For example, the smaller the pitch, the higher the display resolution. Pixels can be selected to have any type of arrangement such as symmetrical or asymmetrical to reduce undesired visual artifacts and enhance image blending to produce a continuous image.

While omitted for clarity and ease of illustration, further additional electrical components, circuits, and/or conductive members can be disposed on substrate 1902. Electrical components, circuits, and/or conductive members can include driving circuitry, including but not limited to, for example, an interconnect, bus lines, transistors, and other circuitry those having ordinary skill in the art are familiar with. The electrical components, circuits, and/or conductive members can be coupled to each electrode 1906 such that each electrode can be selectively addressed independently of the other electrodes. For instance, thin-film transistors (TFTs) (not shown) can be formed on the substrate 1902 before and/or after depositing any of the other structures such as confinement structure 1904 and/or electrodes 1906. As will be discussed below, active OLED layers can be deposited over any electrical components, circuits, and/or conductive members disposed in the active region 1908 of the substrate 1902.

As illustrated in FIG. 24, after the electrodes 1906 and other circuitry (not shown), including e.g., TFTs, have been deposited, a first hole conducting material 1911 can be deposited within the active-area display well W defined by confinement structure 1904. The first hole conducting material 1911 can be deposited as one or more layers of material that facilitates the injection of holes into an organic light-emissive layer. For example, the first hole conducting material 1911 can be deposited as a layer of a single hole conducting material such as a hole injection material. Alternatively, hole conducting material 1911 can be deposited as a plurality of differing hole conducting material, with at least one hole injection material, such as, for example, Poly(3,4-ethylenedioxythiophene:poly(styrenesulfonate) (PEDOT:PSS).

The first hole conducting material 1911 can be deposited using inkjet printing. For example, an inkjet nozzle 1914 can direct multiple droplets 1916 of a fluid composition comprising the hole conducting material within the active-area display well W. One of ordinary skill in the art would appreciate that while a single nozzle is illustrated in FIG. 24, multiple nozzles can be implemented to deposit multiple droplets of hole conducting material simultaneously within active-area display well W.

First hole conducting material 1911 can be mixed with a carrier fluid to form an inkjet composition that is formulated to provide reliable and uniform loading within the active-area display well W. The droplets for loading the first hole conducting material 1911 can be delivered to the substrate at high speeds from an inkjet head nozzle. The droplets 1916 that form the first hole conducting layer, can be deposited within the well W from all respective inkjet nozzles so as to amalgamate to produce a continuous layer having a substantially uniform thickness, as shown in FIG. 24. The first hole conducting material 1911 can be deposited such that the height of the material may be greater than the height of the confinement structure 1904 prior to drying and/or baking; although heights equal to or less than confinement structure 1904 also may be used.

As illustrated in FIG. 25, after the hole conducting material is loaded in the active-area display well W, display 1900 can be processed to form the first hole conducting layer 1912. For example, the display 1900 can be processed to allow any carrier fluid to evaporate from the first hole conducting material 1911 such as via a drying process. The process can include exposing substrate 1902 to heat, to vacuum, and/or ambient conditions for a period of time. Following drying, substrate 1902 may be baked at an elevated temperature so as to treat the deposited film material, for example, to induce a chemical reaction or change in film morphology that is beneficial for the quality of the deposited film or for the overall process.

The first hole conducting layer 1912 can be substantially continuous within the entire active-area display well W such that layer 1912 is disposed over all surface features within the active-area display well W (e.g., electrodes 1906, circuitry (not shown), etc.) and the edges of layer 1912 contact the confinement structure 1904 surrounding the active-area display well W. While layer 1912 is illustrated as having a planar top surface, hole conducting layer 1912 can alternatively follow the topography of the underlying surface features such as electrodes 1906 and any circuitry (not shown) thereby producing a non-planar top surface associated with the underlying surface features, for example in a manner similar to that described above with respect to the exemplary embodiments of FIGS. 3-11 in which deposited layers follow surface topographies.

As illustrated in FIG. 26, a second hole conducting material 1917 can be deposited within the active-area display well W defined by confinement structure 1904 and over the first hole conducting layer 1912. The second hole conducting material 1917 can include a hole transport material such as, for example, N,N'-Di-((1-napthyl)-N,N'-diphenyl)-1,1'-biphenyl)-4,4'-diamine (NPB).

As with the first hole conducting material 1911, the second hole conducting material 1917 can be deposited using inkjet printing. For example, an inkjet nozzle 1914 can direct multiple droplets 1920 of a fluid composition comprising hole conducting material within the active-area display well W. One of ordinary skill in the art would appreciate that while a single nozzle is illustrated in FIG. 26, multiple nozzles can be implemented to deposit multiple droplets of hole conducting material 1920 simultaneously within active-area display well W. In addition, while inkjet nozzle 1914 is illustrated as being the same inkjet nozzle used to deposit the first hole conducting material 1911, the inkjet nozzle used to deposit the second hole conducting material 1917 can be different. Therefore, the droplet volumes of the droplets 1920 associated with the second hole conducting material 1917 can be the same or different from the droplet volumes of the first hole conducting material 1916.

Second hole conducting material 1917 can be mixed with a carrier fluid to form an inkjet composition that is formulated to provide reliable and uniform loading within the active-area display well W. The droplets for loading the second hole conducting material 1917 can be delivered to the substrate at high speeds from an inkjet head nozzle 1914.

The droplets 1920 of the second hole conducting material 1917, can be deposited within the well W from all respective inkjet nozzles so as to amalgamate to produce a continuous layer having a substantially uniform thickness, as shown in FIG. 26. The second hole conducting material 1917 can be deposited such that the height of the material may be greater than the height of the confinement structure 1904 prior to drying and/or baking; although heights equal to or less than confinement structure 1904 also may be used.

As illustrated in FIG. 27, after the second hole conducting material 1917 is loaded in the active-area display well W, display 1900 can be processed to form the second dried hole conducting layer 1918. For example, display 1900 can be processed to allow any carrier fluid to evaporate from the second hole conducting material 1917, such as via a drying process. The process can include exposing substrate 1902 to heat, to vacuum, and/or ambient conditions for a period of time. Following drying, substrate 1902 may be baked at an elevated temperature so as to treat the deposited material 1917, for example, to induce a chemical reaction or change in film morphology that is beneficial for the quality of the deposited film or for the overall process.

The second hole conducting layer 1918 can be substantially continuous within the entire active-area display well W such that layer 1918 is disposed over all surface features within the active-area display well W (e.g. electrodes 206, circuitry (not shown), the first hole conducting layer 1912, etc.) and the edges of layer 1918 contact the confinement structure 1904 surrounding the active-area display well W.

As illustrated in FIG. 28, the second hole conducting layer 1918 can be processed so as to modify a surface energy or affinity of portions of the second hole conducting layer 1918 to define emissive layer confinement regions. For example, a reactive surface-active material can be applied to the surface of layer 1918. In an exemplary embodiment, the reactive surface-active material can be exposed to radiation from radiation source 1923 through mask 1922 where openings (not shown) in the mask can be used to define regions of differing surface energies (e.g., liquid-affinity regions and liquid-repelling regions) within layer 1918, thereby resulting in emissive layer confinement regions. In an alternative embodiment, layer 1918 can further comprise reactive surface-active material such that emissive layer confinement regions can be defined by exposing the second hole conducting layer 1918 using radiation source 1923. In an exemplary embodiment, mask 1922 can be positioned with respect to electrodes 1906 such that each opening in the mask 1922 is aligned based on the width and length of each electrode 1906.

The reactive surface-active (RSA) material can comprise a composition of at least one radiation sensitive material. When the RSA material is exposed to radiation, the surface energy or affinity of the associated layer exposed to the radiation can be modified. For example, portions of layer 1918 associated with the RSA material that are exposed to the radiation can have a change in at least one physical, chemical, and/or electrical property from portions of layer 1918 not associated with the RSA material and/or not exposed to radiation from light source 1923 such that portions of layer 1918 exposed to radiation have a surface energy or affinity that differs from the surface energy or affinity of the portions of layer 1918 not exposed to radiation.

Radiation source 1923 can comprise any radiation source that can be used to modify at least one physical, chemical, and/or electrical property in combination with the RSA material. For example, radiation source 1923 can comprise an infrared radiation source, a visible wavelength radiation source, an ultraviolet radiation source, a combination thereof, etc.

The type of radiation used can depend upon the sensitivity of the RSA. The exposure can be a blanket, overall exposure, or the exposure can be patternwise. As used herein, the term "patternwise" indicates that only selected portions of a material or layer are exposed. Patternwise exposure can be achieved using any known imaging technique. In one embodiment, the pattern is achieved by exposing through a mask. In one embodiment, the pattern is achieved by exposing only select portions with a laser. The time of exposure can range from seconds to minutes, depending upon the specific chemistry of the RSA used. When lasers are used, much shorter exposure times are used for each individual area, depending upon the power of the laser. The exposure step can be carried out in air or in an inert atmosphere, depending upon the sensitivity of the materials.

In one embodiment, the radiation can be selected from ultra-violet radiation (10-390 nm), visible radiation (390-770 nm), infrared radiation (770-$10^6$ nm), and combinations thereof, including simultaneous and serial treatments. In another embodiment, the radiation can be thermal radiation such as being carried out by heating. The temperature and duration for the heating step is such that at least one physical property of the RSA is changed, without damaging any underlying layers. In an exemplary embodiment, the heating temperature can be less than 250° C. such as less than 150° C.

In an exemplary embodiment, the radiation can be ultra-violet or visible radiation where the radiation can be applied patternwise, resulting in exposed regions of RSA and unexposed regions of RSA. After patternwise exposure to radiation, the first layer can be treated to remove either the exposed or unexposed regions of the RSA.

In another exemplary embodiment, the exposure of the RSA to radiation can result in a change in the solubility or dispersibility of the RSA in solvents. For example, when the exposure is carried out patternwise, a wet development treatment can follow the exposure step. The treatment can include washing with a solvent which dissolves, disperses or lifts off one type of area. The patternwise exposure to radiation can result in insolubilization of the exposed areas of the RSA and treatment with solvent results in removal of the unexposed areas of the RSA.

In another exemplary embodiment, the exposure of the RSA to visible or UV radiation can result in a reaction which decreases the volatility of the RSA in exposed areas. When the exposure is carried out patternwise, this can be followed by a thermal development treatment. The treatment can involve heating to a temperature above the volatilization or sublimation temperature of the unexposed material and below the temperature at which the material is thermally reactive. For example, for a polymerizable monomer, the material can be heated at a temperature above the sublimation temperature and below the thermal polymerization temperature. However, it is noted that RSA materials that have a temperature of thermal reactivity that is close to or below the volatilization temperature may not be able to be developed in this manner.

In another exemplary embodiment, the exposure of the RSA to radiation can result in a change in the temperature at which the material melts, softens or flows. When the exposure is carried out patternwise, this can be followed by a dry development treatment. A dry development treatment can include contacting an outermost surface of the element with an absorbent surface to absorb or wick away the softer portions. This dry development can be carried out at an elevated temperature, so long as it does not further affect the properties of the originally unexposed areas.

After the RSA material is exposed to radiation, physical properties of layer 1918 can be modified such that exposed portions can have an increase or decrease in surface energy from non-exposed portions. For example, the exposed portions can cause portions of layer 1918 to become more or less soluble or dispersible in a liquid material, more or less tacky, more or less soft, more or less flowable, more or less liftable, more or less absorbable, greater or lower contact angle with respect to a particular solvent or ink, greater or lower liquid-affinity with respect to a particular solvent or ink, etc. Any physical property of layer 1918 can be affected.

RSA material can comprise one or more radiation-sensitive materials. For example, the RSA material can comprise a material having radiation polymerizable groups such as olefins, acrylates, methacrylates, vinyl ethers, polyacrylates, polymethacrylates, polyketones, polysulfones, copolymers thereof and mixtures thereof. RSA material can further comprise two or more polymerizable groups. When the RSA material includes two or more polymerizable groups, crosslinking can result.

In an exemplary embodiment, the RSA material can comprise at least one reactive material and at least one radiation-sensitive material where the radiation-sensitive material can generate an active species that initiates the reaction of the reactive material when exposed to radiation. Examples of radiation-sensitive materials can include, but are not limited to, those that generate free radicals, acids, or combinations thereof. In one embodiment, the reactive material can be polymerizable or crosslinkable. The material polymerization or crosslinking reaction is initiated or catalyzed by the active species. The radiation-sensitive material is generally present in amounts from 0.001% to 10.0% based on the total weight of the RSA material.

In an exemplary embodiment, the reactive material of the RSA material can be an ethylenically unsaturated compound and the radiation-sensitive material of the RSA material can generate free radicals when exposed to radiation. Ethylenically unsaturated compounds can include, but are not limited to, acrylates, methacrylates, vinyl compounds, and combinations thereof. Any of the known classes of radiation-sensitive materials that generate free radicals can be used. For example, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocoumarins, and Michler's ketone. Alternatively, the radiation sensitive material may be a mixture of compounds, one of which provides the free radicals when caused to do so by a sensitizer activated by radiation. In one embodiment, the radiation sensitive material can be sensitive to visible or ultraviolet radiation.

In an exemplary embodiment, the reactive material can undergo polymerization initiated by an acid whereby exposing the radiation-sensitive material to radiation generates the acid. Examples of such reactive materials include, but are not limited to, epoxies. Examples of radiation-sensitive materials which generate acid, include, but are not limited to, sulfonium and iodonium salts, such as diphenyliodonium hexafluorophosphate. In an alternative embodiment, the reactive material can comprise a phenolic resin and the radiation-sensitive material can be a diazonaphthoquinone.

The RSA material can further comprise a fluorinated material. For example, the RSA material can comprise an unsaturated material having one or more fluoroalkyl groups such as a fluorinated acrylate, a fluorinated ester, or a fluorinated olefin monomer. In an exemplary embodiment, the fluoroalkyl groups have from 2-20 carbon atoms.

Figure 30:
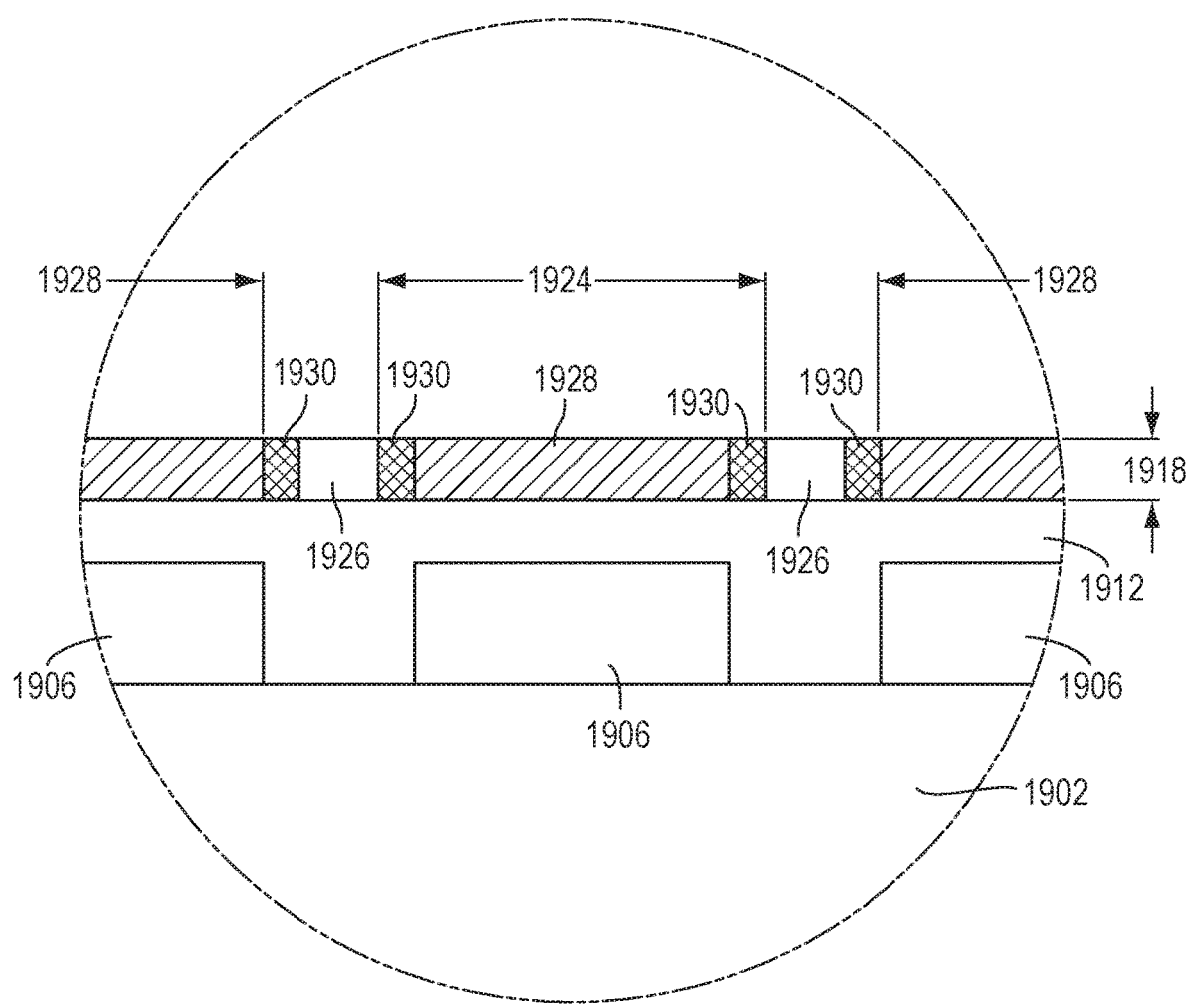
FIG. 30 is the cross-section of the magnified portion M illustrated in FIG. 29.
Figure 31:
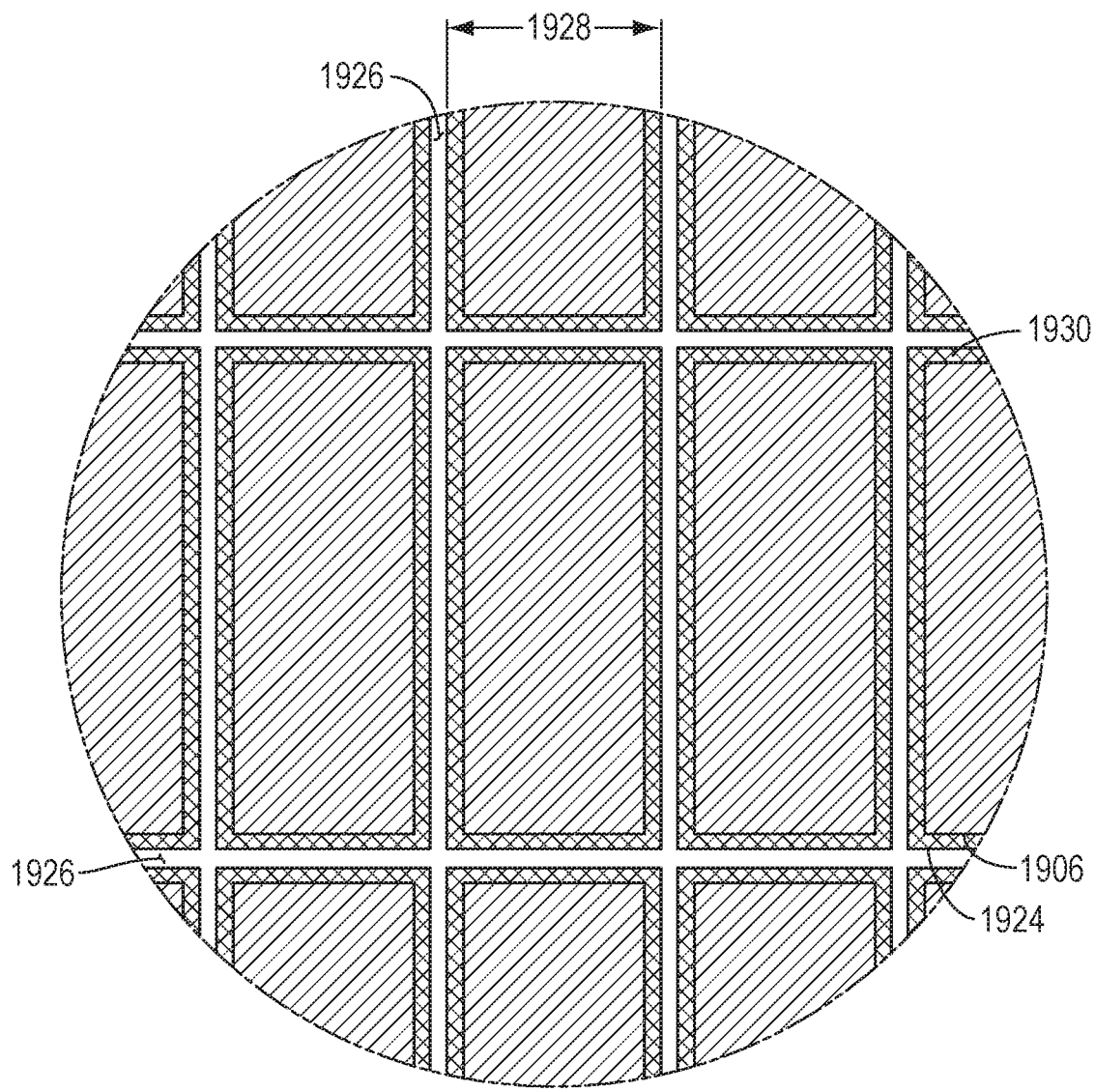
FIG. 31 is a plan view of the magnified portion M illustrated in FIG. 29.

FIG. 29 illustrates liquid-affinity regions 1924 and liquid-repelling regions 1926 that are formed after the radiation source 1923 illuminates the RSA-treated second hole conducting layer 1918 through the mask 1922. FIG. 30 is an exemplary cross-section of magnified portion M illustrated in FIG. 29 and FIG. 31 is an exemplary plan view of the magnified portion M illustrated in FIG. 29. It is noted that the liquid-affinity regions 1924 and liquid-repelling regions 1926 are illustrated in FIG. 29 as being defined within the entire thickness of the second hole conducting layer 1918. However, one of ordinary skill in the art would appreciate that the regions 1924 and/or 1926 can be formed in only a portion of layer 1918 for example on the top surface of layer 1918.

In an exemplary embodiment, the liquid-affinity regions 1924 can be defined between liquid-repelling regions 1926. Liquid-repelling regions can have a width between the liquid-affinity regions ranging from about 3 μm to more than 100 μm. The liquid-affinity regions 1924 can be defined such that the liquid-affinity regions 1924 have a surface area slightly larger than the surface area of each electrode 1906 and the portions of the liquid-affinity regions 1924 that are defined outside the active area of electrodes 1906 provide a liquid-affinity region margin 1930. For example, as illustrated in FIGS. 30 and 31, the liquid-affinity regions 1924 can be defined to consider drying effects associated with depositing organic light-emissive material such that the liquid-affinity regions 1924 can confine the organic light-emissive material within the liquid-affinity regions 1924. Each liquid-affinity region 1924 can comprise an area 1928 (indicated by shaded portions in FIG. 30) associated with the active region of electrode 1906 and a liquid-affinity region margin 1930 (if present) disposed outside the active region of electrode 1906. When organic light-emissive material is deposited on the second hole conducting layer 1918, the organic light-emissive material can be substantially confined within the area 1928 and the liquid-affinity region margin 1930 of each liquid-affinity region 1924. For example, when the organic light-emissive material is processed (e.g. dried), non-uniformities can be created at the edges of each organic light-emissive layer such that the non-uniformities are contained within the liquid-affinity region margin 1930. In other words, when the organic light-emissive material is processed, the portion of the material within area 1928 of the liquid-affinity region 1924 has a uniform top surface thereby reducing perceived visual artifacts. The liquid-affinity regions 1924 can take edge drying effects into consideration when they are defined such that the distance by which any non-uniform edges are outside of an active area of an electrode 1906 may vary based on the edge drying effects. Such edge drying effects can also be taken into account when defining the shape of the liquid-affinity region. For example, in various embodiments (not shown) the organic light-emissive material can result in rounded edges rather than the sharp corners schematically illustrated in the figures, so as to provide for a more uniform dried film. In addition, liquid-affinity regions 1924 can be flexibly configured based on the organic light-emissive material and the drying effects associated with each material. In various exemplary embodiments, liquid-affinity region margins 1930 (provided so that the impact of edge drying effects on the light emitting area are minimized) of about 20 μm or less, or about 10 μm or less, or about 5 μm or less, or about 3 μm or less may be implemented. Increasing the size of the liquid-affinity region relative to the light emitting region can also help compensate for alignment errors in the patternwise radiation exposure process. For example, in one exemplary embodiment, the patternwise radiation exposure process can have an alignment accuracy of about 2 μm. Therefore, the increased size of the liquid affinity region can account for possible misalignments of about plus or minus 2 μm with respect to the underlying light emitting region.

Figure 32:
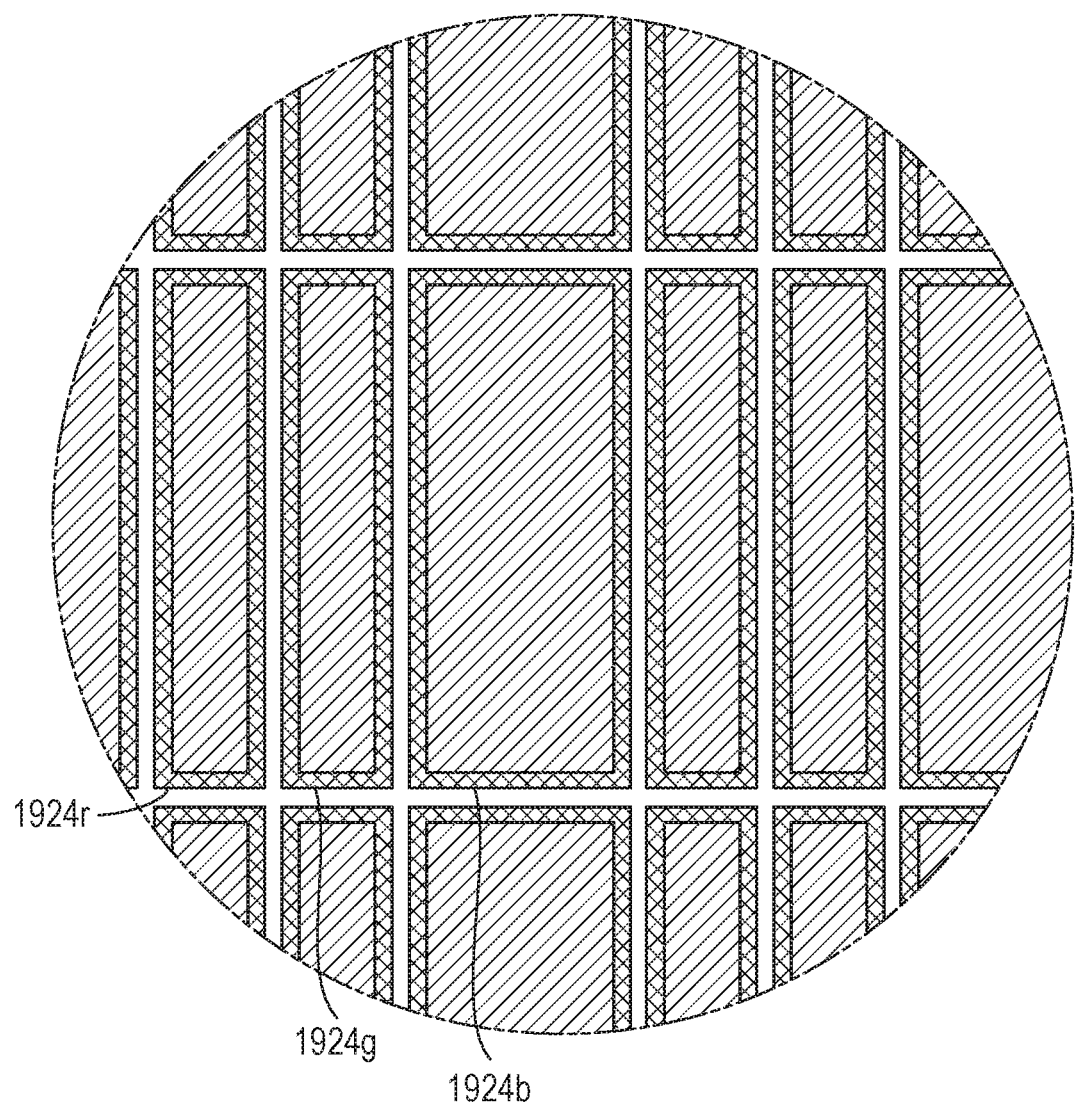
FIG. 32 is another plan view of a magnified portion of an another exemplary embodiment of an OLED display in accordance with the present disclosure.

As discussed above, electrodes 1906 can have different shapes, arrangements, and/or configurations. For example, electrodes associated with blue light emission can be larger than electrodes associated with red or green emission because organic light emissive layer associated with blue light emission in OLED devices typically have shortened lifetimes relative to organic light emissive layers associated with red and green light emission. In addition, operating OLED devices to achieve a reduced brightness level increases the lifetime of the devices. By increasing the emission area of the electrodes associated with blue light emission relative to electrodes associated with red and green light emissions, the electrodes associated with blue light emission can be driven to achieve a brightness less than a brightness of the electrodes associated with red and green light emission thereby creating a better balance in the different organic light emissive material lifetimes as well as providing the proper overall color balance of the display. This improved balancing of lifetimes further improves the overall lifetime of the display because the lifetime of the organic light emissive material associated with blue emission can be extended. In addition, the liquid-affinity regions can correspond to the different shapes, arrangements, and/or configurations of the electrodes 1906. For instance, in another exemplary embodiment showing a view similar to FIG. 31, FIG. 32 illustrates liquid-affinity regions 1924r, 1924g, 1924b can be associated with the respective electrodes of different shapes such that liquid-affinity region 1924r is associated with an electrode used to achieve red light emission, liquid-affinity region 1924g is associated with an electrode used to achieve green light emission, and liquid-affinity region 1924b is associated with an electrode used to achieve blue light emission.

Figure 33:
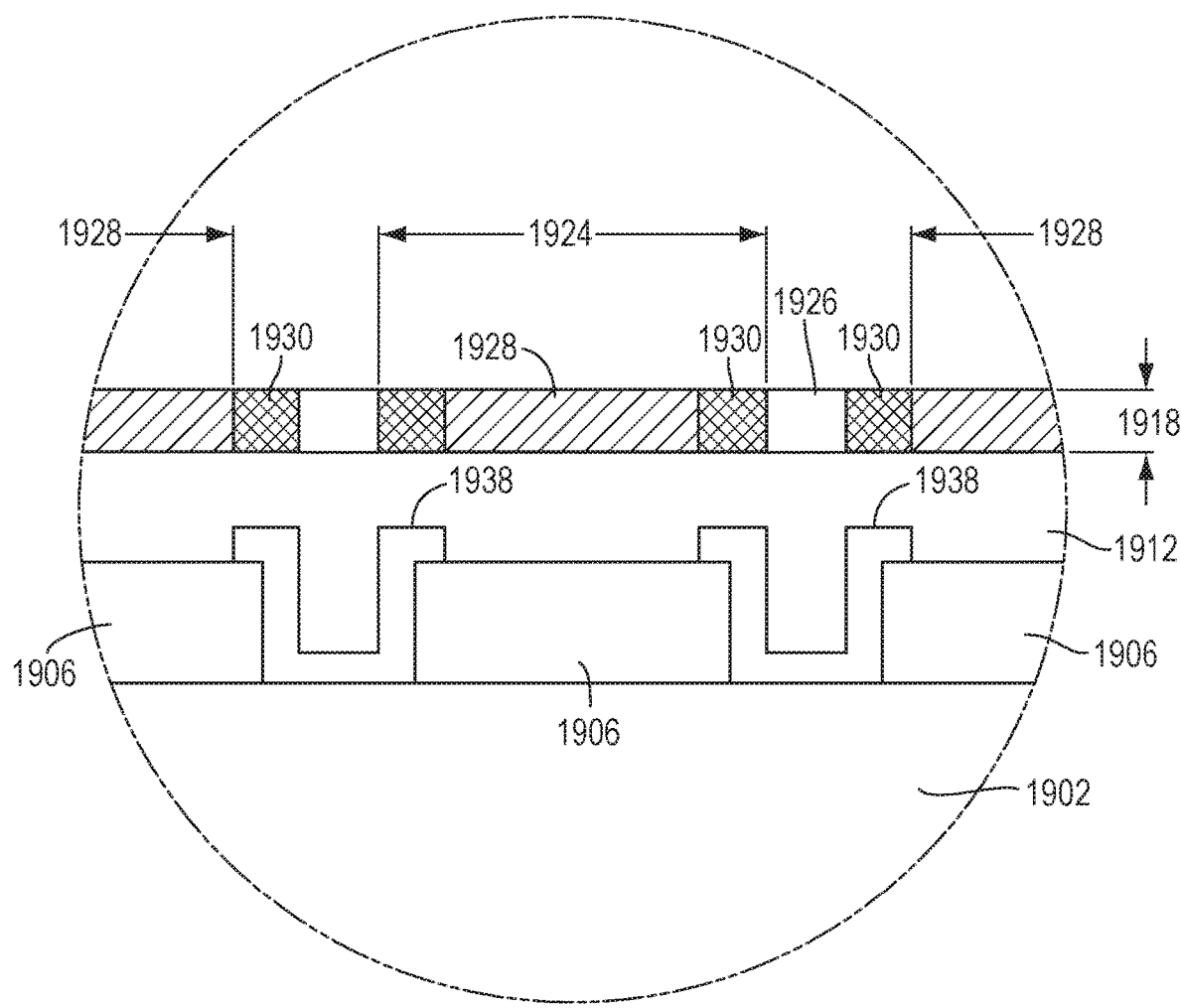
FIG. 33 is an alternative exemplary embodiment of a cross-section of the magnified portion M illustrated in FIG. 29.

In an alternative embodiment illustrated in FIG. 33 which also is an exemplary embodiment of magnified portion M illustrated in FIG. 29, a pixel definition layer 1938 can be deposited after electrodes 1906 are disposed on substrate 1902. The pixel definition layers 1938 can be deposited over a portion of electrodes 1906 and the liquid-affinity regions 1924 can be defined such that the liquid-affinity region margin 1930 can overlay at least a portion of the pixel definition layers 1938. Pixel definition layers 1938 can be any physical structure used to delineate pixels within the pixel array of the active region 1908 of display 1900. Pixel definition layers 1938 can be made of an electrically resistant material such that the definition layer 1938 prevents current flow and thus can reduce unwanted visual artifacts by substantially preventing light emission through the edges of electrodes 1906. In an exemplary embodiment, the pixel definition layers 1938 can have a thickness within the range of about 50 nm to about 1500 nm.

As illustrated in FIG. 34, organic light-emissive material 1932 can be deposited within the active-area display well W defined by the confinement structure 1904. For example, organic light-emissive material 1932 can be deposited using inkjet printing over the emissive layer confinement regions patterned within the second hole conducting layer 1918. Inkjet nozzle 1914 can direct droplets 1934 of ink containing organic light-emissive material over the liquid-affinity regions 1924, for example, via a relative scanning motion of the nozzle 1914 and/or the substrate 1902. The droplets 1934 of organic light-emissive material can spread evenly within the liquid-affinity regions 1924 such that the material pins at the edges of the liquid-affinity region 1924 (e.g., within the liquid-affinity region margin 1930). One of ordinary skill in the art would appreciate that while a single nozzle is discussed and shown with reference to FIG. 34, multiple nozzles can be implemented to provide inks containing organic light-emissive material. Inks containing the same or differing organic light-emissive material associated with differing light emissive colors can be deposited from multiple inkjet nozzle heads simultaneously or sequentially.

The deposited organic light-emissive material 1932 can include material to facilitate light emission such as organic electroluminescence material associated with red, green, and/or blue light emission. However, organic electroluminescence material associated with other light emission colors also can be used such as organic electroluminescence material associated with yellow and/or while light emission.

The organic electroluminescence material can be mixed with a carrier fluid to form an inkjet ink that is formulated to provide reliable and uniform loading within the liquid-affinity regions 1924. The ink deposited to produce the organic light-emissive material 1932 can be delivered from the inkjet nozzle 1914 at high speeds onto the liquid-affinity regions 1924.

Organic light-emissive material 1932 can generally be retained within the surface area defined by the liquid-affinity regions 1924. For example, the organic light-emissive material 1932 can be loaded onto the substrate 1902 by depositing droplets 1934 of ink within the liquid-affinity regions 1924. Due to the surface energy characteristics of the liquid-affinity regions 1924, the droplets of organic light-emissive material 1932 can spread evenly within the liquid-affinity regions 1924 and pin at the edges within the liquid-affinity region margin 1930.

In various exemplary embodiments, it is contemplated that multiple ink droplets 1934 having a volume of about 10 pL or less may be used in depositing the organic light-emissive material 1932. In various exemplary embodiments, ink droplet volumes of about 5 pL or less, about 3 pL or less, or about 2 pL or less may be used. By using the patterned liquid-affinity regions 1924 and liquid-repelling regions 1926 in accordance with the present disclosure, relatively larger droplet volume sizes, consistent with existing inkjet nozzle technology, can be utilized. In addition, there is additional margin for droplet placement accuracy that is created due to the liquid-affinity region margins 1930.

After the ink 1934 is loaded onto the liquid-affinity regions 1924, the display 1900 can be processed to allow any carrier fluid to evaporate as illustrated in FIG. 35 to create organic light-emissive layers 1933. The drying process can include exposing the display to heat, to vacuum, and/or to ambient conditions for a predetermined period of time. Following drying, the display 1900 can be further baked at an elevated temperature so as to treat the deposited film material, for example, to induce a chemical reaction or change in film morphology that is beneficial for the quality of the deposited film or for the overall process. Any edge deformations within the organic light-emissive layers 1933 during the drying and/or baking process can be contained within the liquid-affinity region margins 1930 as illustrated in and discussed with respect to FIGS. 30 and 31.

Figure 36:
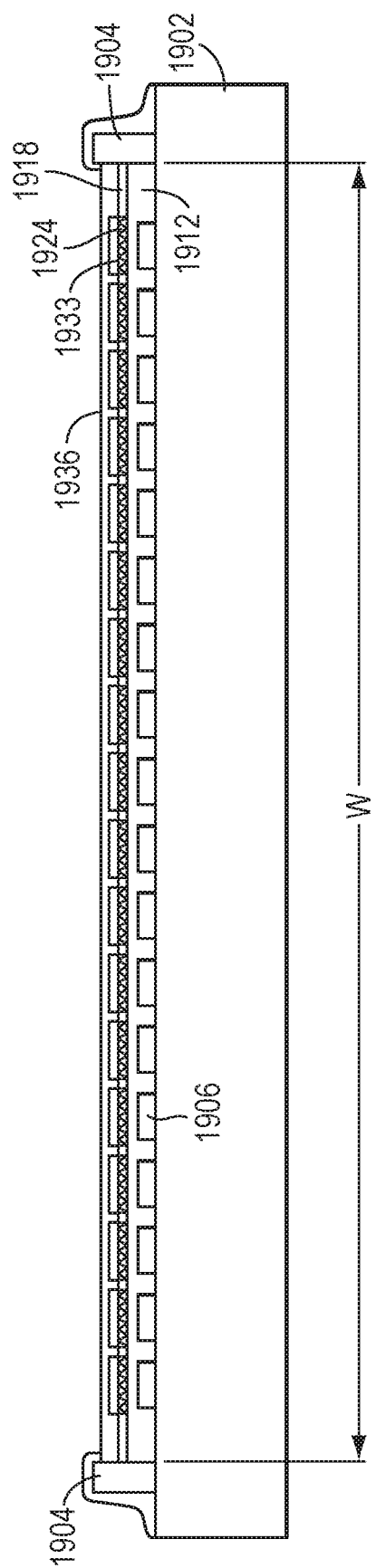

As illustrated in FIG. 36, a second electrode layer 1936 can next be deposited in the active-area display well W defined by confinement structure 1904 over the dried organic light emissive layers 1933. In an alternative embodiment, the second electrode layer 1936 can further extend beyond the confinement structure 1904. For example, the second electrode layer 1936 can make contact with an external conductive pathway (not illustrated) disposed on substrate 1902 to supply or drain the current carried by the second electrode layer 1936. The second electrode layer 1936 can be transparent or reflective and can be formed of a conductive material such as metal, a mixed metal, an alloy, a metal oxide, a mixed oxide, or a combination thereof. For example, the second electrode layer 1936 can be indium tin oxide or magnesium silver. While illustrated in FIG. 36 as a single layer, second electrode layer 1936 can have any shape, arrangement and/or configuration, including comprising a plurality of conductive layers. In one exemplary embodiment, second electrode layer 1936 can be formed using a blanket technique such that electrode 1936 results in a single electrode over the entire active region 1908 of display 1900 (See FIGS. 22 and 23). In an alternative embodiment, the second electrode layer 1936 can include a plurality of electrodes where one second electrode is associated with (e.g., overlays) each electrode 1906, respectively. In addition, while second electrode layer 1936 is illustrated in FIG. 36 as having a planar top surface, the second electrode layer 1936 can be deposited such that layer 1936 reflects the underlying topography resulting in a non-planar top surface.

The second electrode layer 1936 can be formed using any manufacturing method such as inkjet printing, nozzle printing, slit coating, spin coating, vacuum thermal evaporation, sputtering (or other physical vapor deposition method), chemical vapor deposition, etc. Any additional patterning not otherwise performed during the deposition can be achieved by using shadow masking, photolithography (photoresist coating, exposure, development, and stripping), wet etching, dry etching, lift-off, etc. after deposition.

When the second electrode layer 1936 is a continuous layer spanning the active-area display well W, the layer 1936 can blanket the topography formed by the previously disposed layers. For example, the second electrode layer 1936 can contact the second hole conducting layer 1918 in the liquid-repelling regions 1926 and the organic light-emissive layers 1933 formed over the liquid-affinity regions 1924 of the second hole conducting layer 1918.

Additional OLED layers can be deposited over the organic light-emissive layers 1933 prior to providing the second electrode layer 1936, such as for example, additional OLED layers may include electron transport layers, electron injection layers, hole blocking layers, moisture prevention layers, and/or protection layers. Such additional OLED layers can be deposited by various techniques known to those skilled in the art, such as, inkjet printing, by vacuum thermal evaporation, or by another method, for example.

Figure 37:
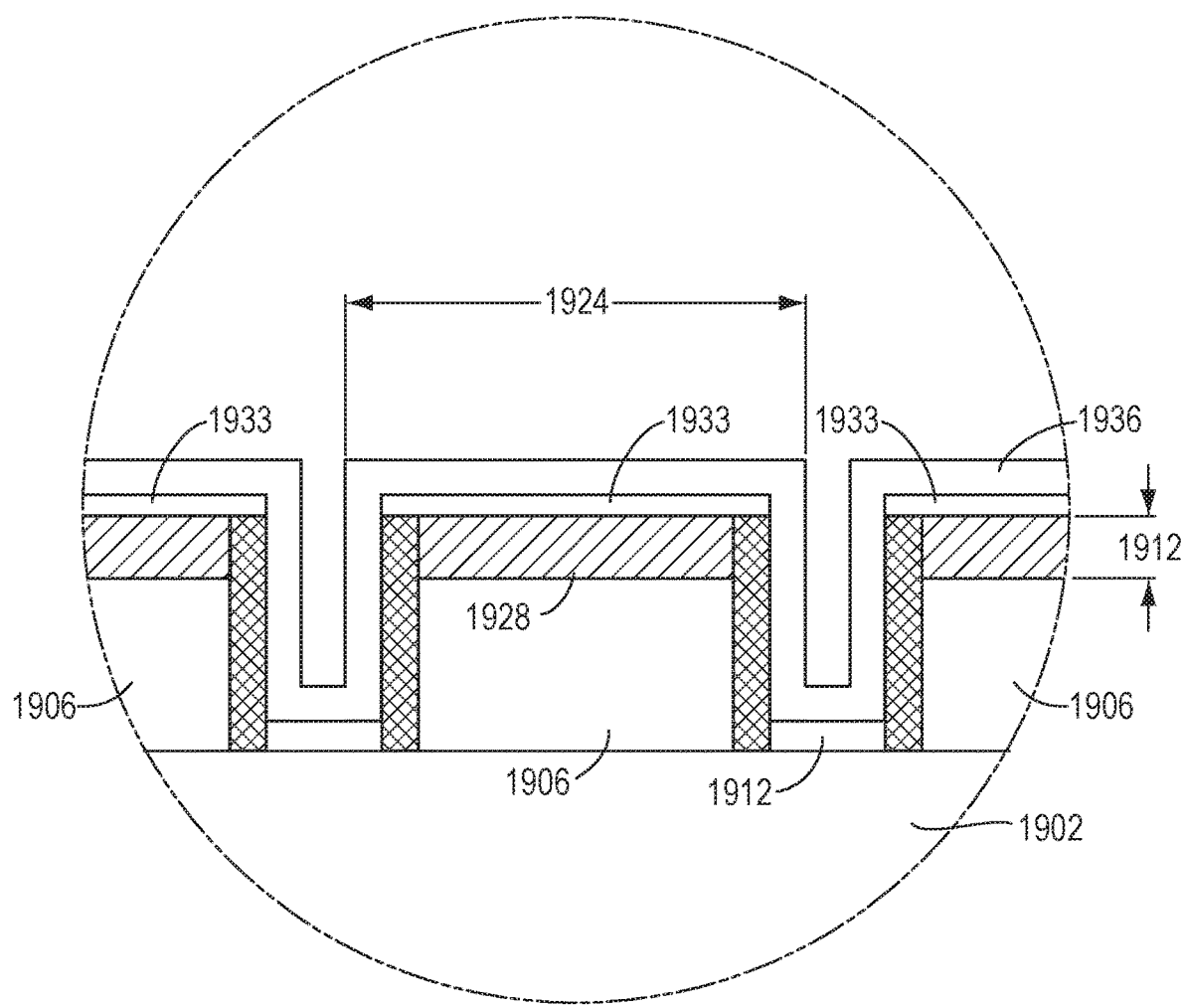
FIG. 37 is another alternative exemplary embodiment of a cross-section of the magnified portion M illustrated in FIG. 29 in accordance with the present disclosure.

In an alternative exemplary embodiment, display 1900 can comprise a single hole conducting layer 1913 as illustrated in FIG. 37, rather than a first hole conducting layer 1912 and a second hole conducting layer 1918 as illustrated for example in FIG. 28. The liquid-affinity regions 1924 can be defined in the single hole conducting layer 1913 such that liquid-affinity region margins 1930 are defined within portions of the single hole conducting layer 1913 outside of the active region of electrodes 1906. Hole conducting layer 1913 can comprise one or more hole conducting materials. For example, hole conducting layer 1913 can comprise a hole injection material and/or a hole transport layer.

In addition, as illustrated in FIG. 37, hole conducting layer 1913 and second electrode layer 1936 can conform to the underlying topography such that the top surface of the hole conducting layer 1913 and/or the second electrode layer 1936 is non-planar. For example, the deposited OLED layers may result in a surface topography that does not lie in a single plane parallel to the substrate and across the entire active-area display well W. For example, one or both of layers 1913, 1936 can be non-planar and discontinuous in a single plane of the display (wherein the plane of the display is intended as a plane parallel to substrate 1902) due to the relative depressions or protrusions associated with any surface feature including electrodes disposed on substrate 1902. As shown, the layers 1913, 1936 can sufficiently conform to underlying surface feature topographies such that a top surface of the OLED layer can have a resulting topography that follows the topography of the underlying surface features. In other words, each deposited OLED layer sufficiently conforms to all underlying layers and/or surface features disposed on the substrate 1902 such that those underlying layers contribute to the resulting non-planar top surface topography of the OLED layers after they are deposited. In this way, in a plane across the active-area display well that is parallel to a plane of the display, a discontinuity in layer 1913 or 1936, or both, can arise as the layer(s) rise and/or fall, relative to the plane, with the existing surface features provided from electrodes, circuitry, pixel definition layers, etc., in the active-area display well. While the layers 1913 and/or 1936 need not perfectly conform to the underlying surface topography (for example, as explained above there may be local non-uniformities in thickness around edge regions and the like), a sufficiently conformal coating in which there are no significant build-ups or depletions of material can promote a more even, uniform, and repeatable coating. One of ordinary skill in the art would appreciate that the same considerations described above can be applied to a hole conducting layer comprising both a hole injecting layer and a hole transporting layer, such that one or both of such layers sufficiently conform to underlying surface feature topographies where a top surface of either layer can have a resulting topography that follows the topography of the underlying surface features.

In various embodiments, confinement structure 1904 can be omitted and instead the ink formulation and printing process can be designed such that liquid-repelling regions are formed in the region outside of the display active area to facilitate repelling any fluids deposited within the non-active area of the display. For example, as illustrated in FIGS. 38 and 39, first hole conducting layer 1912 and second hole conducting layer 1918 can be deposited over electrodes 1906 and portions of substrate 1902 that are in a non-active region 1910 of display 1900. In an exemplary embodiment, layers 1912 and 1918 can be blanket coated over the entire substrate. The second hole conducting layer 1918 can be processed so as to modify a surface energy or affinity of portions of the second hole conducting layer 1918 to define emissive layer confinement regions. In addition, liquid-repelling portions 1925 within the non-active region 1910 of the display can define a confinement area CA wherein liquid-repelling portions 1925 can surround the active area 1908. As above, radiation source 1926 can provide radiation through mask 1922 that impinges on a surface of the second hole conducting layer 1918 treated with a RSA material. Radiation from radiation source 1926 can modify at least one property of the RSA material to form the liquid-affinity regions 1924. The liquid-repelling portions 1925 can have a surface energy that results in a liquid-repelling region in those portions. In this embodiment, there is no confinement structure around the perimeter of the entire active area of the display (e.g., no active-area display well) such that there is no structure to confine all the printed layers to the region including and immediately around the active area of the display. This can provide certain processing simplifications, while at the same time potentially requiring additional later processing steps to remove at least a portion of the material from the non-active display area. Organic light-emissive material 1932 can be deposited within the liquid-affinity regions 1924. Moreover, the organic light-emissive material 1932 can be confined substantially within the active area 1908 of display 1900 due to the liquid-repelling portions 1925.

Figure 40:
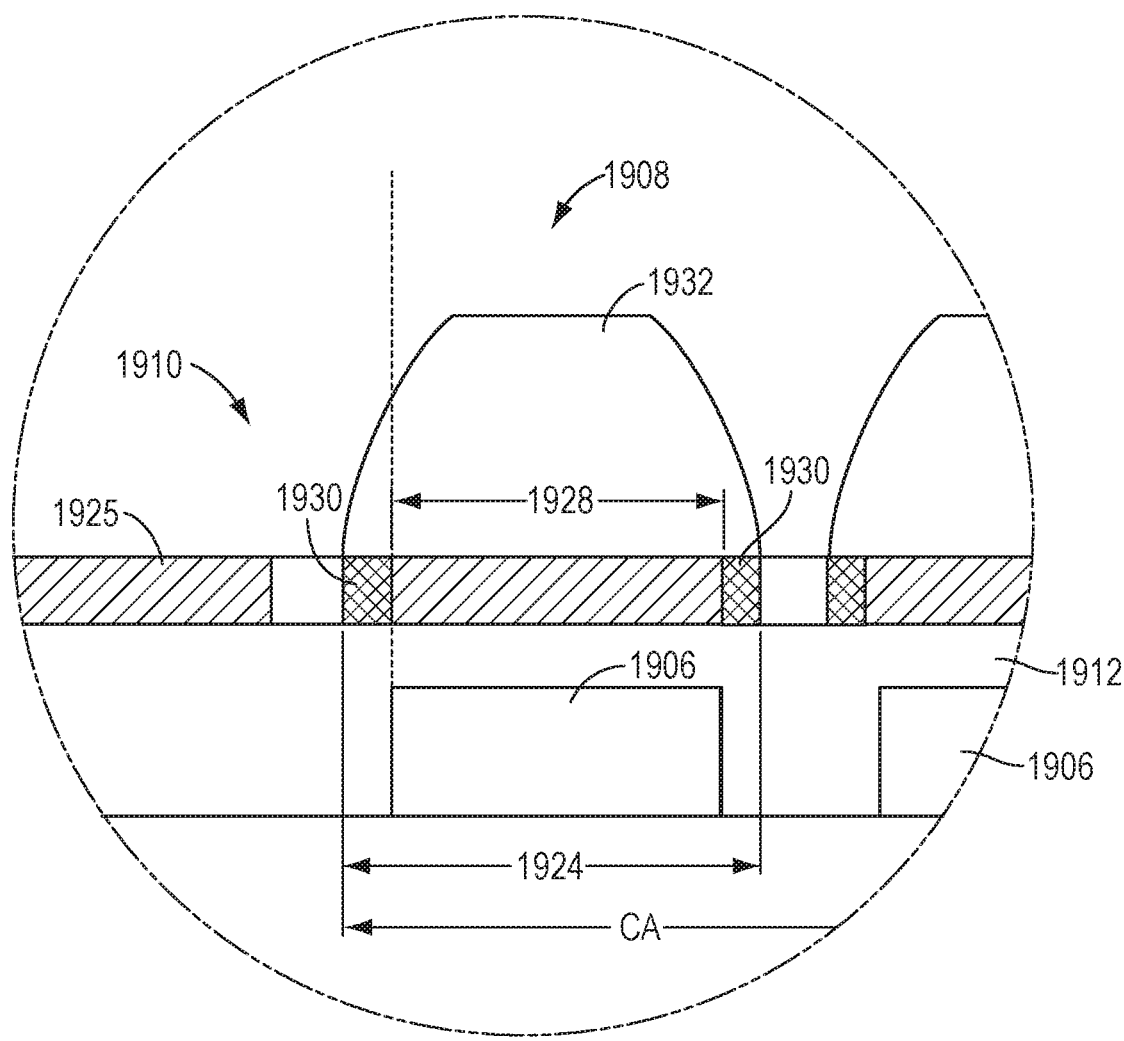
FIG. 40 is the cross-section of the magnified portion illustrated in FIG. 39 of another exemplary embodiment of an OLED display in accordance with the present disclosure.

FIG. 40 is a cross-section of magnified portion illustrated in FIG. 39 and illustrates liquid-affinity regions 1924 comprising a portion 1928 associated with the active area of electrode 1906 and a liquid-affinity margin region 1930. The liquid-repelling portion 1925 of the second hole conducting layer can be spaced apart from liquid-affinity margin regions 1930 associated with each electrodes 1906 in the active area 1908 that are adjacent to the non-active area 1910. The liquid-repelling portions 1925 can prevent any organic light-emissive material from migrating into the non-active portion 1910 of display 1900.

In accordance with exemplary embodiments, the OLED devices of FIGS. 22-40 can have a top emissive configuration or a bottom emissive configuration. For example, in a top emissive configuration, the plurality of electrodes 1906 illustrated in FIGS. 22-40 can be reflective electrodes and the second electrode layer 1936, illustrated in FIGS. 36 and 37 can be a transparent electrode. Alternatively, in a bottom emissive configuration, the plurality of electrodes 1906 can be transparent and the second electrode layer 1936 can be reflective.

In another exemplary embodiment, the OLED displays of FIGS. 22-40 can be an active-matrix OLED (AMOLED). An AMOLED display, as compared to a passive-matrix OLED (PMOLED) display, can improve display performance, but requires active drive circuitry, including thin film transistors (TFTs), on the substrate and such circuitry is not transparent. While PMOLED displays have some elements, such as conductive bus lines that are not transparent, AMOLED displays have substantially more elements that are non-transparent. As a result, for a bottom emission AMOLED display, the fill factor may be reduced compared to a PMOLED because light can only be emitted through the bottom of the substrate between the non-transparent circuit elements. For this reason, it may be desirable to use a top emission configuration for AMOLED displays since the OLED device can be constructed on top of such active circuit elements, and the light can be emitted through the top of the OLED device without concern for the opacity of the underlying elements. In general, using a top emission structure can increase the fill factor of each pixel defined in display 1900 because light emission is not blocked by additional non-transparent elements (e.g. TFTs, driving circuitry components, etc.) deposited on the substrate 1902. However, the present disclosure is not limited to a top emission active-matrix OLED configuration. The techniques and arrangements discussed herein can be used with any other type of displays such as bottom emission and/or passive displays as well as those one of ordinary skill in the art would understand how to make using appropriate modifications.

The various aspects described above with reference to FIGS. 22-40 can be used for a variety of pixel and sub-pixel layouts in accordance with the present disclosure. One exemplary layout contemplated by the present disclosure is depicted in FIG. 41.

In an exemplary embodiment, emissive layer confinement regions can be defined to include an area that spans a plurality of sub-pixels such that non-active portions of the pixel are reduced. For instance, as illustrated in FIG. 41, emissive layer confinement regions can be defined over a plurality of individually addressed sub-pixel electrodes where each sub-pixel electrode can be associated with a different pixel. By increasing the area of the emissive layer confinement structures, the fill factor can be maximized because the ratio of the active regions to the total pixel area is increased. Achieving such increases in fill factor can enable high resolution in smaller size displays as well as improve the lifetime of the display.

Figure 41:
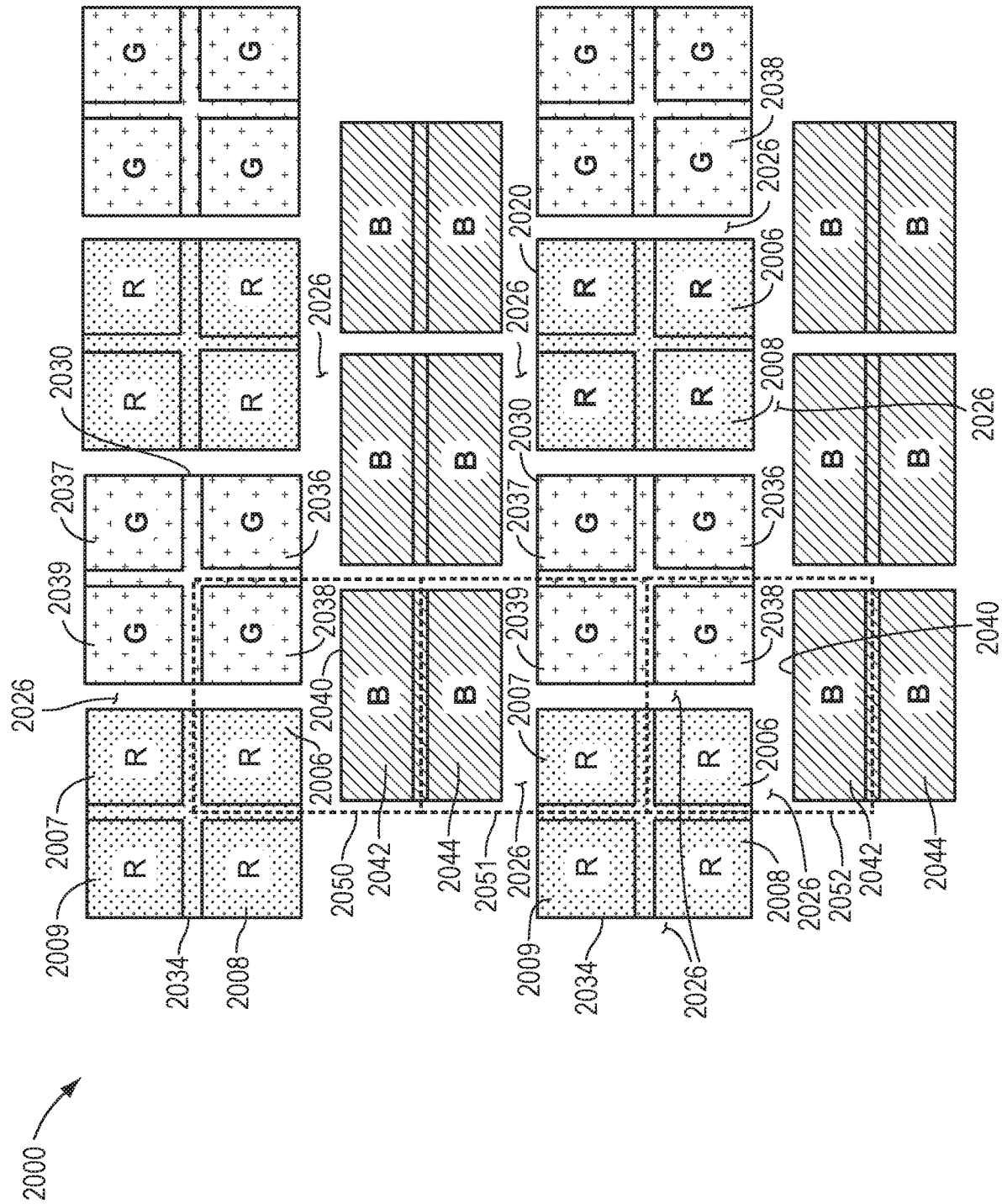
FIG. 41 is a partial plan view of an exemplary pixel arrangement in accordance with the present disclosure.

FIG. 41 illustrates a partial plan view of a display 2000 that includes a plurality of pixels, e.g., such as defined by dotted line boundaries 2050, 2051, 2052, that when selectively driven emit light that can create an image to be displayed to a user. In a full color display, a pixel 2050, 2051, 2052, can include a plurality of sub-pixels of differing colors. For example, pixel 2050 can include a red sub-pixel R, a green sub-pixel G, and a blue sub-pixel B. Emissive layer confinement regions 2034, 2036, 2038 can be defined within a second hole conducting layer 2026 where emissive layer confinement region 2034 can be associated with organic light emissive material having an emission in the red wavelength range, emissive layer confinement region 2036 can be associated with organic light-emissive material having an emission in the green wavelength range, and emissive layer confinement region 2036 can be associated with organic light-emissive material having an emission in the blue wavelength range. Each emissive layer confinement region 2034, 2036, 2038 can be associated with a plurality of electrodes 2006, 2007, 2008, 2009, 2016, 2017, 2018, 2019, 2022, 2024. By configuring the emissive layer confinement regions 2034, 2036, 2038 to be associated with a plurality of electrodes, the overall fill factor of the display 2000 can be improved such as for example in high resolution displays.

The exemplary layout of FIG. 41 is not intended to be limiting, rather there are numerous ways to implement the present disclosure. In many cases, the specific selection of a particular layout may be driven by the constraints on the underlying layout of the electrical circuitry, the desired pixel shape such as rectangles, chevrons, circles, hexagons, triangles, and the like, and factors related to visual appearance of the display (such as visual artifacts that can be observed for different configurations and for different types of display content, such as text, graphics, or moving video.) Those having ordinary skill in the art would appreciate that a number of other layouts fall within the scope of the present disclosure and can be obtained through modification and based on the principles described herein. Further, those having ordinary skill in the art would understand that although for simplicity only the emissive layer confinement regions are described in the description of the exemplary layout of FIG. 41, any of the features, including electrodes, surface features, circuitry, pixel definition layers, and other layers described above with reference to FIGS. 22-40 can be used in combination with any of the pixel layouts herein.

Using various aspects in accordance with exemplary embodiments of the present disclosure, some exemplary dimensions and parameters could be useful in attaining high resolution OLED displays with an increased fill factor. Tables 9-11 include prophetic, non-limiting examples in accordance with exemplary embodiments of the present disclosure associated with an OLED display having a resolution of 326 ppi where Table 9 describes a sub-pixel associated with red light-emission, Table 10 describes a sub-pixel associated with green light-emission, and Table 11 describes a sub-pixel associated with blue light-emission. Tables 12-14 include conventional dimensions and parameters as well as prophetic, non-limiting examples in accordance with exemplary embodiments of the present disclosure associated with a display having a resolution of 440 ppi where Table 12 describes a sub-pixel associated with red light-emission, Table 13 describes a sub-pixel associated with green light-emission, and Table 14 describes a sub-pixel associated with blue light emission.

TABLE 9

| For a sub-pixel associated with red emission in display having resolution of 326 ppi | Length of Sub-pixel (μm) | Width of Sub-pixel (μm) | Area of Emissive Confinement Regions (μm²) |
|---|---|---|---|
| Sub-pixel associated with Emissive Layer Confinement Regions as illustrated in FIG. 42 | 31.5 | 31.5 | 989.5 |
| Sub-pixel associated with Emissive Layer Confinement Regions as illustrated in FIG. 42 with definition layer as illustrated in FIG. 34 | 28.5 | 28.5 | 809.8 |

TABLE 10

| For a sub-pixel associated with green emission in display having resolution of 326 ppi | Length of Sub-pixel (μm) | Width of Sub-pixel (μm) | Area of Emissive Confinement Regions (μm²) |
|---|---|---|---|
| Sub-pixel associated with Emissive Layer Confinement Regions as illustrated in FIG. 42 | 31.5 | 31.5 | 989.5 |
| Sub-pixel associated with Emissive Layer Confinement Regions as illustrated in FIG. 42 with definition layer as illustrated in FIG. 34 | 28.5 | 28.5 | 809.8 |

TABLE 11

| For a sub-pixel associated with blue emission of a display having resolution of 326 ppi | Length of Sub-pixel (μm) | Width of Sub-pixel (μm) | Area of Emissive Confinement Regions (μm²) |
|---|---|---|---|
| Sub-pixel associated with Emissive Layer Confinement Regions as illustrated in FIG. 42 | 30.0 | 65.9 | 1979.1 |
| Sub-pixel associated with Emissive Layer Confinement Regions as illustrated in FIG. 42 with definition layer as illustrated in FIG. 34 | 27.0 | 59.9 | 1619.6 |

TABLE 12

| For a sub-pixel associated with red emission of a display having resolution of 440 ppi | Length of Sub-pixel (μm) | Width of Sub-pixel (μm) | Area of Emissive Confinement Regions (μm²) |
|---|---|---|---|
| Sub-pixel associated with Emissive Layer Confinement Regions as illustrated in FIG. 42 | 21.4 | 21.4 | 456.4 |
| Sub-pixel associated with Emissive Layer Confinement Regions as illustrated in FIG. 42 with definition layer as illustrated in FIG. 34 | 18.4 | 18.4 | 337.2 |

TABLE 13

| For a sub-pixel associated with green emission of a display having resolution of 440 ppi | Length of Sub-pixel (μm) | Width of Sub-pixel (μm) | Area of Emissive Confinement Regions (μm²) |
|---|---|---|---|
| Sub-pixel associated with Emissive Layer Confinement Regions as illustrated in FIG. 42 | 21.4 | 21.4 | 456.4 |
| Sub-pixel associated with Emissive Layer Confinement Regions as illustrated in FIG. 42 with definition layer as illustrated in FIG. 34 | 18.4 | 18.4 | 337.2 |

Embodiments disclosed herein can be used to achieve high resolution in any OLED display. Accordingly, the devices, systems, and the techniques described herein can be applied to various electronic display apparatuses. Some non-limiting examples of such electronic display apparatuses include television displays, video cameras, digital cameras, head mounted displays, car navigation systems, audio systems including a display, laptop personal computers, digital game equipment, portable information terminals (such as a tablet, a mobile computer, a mobile telephone, mobile game equipment or an electronic book), image playback devices provided with recording medium. Exemplary embodiments of two types of electronic display apparatuses are illustrated in FIGS. 20 and 21.

Figure 20:
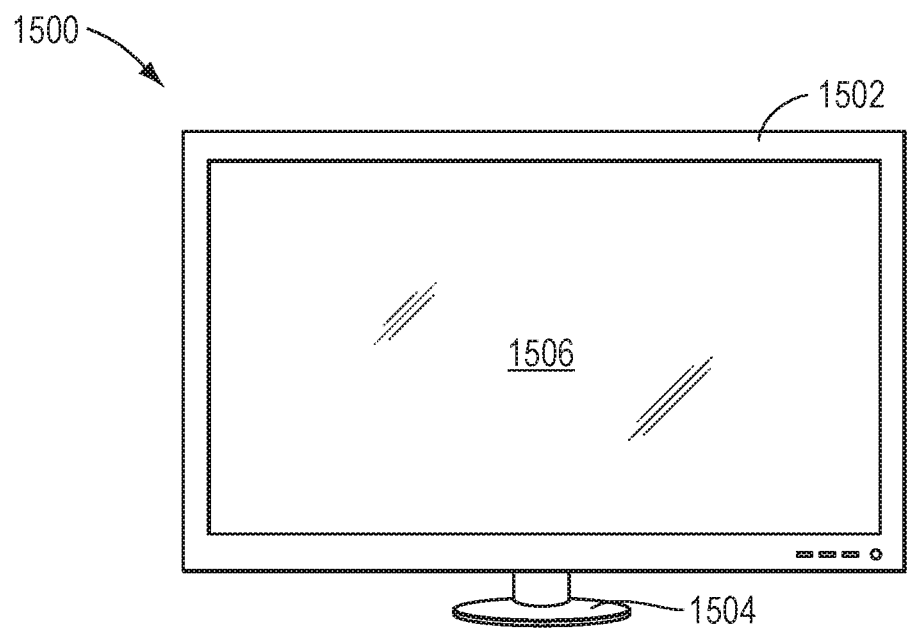
FIG. 20 is a front view of an exemplary apparatus including an electronic display in accordance with the present disclosure.

FIG. 20 illustrates a television monitor and/or a monitor of a desktop personal computer that incorporates any of the OLED displays according to the present disclosure. Monitor 1500 can include a frame 1502, a support 1504, and a display portion 1506. The OLED display embodiments disclosed herein can be used as the display portion 1506. Monitor 1500 can be any size display, for example up to 55" and beyond.

Figure 21:
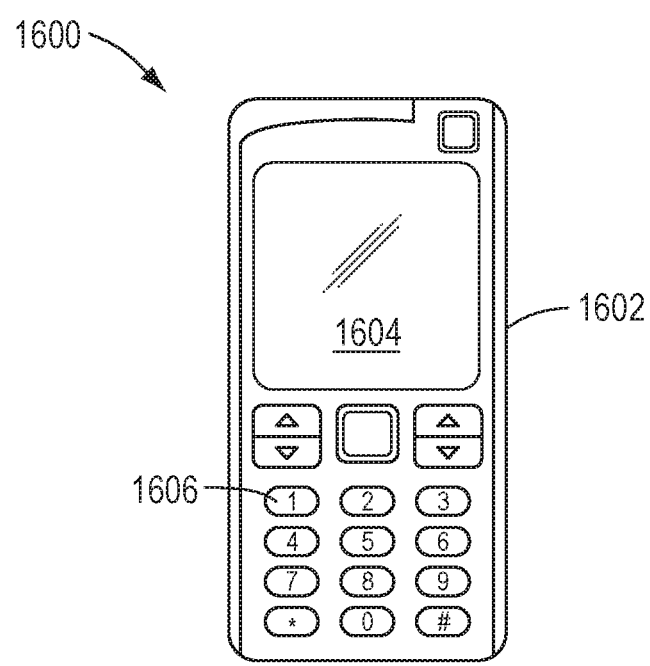
FIG. 21 is a front view of another exemplary apparatus including an electronic display in accordance with the present disclosure.

FIG. 21 illustrates an exemplary embodiment of a mobile device 1600 (such as a cellular phone, tablet, personal data assistant, etc.) that incorporates any of the OLED displays according to the present disclosure. Mobile device 1600 can include a main body 1062, a display portion 1604, and operation switches 1606. The OLED display embodiments disclosed herein can be used as the display portion 1604.

One of ordinary skill in the art would recognize that FIGS. 1-43 are schematic representations and are to be considered as representative only. For example, while various confinement structures 1904 and other structures may be illustrated as having parallel walls disposed perpendicularly to substrate and having sharp edges, those structures can have any shape including rounded edges and/or angled walls. In addition, any of the layers, wells, and/or confinement regions can have non-uniform edges such as rounded, angled, etc.

Various exemplary embodiments described above and pursuant to the present disclosure can permit inkjet printing of OLED displays having relatively high pixel density and increased fill factors by increasing the size of the confinement wells and/or confinement areas into which the OLED material droplets are loaded and thereby enable the use of attainable droplet sizes and attainable inkjet system droplet placement accuracies, according to the present disclosure. Due to the larger confinement wells and areas, high resolution OLED displays can be manufactured using sufficiently large inkjet droplet volumes and attainable droplet placement accuracies, without needing to utilize too small of droplet volumes or excessively high droplet placement accuracies that could pose prohibitive challenges in inkjet equipment design and printing techniques. When utilizing confinement structures, without implementing a confinement well or confinement area that spans a plurality of sub-pixels according to various embodiments of the present disclosure, droplet size and system droplet placement errors could significantly increase issues in any high resolution display manufactured using existing inkjet heads, as the droplets would have too large volumes and would overfill each sub-pixel confinement well or area and the conventional droplet placement accuracies would lead to misplacement of droplets either entirely or partially outside of the target confinement well or area, both of which would lead to undesired errors in film deposition and corresponding visual defects in the final display appearance. The ability to achieve high pixel density with existing droplet volumes and droplet placement accuracies enables various exemplary techniques described herein to be utilized in the manufacture of displays of relatively high resolutions for many applications, from small size displays, such as, for example, are found in smart phones and/or tablets, and large size displays, such as, for example, ultra high resolution televisions.

Moreover, achieving OLED material layer(s) of substantially uniform thickness that sufficiently conform to underlying topography, in accordance with exemplary embodiments, can promote overall OLED display performance and quality, and in particular can permit desirable performance and quality to be achieved in high resolution OLED displays.

One or more of the above described embodiments also can achieve an increased fill factor. In conventional pixel arrangements, a fill factor for a display having a resolution in the range of 300-440 ppi has a fill factor of less than 40%, and frequently less than 30%. In contrast, exemplary embodiments of the present disclosure may achieve a fill factor of greater than 40%, and in some instances as high as 60%, for displays having a resolution in the range of 300-440 ppi. The exemplary embodiments can be used for any pixel size and arrangement, including pixel arrangements within high resolution displays.

The exemplary embodiments can be used with any size display and more particularly with small displays having a high resolution. For example, exemplary embodiments of the present disclosure can be used with displays having a diagonal size in the range of 3-70 inches and having a resolution greater than 100 ppi, for example, greater than 300 ppi.

Although various exemplary embodiments described contemplate utilizing inkjet printing techniques, the various pixel and sub-pixel layouts described herein and the way of producing those layouts for an OLED display can also be manufactured using other manufacturing techniques such as thermal evaporation, organic vapor phase deposition, and organic vapor jet printing. In exemplary embodiments, alternative organic layer patterning can also be performed. For example, patterning methods can include shadow masking (in conjunction with thermal evaporation) and organic vapor jet printing. In particular, though the pixel layouts described herein, in which multiple sub-pixels of the same color are grouped together and/or in which the deposited OLED film layers span substantial topographies within the grouped sub-pixel regions, have been conceived for inkjet printing applications, such layouts can also have beneficial alternative application to vacuum thermal evaporation techniques for OLED film layer deposition, in which the patterning step is achieved using shadow masking. Such layouts as described herein provide for larger shadow mask holes and increased distances between such holes, thereby potentially improving the overall mechanical stability and general practicality of such shadow masks. While vacuum thermal evaporation techniques with shadow masks may not be more costly than inkjet techniques, the use of the pixel layouts in accordance with the present disclosure and the use of OLED film layer coatings spanning substantial topographies within the grouped sub-pixels associated with the same color, also represent a potentially important application of the present disclosure described herein.

Various exemplary embodiments described above and pursuant to the present disclosure can permit inkjet printing of OLED displays having relatively high pixel density and increased fill factors by decreasing non-active areas of pixels using emissive layer confinement regions to confine inkjet drops of organic light-emissive materials by enabling the use of conventional ink droplet sizes and convention inkjet system drop placement accuracies, according to the present disclosure. Due to the defined emissive layer confinement regions, high resolution OLED displays can be manufactured using sufficiently large inkjet droplet volumes and conventional drop placement accuracies, without needing to utilize too small of droplet volumes or excessively high drop placement accuracies that could pose prohibitive challenges in inkjet equipment design and printing techniques. The requirements on the droplet size and system drop placement error could significantly increase in any high resolution display manufactured using conventional inkjet heads. The ability to achieve high pixel density with conventional droplet volumes and conventional drop placement accuracies enables the techniques described herein to be utilized in the manufacture of displays of relatively high resolutions for many applications, from small size displays, such as, for example, are found in smart phones and/or tablets, and large size displays, such as, for example, ultra high resolution televisions. One or more of the above described embodiments can achieve a reduced fill factor when utilizing conventional pixel arrangements. In conventional pixel arrangements, a fill factor for a display having a resolution in the range of 300-440 ppi has a fill factor of less than 40%, and frequently less than 30% due to confinement well structures contribution to non-active pixel regions. In contrast, exemplary embodiments of the present disclosure can have a fill factor of greater than 40%, and in some instances as high as 60%, for displays having a resolution in the range of 300-440 ppi. The exemplary embodiments can be used for any pixel size and arrangement and more particularly for pixel arrangements within high resolution displays.

The exemplary embodiments can be used with any size display and more particularly with small displays having a high resolution. For example, exemplary embodiments of the present disclosure can be used with displays in the range of 3-70 inches and having a resolution greater than 100 ppi and more particularly greater than 300 ppi.

Although only a few exemplary embodiments have been described in detail above, those skilled in the art will readily appreciate that many modifications are possible in the example embodiments without materially departing from this disclosure. Accordingly, all such modifications are intended to be included within the scope of this disclosure as defined in the following claims.

It is to be understood that the various embodiments shown and described herein are to be taken as exemplary. Elements and materials, and arrangement of those elements and materials, may be substituted for those illustrated and described herein, and portions may be reversed, all as would be apparent to one skilled in the art after having the benefit of the description herein. Changes may be made in the elements described herein without departing from the spirit and scope of the present disclosure and following claims, including their equivalents.

Those having ordinary skill in the art will recognize that various modifications may be made to the configuration and methodology of the exemplary embodiments disclosed herein without departing from the scope of the present teachings.

Those having ordinary skill in the art also will appreciate that various features disclosed with respect to one exemplary embodiment herein may be used in combination with other exemplary embodiments with appropriate modifications, even if such combinations are not explicitly disclosed herein.

It will be apparent to those skilled in the art that various modifications and variations can be made to the devices, methods, and systems of the present disclosure without departing from the scope of the present disclosure and appended claims. Other embodiments of the disclosure will be apparent to those skilled in the art from consideration of the specification and practice of the disclosure disclosed herein. It is intended that the specification and examples be considered as exemplary only.

What is claimed is:

1. A method of manufacturing an organic light-emissive display comprising:
   depositing, via inkjet printing, an organic light-emissive material on a hole conducting layer disposed over a plurality of electrodes on a surface of a substrate;
   wherein the hole conducting layer comprises:
   a plurality of confinement regions having a first surface energy property and being separated from each other by boundary regions having a second surface energy property differing from the first surface energy property, each confinement region being associated with one or more electrodes of the plurality of electrodes and spanning an area larger than an active area of the one or more electrodes; and
   treating the organic light-emissive material deposited over the hole conducting layer to form an organic light-emissive layer, the differing first and second surface energy properties causing the organic light-emissive layer to be confined to the confinement regions.

2. The method of claim 1, further comprising:
   depositing an additional electrode over the organic light-emissive layer confined in each confinement region.

3. The method of claim 2, wherein depositing the additional electrode comprises blanket—
   depositing the additional electrode over organic light-emissive layers of all the confinement regions.

4. The method of claim 1, further comprising:
   treating the hole conducting layer to alter surface energy properties in select regions of the hole conducting layer thereby creating the confinement regions having the first surface energy property and the boundary regions having the second surface energy property.

5. The method of claim 4, wherein treating the hole conducting layer comprises radiating the hole conducting layer through openings of a mask.

6. The method of claim 5, wherein treating the hole conducting layer comprises applying a reactive-surface-active material to the hole conducting layer before radiating the hole conducting layer.

7. The method of claim 1, wherein:
   the first surface energy property is sufficient to attract the organic light-emissive material deposited on the hole conducting layer, and
   the second surface energy property is sufficient to repel the organic light-emissive material deposited on the hole conducting layer.

8. The method of claim 1, further comprising:
   providing a confinement structure on the substrate surrounding the plurality of confinement regions and boundary regions.

9. The method of claim 1, further comprising:
   depositing the hole conducting layer over the plurality of electrodes to form a substantially continuous hole conducting layer over the substrate.

10. The method of claim 9, further comprising:
    prior to depositing the hole conducting layer, depositing, via inkjet printing, another substantially continuous hole conducting layer over the plurality of electrodes.

11. The method of claim 1, wherein the one or more electrodes include multiple electrodes associated with each confinement region, each electrode of the multiple electrodes being an individually addressed electrode that defines a sub-pixel, and wherein each sub-pixel defined by each of the multiple electrodes is associated with a differing pixel.

12. The method of claim 1, wherein depositing the organic light-emissive material includes depositing the organic light-emissive material having a wavelength associated with one of red light, green light, and blue light so as to form organic material layers in confinement regions corresponding to a predetermined pattern of pixels for emitting red light, green light, and blue light.

13. A method of manufacturing an organic light-emissive display comprising:
    depositing, via inkjet printing, an organic light-emissive material onto confinement regions of a hole conducting layer disposed over a plurality of electrodes disposed on a surface of a substrate, each of the confinement regions being associated with one or more electrodes of the plurality of electrodes and spanning an area larger than an active area of the one or more electrodes;
    wherein, the organic light-emissive material deposited onto the confinement regions is confined from spreading beyond the confinement regions due to differing surface energy properties of the confinement regions and boundary regions of the hole conducting layer surrounding the confinement regions; and
    treating the organic light-emissive material deposited onto the confinement regions of the hole conducting layer to form an organic light-emissive layer confined within each of the confinement regions.

14. The method of claim 13, further comprising:
    treating the hole conducting layer to alter the surface energy properties of select regions of the hole conducting layer thereby creating the confinement regions and the boundary regions having the differing surface energy properties.

15. The method of claim 14, wherein treating the hole conducting layer comprises radiating the hole conducting layer through openings of a mask.

16. The method of claim 15, wherein treating the hole conducting layer comprises applying a reactive-surface-active material to the hole conducting layer before radiating the hole conducting layer.

17. The method of claim 13, wherein the one or more electrodes include multiple electrodes associated with each confinement region, each electrode of the multiple electrodes being an individually addressed electrode that defines a sub-pixel, and wherein each sub-pixel defined by each of the multiple electrodes is associated with a differing pixel.

18. The method of claim 13, further comprising:
depositing the hole conducting layer over the plurality of electrodes to form a substantially continuous hole conducting layer over the substrate.

19. The method of claim 18, further comprising:
prior to depositing the hole conducting layer, depositing, via inkjet printing, another substantially continuous hole conducting layer over the plurality of electrodes.

20. The method of claim 13, wherein depositing the organic light-emissive material onto the confinement regions includes depositing the organic light-emissive material having a wavelength associated with one of red light, green light, and blue light in respective confinement regions corresponding to a predetermined pattern of pixels emitting red light, green light, and blue light.

* * * * *